(12) United States Patent
Lee et al.

(10) Patent No.: US 12,317,742 B2
(45) Date of Patent: May 27, 2025

(54) LIGHT-EMITTING DEVICE AND ELECTRONIC APPARATUS INCLUDING THE SAME

(71) Applicant: Samsung Display Co., Ltd., Yongin-si (KR)

(72) Inventors: Jongwon Lee, Yongin-si (KR); Namsu Kang, Yongin-si (KR); Minho Park, Yongin-si (KR); Heungsu Park, Yongin-si (KR); Minkyung Kim, Yongin-si (KR); Hyunshik Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 792 days.

(21) Appl. No.: 17/517,523

(22) Filed: Nov. 2, 2021

(65) Prior Publication Data

US 2022/0149288 A1    May 12, 2022

(30) Foreign Application Priority Data

Nov. 10, 2020    (KR) .......... 10-2020-0149590

(51) Int. Cl.
*H10K 85/60*    (2023.01)
*H10K 50/11*    (2023.01)
(Continued)

(52) U.S. Cl.
CPC ......... *H10K 85/654* (2023.02); *H10K 85/324* (2023.02); *H10K 85/622* (2023.02);
(Continued)

(58) Field of Classification Search
CPC ..... H10K 50/13; H10K 50/131; H10K 50/165
See application file for complete search history.

(56) References Cited

U.S. PATENT DOCUMENTS 8,476,624 B1    7/2013  Wu et al.
9,065,068 B2 *  6/2015  Kang .................. H01M 50/213
(Continued)

FOREIGN PATENT DOCUMENTS

KR    10-2015-0027616 A    3/2015
KR    10-2015-0039631 A    4/2015
KR    10-2018-0067321 A    6/2018

OTHER PUBLICATIONS

Cheng et al., J. Phys. Chem. C 2011, 115, 2, 582-588.*

*Primary Examiner* — Vu A Nguyen
(74) *Attorney, Agent, or Firm* — Womble Bond Dickinson (US) LLP

(57) ABSTRACT

A light-emitting device includes: a first electrode; a second electrode facing the first electrode; m light-emitting units stacked between the first electrode and the second electrode and including an emission layer; and m−1 charge generation layers respectively between two neighboring light-emitting units among the m light-emitting units, wherein m is an integer of 2 or more, at least one of the m light-emitting units includes an n-doped electron transport layer between the emission layer and the second electrode, a charge generation layer on the n-doped electron transport layer includes a p-type charge generation layer in direct contact with the n-doped electron transport layer, the n-doped electron transport layer includes a first electron transport material, a second electron transport material, and a metal, the first electron transport material and the second electron transport material are different from each other.

19 Claims, 3 Drawing Sheets

(51) Int. Cl.
  *H10K 50/13* (2023.01)
  *H10K 50/165* (2023.01)
  *H10K 85/30* (2023.01)
  *H10K 101/10* (2023.01)
  *H10K 101/30* (2023.01)
  *H10K 101/40* (2023.01)

(52) U.S. Cl.
  CPC ....... *H10K 85/626* (2023.02); *H10K 85/6572* (2023.02); *H10K 85/6574* (2023.02); H10K 50/11 (2023.02); H10K 50/13 (2023.02); H10K 50/165 (2023.02); H10K 2101/10 (2023.02); H10K 2101/30 (2023.02); H10K 2101/40 (2023.02)

(56) References Cited

U.S. PATENT DOCUMENTS

2018/0166647 A1  6/2018  Shin et al.
2018/0269419 A1  9/2018  Tu et al.

\* cited by examiner

LIGHT-EMITTING DEVICE AND ELECTRONIC APPARATUS INCLUDING THE SAME

CROSS-REFERENCE TO RELATED APPLICATION

This application claims priority to and the benefit of Korean Patent Application No. 10-2020-0149590, filed on Nov. 10, 2020, in the Korean Intellectual Property Office, the entire contents of which are hereby incorporated by reference.

BACKGROUND

1. Field

One or more embodiments of the present disclosure relate to a light-emitting device and an electronic apparatus including the same.

2. Description of Related Art

Light-emitting devices are devices that convert electrical energy into light energy. Examples of such light-emitting devices include organic light-emitting devices using organic materials for an emission layer, quantum dot light-emitting devices using quantum dots for an emission layer, and the like.

In a light-emitting device, a first electrode is on a substrate, and a hole transport region, an emission layer, an electron transport region, and a second electrode are sequentially formed on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state to thereby generate light.

SUMMARY

Embodiments of the present specification provide a light-emitting device having low driving voltage, high efficiency, long lifespan and high color purity.

Additional aspects of embodiments will be set forth in part in the description, which follows and, in part, will be apparent from the description, or may be learned by practice of the presented embodiments of the disclosure.

According to one or more embodiments, a light-emitting device includes:
a first electrode,
a second electrode facing the first electrode,
m light-emitting units stacked between the first electrode and the second electrode and including an emission layer, and
m−1 charge generation layers respectively between two neighboring light-emitting units among the m light-emitting units,
wherein m may be an integer of 2 or more,
at least one of the m−1 light-emitting units other than a light-emitting unit neighboring the second electrode may include an n-doped electron transport layer between the emission layer and the second electrode,
a charge generation layer on the n-doped electron transport layer may include a p-type charge generation layer in direct contact with the n-doped electron transport layer,
the n-doped electron transport layer may include a first electron transport material, a second electron transport material, and a metal,
the first electron transport material and the second electron transport material may be different from each other, and
the first electron transport material may be a compound including a phenanthroline group, a phosphine oxide group, a phosphine sulfide group, or any combination thereof.

According to one or more embodiments, an electronic apparatus includes the light-emitting device.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
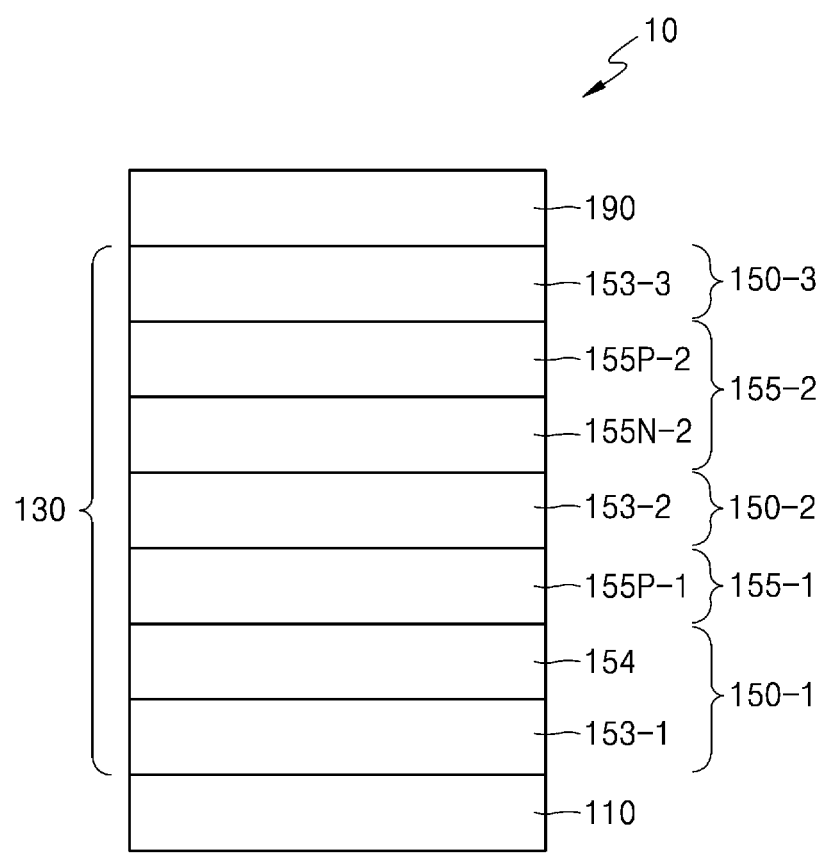
FIG. 1 shows a schematic cross-sectional view of a light-emitting device according to an embodiment of the present disclosure.

Reference will now be made in more detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the subject matter of the present disclosure may have diverse modified embodiments, embodiments are illustrated in the drawings and are described in the detailed description. An effect and a characteristic of embodiments of the present disclosure, and a method of accomplishing these will be apparent when referring to embodiments described with reference to the drawings. The subject matter of the present disclosure may, however, be embodied in many different forms and should not be construed as limited to the embodiments set forth herein.

One or more embodiments of the present disclosure will be further described below in more detail with reference to the accompanying drawings. Those components that are the same or are in correspondence with each other are rendered the same reference numeral regardless of the figure number, and redundant explanations are not repeated.

An expression used herein in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or component is referred to as being "on" or "onto" another layer, region, or component, it may be directly or indirectly formed on the other layer, region, or component. For example, intervening layers, regions, or components may be present.

Sizes of elements in the drawings may be exaggerated for convenience of explanation. In other words, because sizes and thicknesses of components in the drawings may be arbitrarily illustrated for convenience of explanation, the following embodiments are not limited thereto.

The term "an interlayer," as used herein, refers to a single layer and/or a plurality of layers between an anode and a cathode of an organic light-emitting device. A material included in the "interlayer" is not limited to an organic material. For example, the interlayer may include an inorganic material.

The expression "(an interlayer) includes at least one compound represented by Formula 1," as used herein, may mean "(an interlayer) may include one compound belonging to the category of Formula 1 or two or more compounds different from each other and belonging to the category of Formula 1."

According to one or more embodiments, a composition includes:

a first electrode;

a second electrode facing the first electrode;

m light-emitting units stacked between the first electrode and the second electrode and including an emission layer; and m−1 charge generation layers respectively between two neighboring light-emitting units among the m light-emitting units, wherein m is an integer of 2 or more, at least one of the m−1 light-emitting units other than the light-emitting unit neighboring the second electrode includes an n-doped electron transport layer between the emission layer and the second electrode, the charge generation layer on the n-doped electron transport layer includes a p-type charge generation layer in direct contact (e.g., physical contact) with the n-doped electron transport layer, the n-doped electron transport layer includes a first electron transport material, a second electron transport material, and a metal, the first electron transport material and the second electron transport material are different from each other, and the first electron transport material is a compound including a phenanthroline group, a phosphine oxide group, a phosphine sulfide group, or any combination thereof.

FIG. 1 is a schematic cross-sectional view of an organic light-emitting device 10 according to an embodiment. The organic light-emitting device 10 includes a first electrode 110, a second electrode 190 facing the first electrode 110, and an interlayer 150 between the first electrode 110 and the second electrode 190. The interlayer 150 may include m light-emitting units 150-1, 150-2, and 150-3.

Light-Emitting Units 150-1, 150-2, and 150-3

The m light-emitting units 150-1, 150-2, and 150-3 are not limited as long as they have a function capable of emitting light. For example, the light-emitting units 150-1, 150-2, and 150-3 may each include one or more emission layers 153-1, 153-2, and 153-3. When necessary or desired, the light-emitting units 150-1, 150-2, and 150-3 may each further include an organic layer other than the emission layers 153-1, 153-2, and 153-3.

The number of the light-emitting units 150-1, 150-2, and 150-3, that is, m, may be selected from as needed, and the upper limit of the number is not limited. In an embodiment, the light-emitting device 10 may include two, three, four, or five light-emitting units. FIG. 1 shows a light-emitting device of which m is 3.

In the light-emitting device 10 according to an embodiment, m may be an integer of 3 or more, but embodiments of the present disclosure are not limited thereto. For example, m may be 3 or 4, but embodiments of the present disclosure are not limited thereto.

The light-emitting units may be named as the first light-emitting unit 150-1, the second light-emitting unit 150-2, and a third light-emitting unit 150-3, in an order close to the first electrode 110 among the light-emitting units 150-1, 150-2, and 150-3.

In the present specification, the description of each component included in the first light-emitting unit, the second light-emitting unit, and the third light-emitting unit is not limited to "first," "second," and "third" unless otherwise specified. For example, for the description of "the first emission layer", the "second emission layer", and the "third emission layer," reference may be made to the general description of the "emission layer" in the present specification unless otherwise specified.

As shown in FIG. 1, in the light-emitting element 10, at least one of the m−1 light-emitting units 150-1 and 150-2 other than the light-emitting unit 150-3 neighboring the second electrode 190, for example, a first light-emitting unit 150-1 includes an n-doped electron transport layer 154 between the emission layer 153-1 and the second electrode 190, and a charge generation layer 155-1 on the n-doped electron transport layer 154 includes a p-type charge generation layer 155P-1 directly contacting (e.g., physically contacting) the n-doped electron transport layer 154. The light-emitting unit 150-3 neighboring the second electrode 190 does not include an n-doped electron transport layer because a charge generation layer is not on the light-emitting unit 150-3.

In an embodiment, the maximum emission wavelength of light emitted from them light-emitting units 150-1, 150-2, and 150-3 may be identical to each other. For example, in the light-emitting device 10 in which the first light emitting unit 150-1, the second light-emitting unit 150-2, and the third light-emitting unit 150-3 are stacked, the maximum emission wavelength of light emitted from the first light-emitting unit 150, the maximum emission wavelength of light emitted from the second light-emitting unit 150-2, and the maximum emission wavelength of light emitted from the third light-emitting unit 150-3 may all be identical to each other. In this case, colors of light emitted from them light-emitting units 150-1, 150-2, and 150-3 may be identical to each other.

In an embodiment, the maximum emission wavelength of light emitted from at least one light-emitting unit of them light-emitting units 150-1, 150-2, and 150-3 may be different from the maximum emission wavelength of light emitted from at least one light-emitting unit of the other light-emitting units. For example, in the light-emitting device 10 in which the first light-emitting unit 150-1, the second light-emitting unit 150-2, and the third light-emitting unit 150-3 are stacked, the maximum emission wavelength of light emitted from the first light-emitting unit 150 may be identical to the maximum emission wavelength of light emitted from the second light-emitting unit 150-2, but may be different from the maximum emission wavelength of light emitted from the third light-emitting unit 150-3. In an embodiment, the maximum emission wavelength of light emitted from the first light-emitting unit 150-1, the maximum emission wavelength of light emitted from the second light-emitting unit 150-2, and the maximum emission wavelength of light emitted from the third light-emitting unit 150-3 may be different from one another. For example, the light-emitting device 10 may emit white light by mixing light emitted from them light-emitting units 150-1, 150-2, and 150-3.

In one or more embodiments, the maximum emission wavelengths of light emitted from the m light-emitting units 150-1, 150-2, and 150-3 may each independently be selected from a range of about 370 nm to about 780 nm. For example, the maximum emission wavelengths of light emitted from the m light-emitting units 150-1, 150-2, and 150-3 may each independently be selected from a range of about 445 nm to about 480 nm, about 480 nm to about 580 nm, and about 580 to about 780.

In an embodiment, m may be 2, and the maximum emission wavelength of light emitted from each of the m light-emitting units may be identical to each other. For example, the light-emitting units may each emit blue light having a maximum emission wavelength of about 440 nm to about 480 nm.

In an embodiment, m may be 2, the maximum emission wavelength of light emitted from one of the m light-emitting units may be different from the maximum emission wavelength of light emitted from the other light-emitting units, and the light emitted from the m light-emitting units may be mixed to emit white light.

In an embodiment, m may be an integer of 3 or more, and the maximum emission wavelength of light emitted from at least three light-emitting units among the m light-emitting units may be identical to each other. For example, the at least three light-emitting units may each emit blue light having a maximum emission wavelength of about 440 nm to about 480 nm.

In an embodiment, m may be an integer of 3 or more, and at least three light-emitting units among the m light-emitting units may emit a first-color light. For example, in the light-emitting element 10 in which the first light-emitting unit 150-1, the second light-emitting unit 150-2, and the third light-emitting unit 150-3 are stacked and in which m is 3, the first light-emitting unit 150-1, the second light-emitting unit 150-2, and the third light-emitting unit 150-3 may all emit the first-color light.

In one or more embodiments, the light-emitting device 10 may further include a light-emitting unit that emits a second-color light that is different from the first-color light. For example, the light-emitting device 10 may further include a fourth light-emitting unit that emits the second-color light that is different from the first-color light. In this case, the position of the fourth light-emitting unit is not limited. For example, the first-color light may be blue light, and the second-color light may be green light, but embodiments of the present disclosure are not limited thereto.

In an embodiment, m may be 4, three light-emitting units among the m light-emitting units may emit blue light, and the other light-emitting unit may emit green light.

Charge Generation Layers 155-1 and 155-2

Charge generation layers may be respectively between two neighboring light-emitting units. The charge generation layer may act as a cathode injecting electrons to one light-emitting unit of two neighboring light-emitting units and may act as an anode injecting holes to the other light-emitting unit. The charge generation layer is not directly coupled to (e.g., is not physically coupled to) an electrode and separates neighboring light-emitting units.

As shown in FIG. 1, the light-emitting element 10 may include charge generation layers 155-1 and 155-2 respectively between two neighboring light-emitting units among them light-emitting units 150-1, 150-2, and 150-3, and the term "neighboring" refers to a location relationship of closest layers among the neighboring layers described above. In an embodiment, the term "two neighboring light-emitting units," as used herein, refers to the two light-emitting units located closest to each other from among a plurality of light-emitting units. The term "neighboring" may refer to a case where two layers are physically in contact with each other, and a case where another layer, not mentioned, may be between the two layers. For example, the light-emitting unit neighboring the second electrode 190 means a light-emitting unit located closest to the second electrode 190 among the plurality of light-emitting units 150-1, 150-2, and 150-3. Also, the second electrode 190 and the light-emitting unit neighboring the second electrode 190 may be in physical contact with each other. In an embodiment, however, other layers not mentioned may be between the second electrode 190 and the light-emitting unit neighboring the second electrode 190. In an embodiment, an electron transport layer may be between the second electrode 190 and the light-emitting unit.

The charge generation layer may include an n-type charge generation layer and a p-type charge generation layer. In this regard, the n-type charge generation layer may directly contact (e.g., physically contact) the p-type charge generation layer to form an NP junction. Due to the NP junction, electrons and holes may be concurrently (e.g., simultaneously) generated between the n-type charge generation layer and the p-type charge generation layer. The n-type refers to n-type semiconductor characteristics, that is, the characteristics of injecting and/or transporting electrons. The p-type refers to p-type semiconductor characteristics, that is, the characteristics of injecting and/or transporting holes. The generated electrons may be transferred to one of the two neighboring light-emitting units through the n-type charge generation layer. The generated holes may be transferred to the other one of the two neighboring light-emitting units through the p-type charge generation layer.

In the light-emitting device 10 according to the present disclosure, at least one of the m−1 charge generation layers 155-1 and 155-2 include only the p-type charge generation layer, and the other charge generation layer may include the p-type charge generation layer and an n-type charge generation layer.

As shown in FIG. 1, the first light-emitting unit 150-1 of the light-emitting device 10 includes an n-doped electron transport layer 154 between the emission layer 153-1 and the second electrode 190, and the charge generation layer 155-1 on the n-doped electron transport layer 154 includes a p-type charge generation layer 155P-1 that directly contacts (e.g., physically contacts) the n-doped electron transport layer 154. A second charge generation layer 155-2 neighboring the second electrode 190 may include a p-type charge generation layer 155P-2 and an n-type charge generation layer 155N-2.

In the light-emitting device according to an embodiment, at least one charge generation layer does not include an n-type charge generation layer, and an n-doped electron transport layer, in which two types or kinds of electron transport materials are doped with a metal, directly contacts (e.g., physically contacts) the p-type charge generation layer, thereby allowing the n-doped electron transport layer to act not only as a charge transport layer but also as a n-type charge generation layer. In this manner, compared to a light-emitting device including an additional n-type charge generation layer, the light-emitting device of the present disclosure may improve efficiency of the device while satisfying a certain level of driving voltage and lifespan characteristics.

N-Doped Electron Transport Layer 154

The n-doped electron transport layer 154 may include a first electron transport material, a second electron transport material, and a metal.

The first electron transport material and the second electron transport material are different from each other, and the first electron transport material may be a compound including a phenanthroline group, a phosphine oxide group, a phosphine sulfide group, or any combination thereof.

In an embodiment, the first electron transport material may be a compound represented by any one of the following Formulae 1 and 2, or any combination thereof:

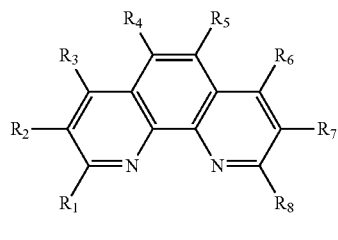

Formula 1

*—$(L_{11})_{a11}$—$(Ar_{11})_{b11}$

Formula 1A

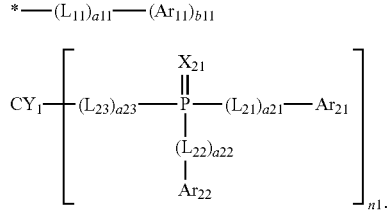

Formula 2

In Formulae 1, 1A, and 2, $CY_1$ is a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{21}$ is O or S, $L_{11}$, $L_{21}$ to $L_{23}$, $Ar_{11}$, $Ar_{21}$, and $Ar_{22}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a11 and a21 to a23 may each independently be an integer from 0 to 5, b11 may be an integer from 1 to 5, n1 may be an integer from 1 to 3, $R_1$ to $R_8$ are each independently a group represented by Formula 1A, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si$(Q_1)(Q_2)(Q_3)$, —N$(Q_1)(Q_2)$, —B$(Q_1)(Q_2)$, —C(=O)$(Q_1)$, —S(=O)$_2(Q_1)$, or —P(=O)$(Q_1)(Q_2)$, wherein at least one of $R_1$ to $R_8$ is a group represented by Formula 1A, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, —P(=O)$(Q_{11})(Q_{12})$, or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{21})(Q_{22})(Q_{23})$, —N$(Q_{21})(Q_{22})$, —B$(Q_{21})(Q_{22})$, —C(=O)$(Q_{21})$, —S(=O)$_2(Q_{21})$, —P(=O)$(Q_{21})(Q_{22})$, or any combination thereof, or —Si$(Q_{31})(Q_{32})(Q_{33})$, —N$(Q_{31})(Q_{32})$, —B$(Q_{31})(Q_{32})$, —C(=O)$(Q_{31})$, —S(=O)$_2(Q_{31})$, or —P(=O)$(Q_{31})(Q_{32})$, wherein $Q_1$ to $Q_3$, $Q_{11}$ to $Q_{13}$, $Q_{21}$ to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and

* indicates a binding site to a neighboring atom.

In an embodiment, in Formula 1, at least one of $R_1$ to $R_8$ may be a group represented by Formula 1B:

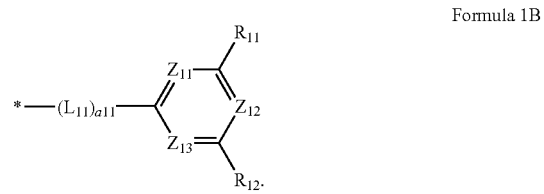

Formula 1B

In Formula 1B, $Z_{11}$ may be N or C($R_{13}$), $Z_{12}$ may be N or C($R_{14}$), $Z_{13}$ may be N or C($R_{15}$), $R_{11}$ to $R_{15}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si$(Q_1)(Q_2)(Q_3)$, —N$(Q_1)(Q_2)$, —B$(Q_1)(Q_2)$, —C(=O)$(Q_1)$, —S(=O)$_2$ $(Q_1)$, or —P(=O)$(Q_1)(Q_2)$, $L_{11}$ and a11 are each the same as described in the previous description, indicates a binding site to a neighboring atom.

In an embodiment, the first electron transport material may be a compound represented by any one of Formulae 1-1 to 1-3 and 2-1 to 2-3, or any combination thereof:

Formula 1-1

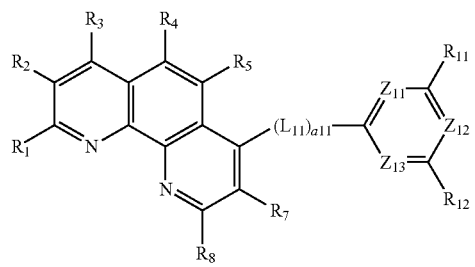

Formula 1-2

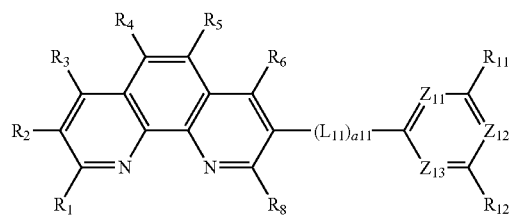

Formula 1-3

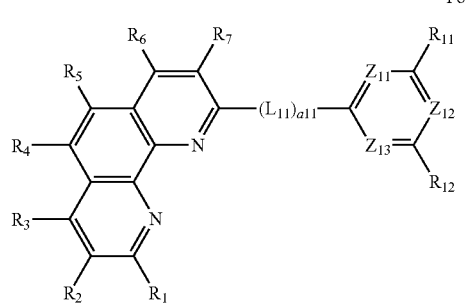

Formula 2-1

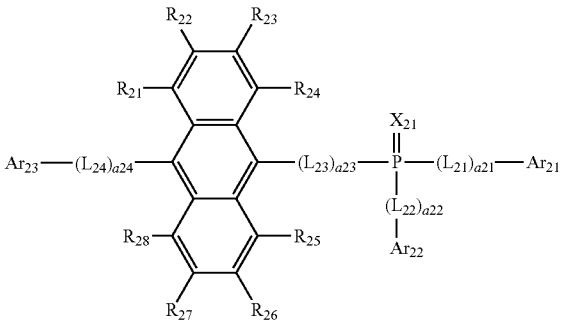

Formula 2-2

Formula 2-3

In Formulae 1-1 to 1-3 and 2-1 to 2-3, $Z_{21}$ may be N or C$(R_{21})$, $Z_{22}$ may be N or C$(R_{22})$, $Z_{23}$ may be N or C$(R_{23})$, $X_{22}$ is O, S, N$(R_{28})$, C$(R_{28})(R_{29})$, or Si$(R_{28})(R_{29})$, $R_{11}$ to $R_{15}$ and $R_{21}$ to $R_{29}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si$(Q_1)(Q_2)(Q_3)$, —N$(Q_1)(Q_2)$, —B$(Q_1)(Q_2)$, —C(=O)$(Q_1)$, —S(=O)$_2(Q_1)$, or —P(=O)$(Q_1)(Q_2)$, $L_{24}$ and $L_{25}$ are each independently the same as described in connection with $L_{21}$, a24 and a25 are each independently the same as described in connection with a21, $Ar_{23}$ and $Ar_{24}$ are each independently the same as described in connection with $Ar_{21}$, and $X_{21}$, $L_{11}$, $L_{21}$ to $L_{23}$, $Ar_{11}$, $Ar_{21}$, $Ar_{22}$, a11, a21 to a23, $Z_{11}$ to $Z_{13}$, $X_{21}$, $R_1$ to $R_8$, and $R_{10a}$ each are the same as described above.

In an embodiment, the first electron transport material may be one of Compounds 1-1 to 1-25, or any combination thereof:
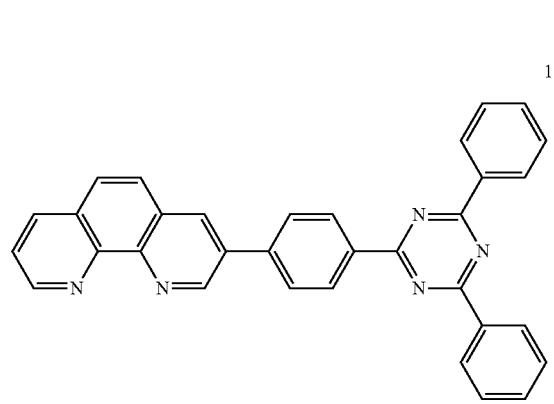
1-1
1-2
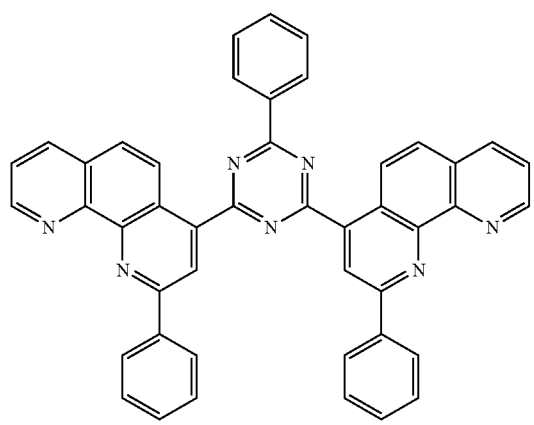
1-3
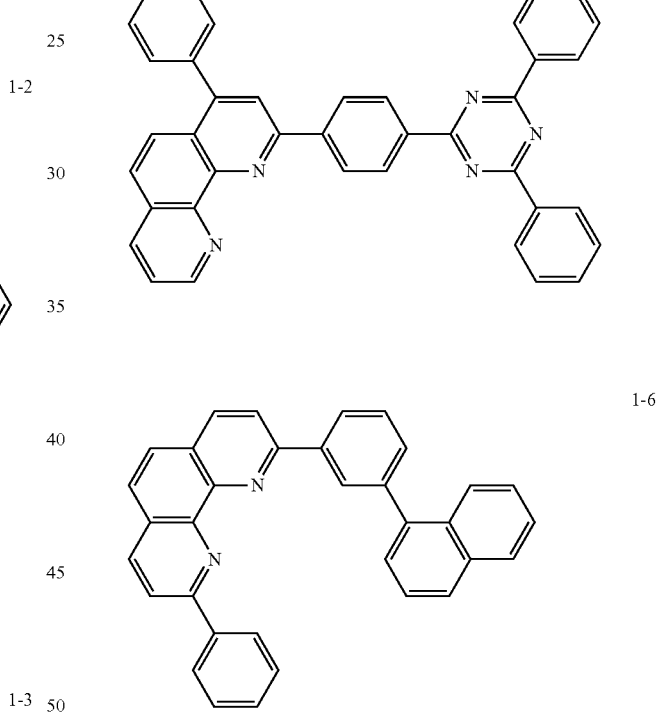
1-4
1-5
1-6
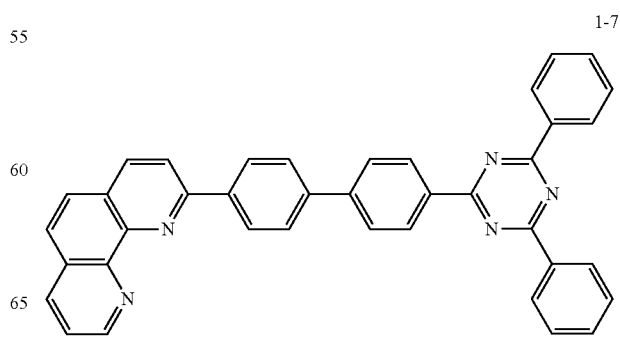
1-7

1-8
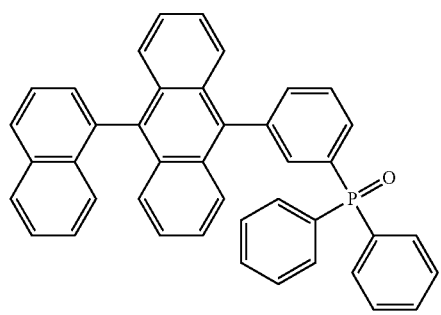
1-9
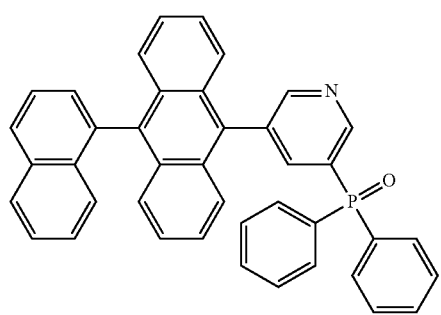
1-10
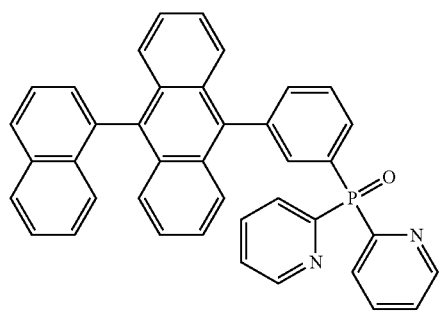
1-11
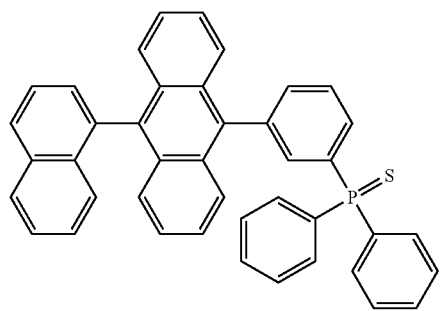
1-12
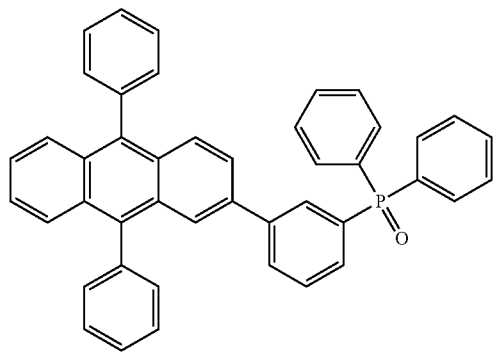
1-13
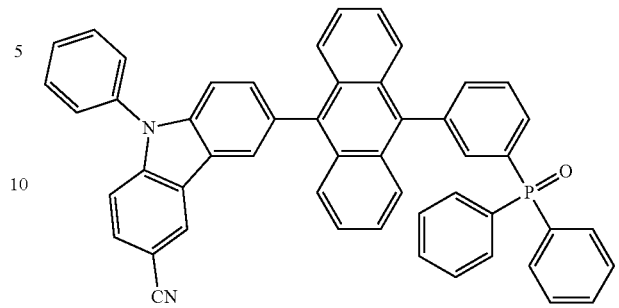
1-14
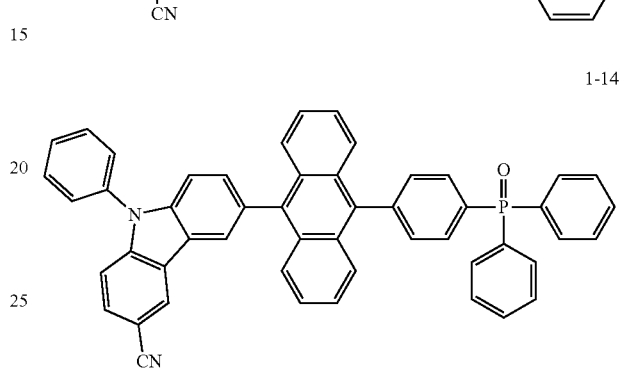
1-15
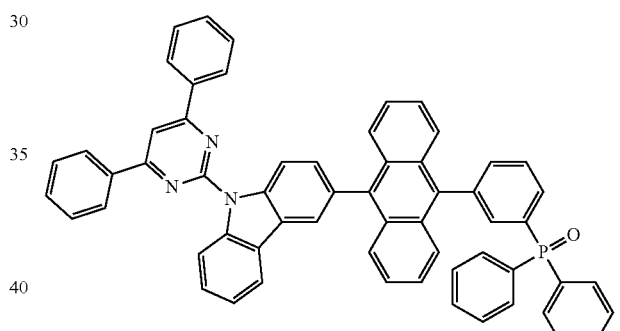
1-16
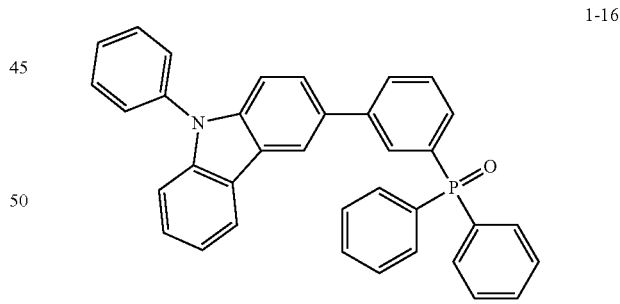
1-17
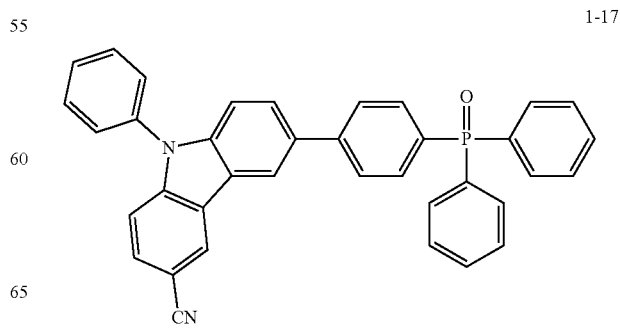

1-18
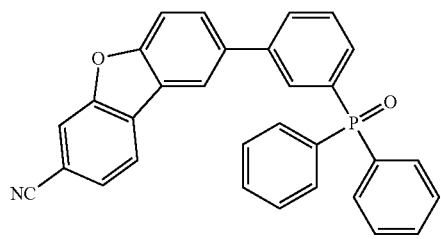
1-19
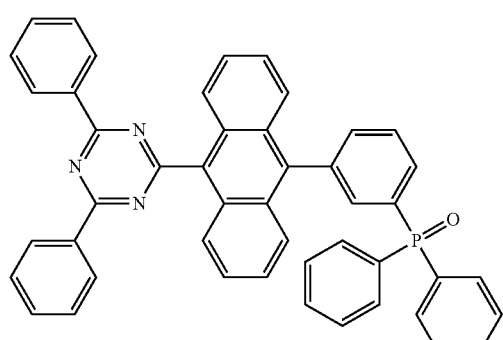
1-20
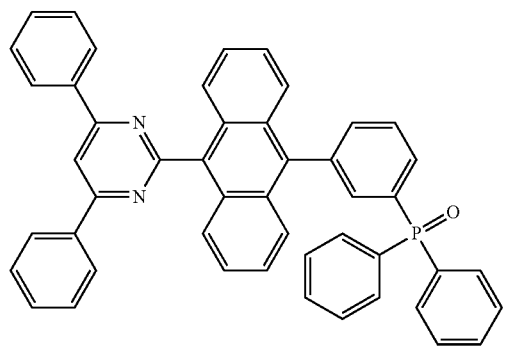
1-21
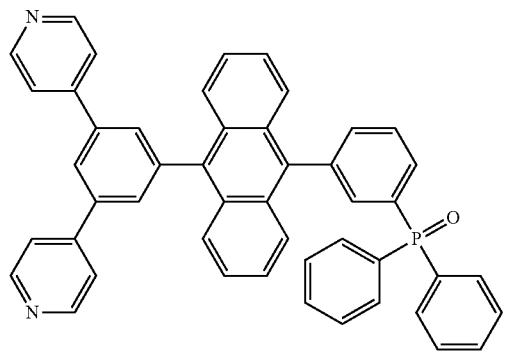
1-22
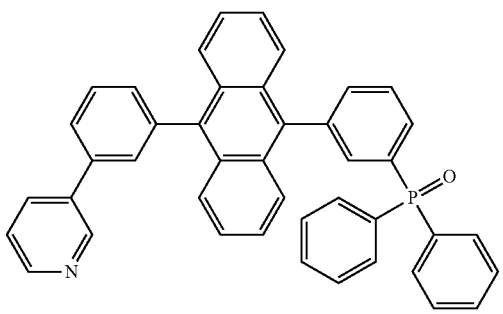
1-23
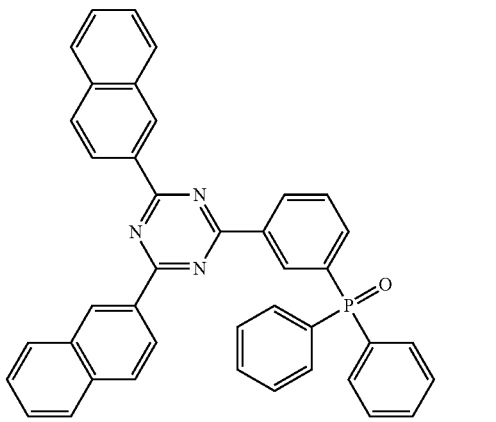
1-24
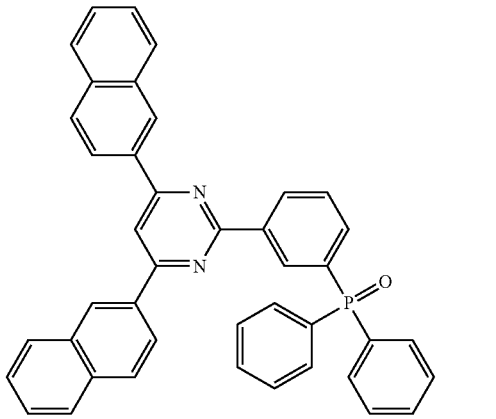
1-25
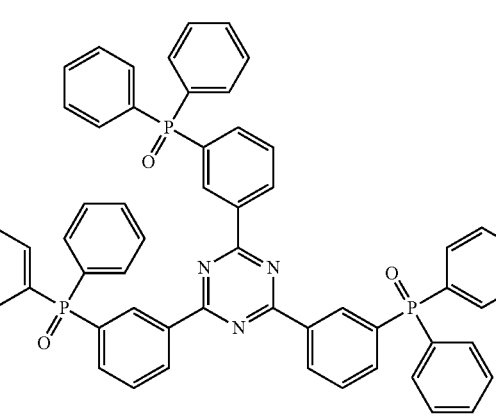

In an embodiment, the second electron transport material may include at least one π electron-deficient nitrogen-containing $C_1$-$C_{60}$ cyclic group.

In an embodiment, the second electron transport region may be a compound represented by Formula 601:

$$[Ar_{601}]_{xe11}\text{-}[(L_{601})_{xe1}\text{-}R_{601}]_{xe21}.$$  Formula 601

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{601}$)($Q_{602}$)($Q_{603}$), —C(=O)($Q_{601}$), —S(=O)$_2$($Q_{601}$), or —P(=O)($Q_{601}$)($Q_{602}$), $Q_{601}$ to $Q_{603}$ are the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

In an embodiment, the second electron transport region may be a Compound represented by Formula 601-1:

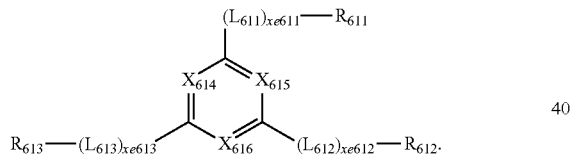

Formula 601-1

In Formula 601-1, $X_{614}$ may be N or C($R_{614}$), $X_{615}$ may be N or C($R_{615}$), $X_{616}$ may be N or C($R_{616}$), at least one of $X_{614}$ to $X_{616}$ may be N, $L_{611}$ to $L_{613}$ are the same as described in connection with $L_{601}$, xe611 to xe613 are the same as described in connection with xe1, $R_{611}$ to $R_{613}$ are the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group substituted or unsubstituted at least one $R_{10a}$.

In an embodiment, the second electron transport material may include one of Compounds ET1 to ET45, 2,9-dimethyl-4,7-diphenyl-1,10-phenanthroline (BCP), 4,7-diphenyl-1,10-phenanthroline (Bphen), Alq$_3$, BAlq, TAZ, NTAZ, or any combination thereof:

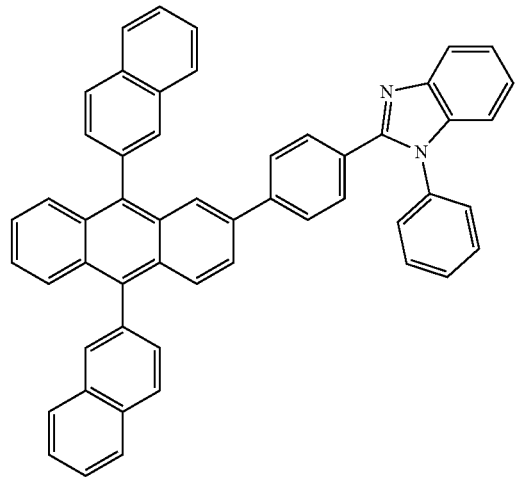

ET1

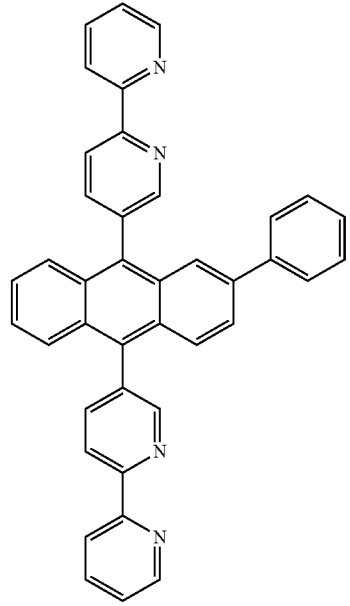

ET2

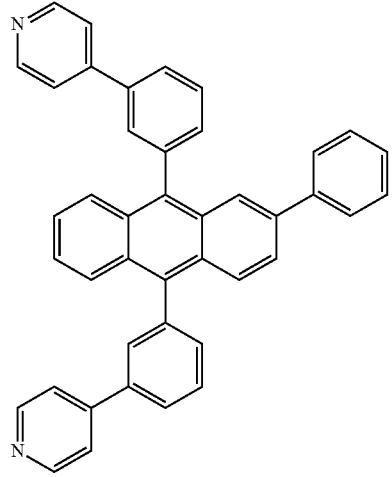

ET3

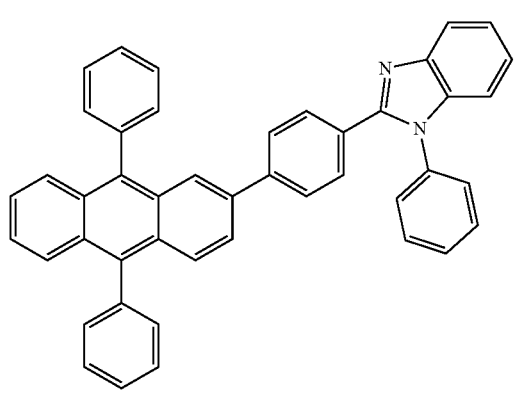
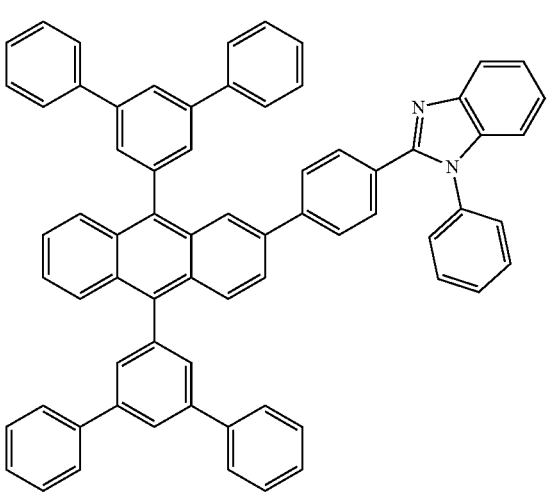

ET10
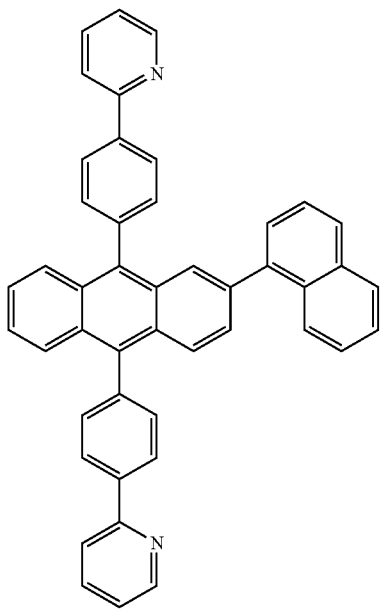
ET11
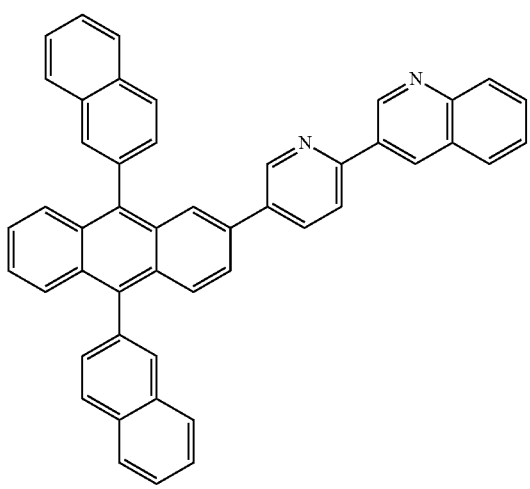
ET12
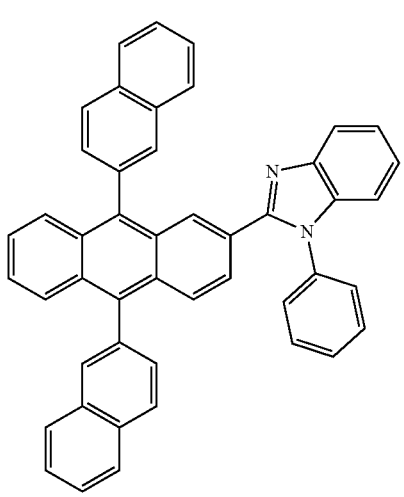
ET13
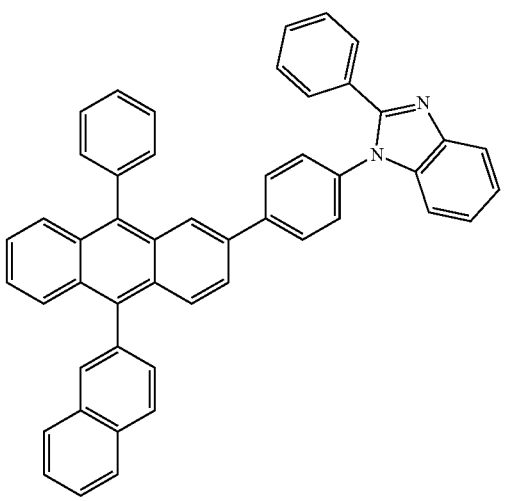
ET14
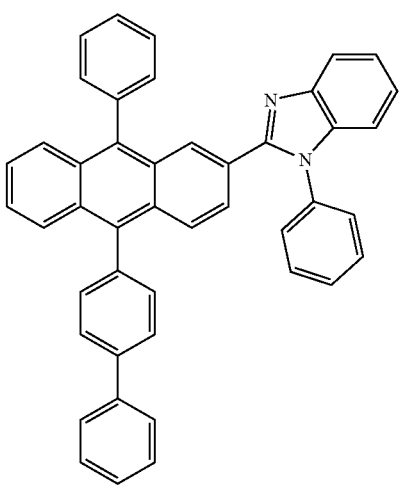
ET15
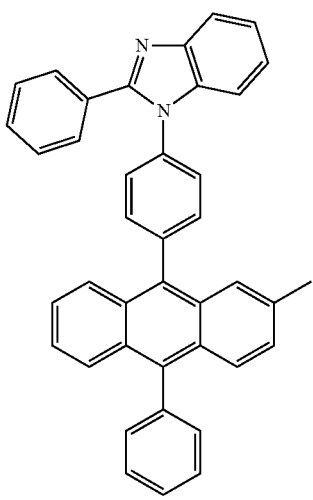

ET16
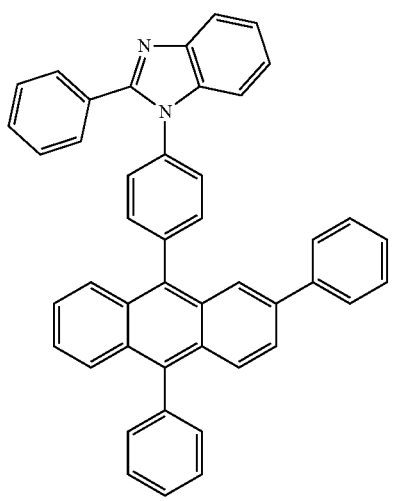
ET19
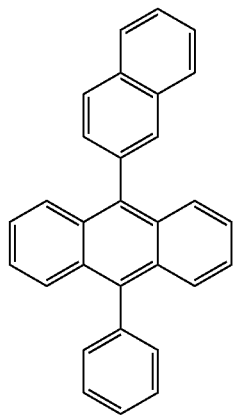
ET17
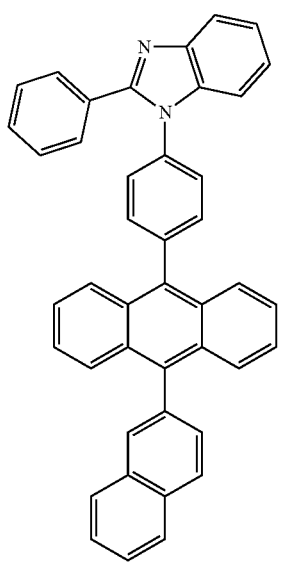
ET20
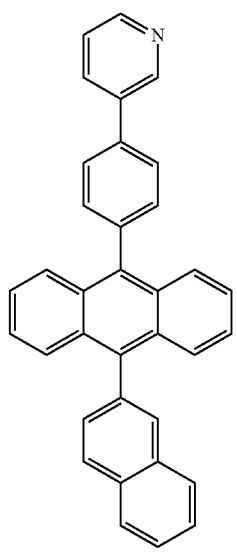
ET18
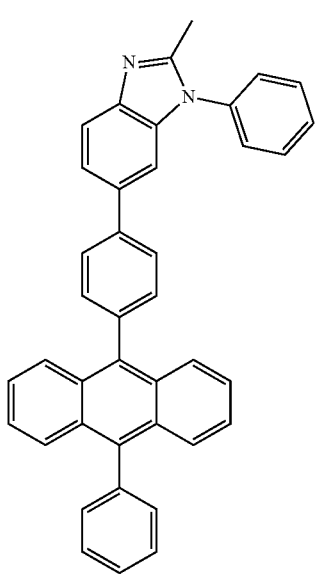
ET21
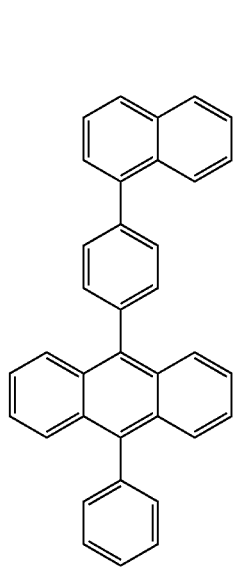

ET22
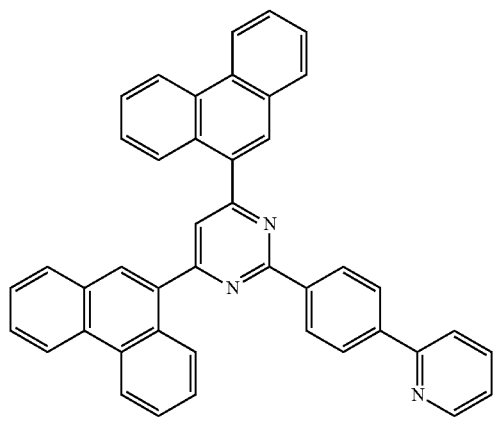
ET25
ET23
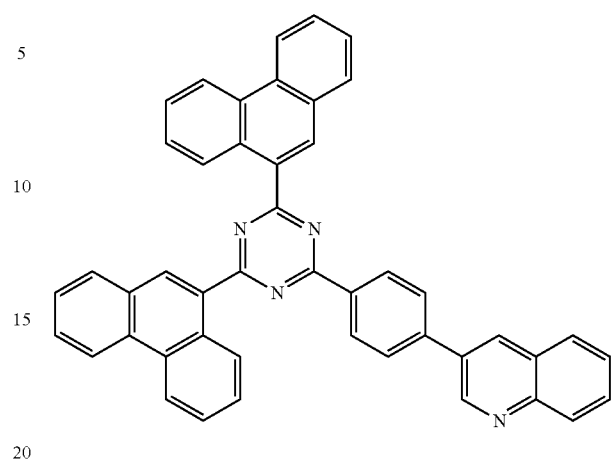
ET26
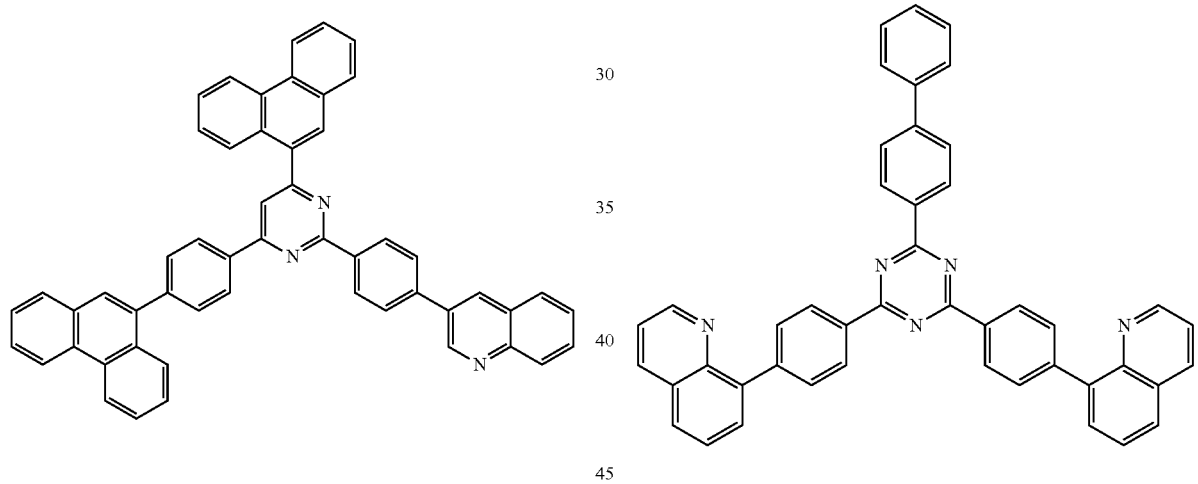
ET24
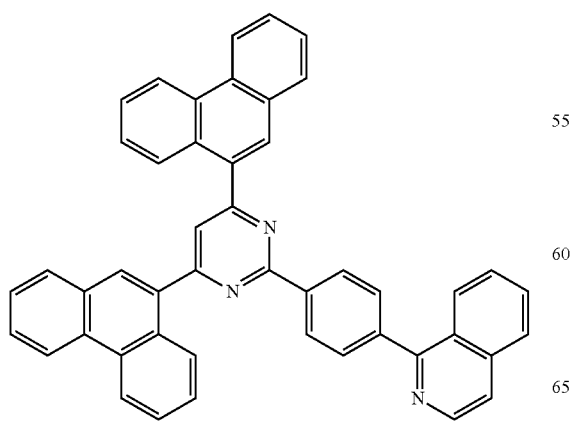
ET27

ET28
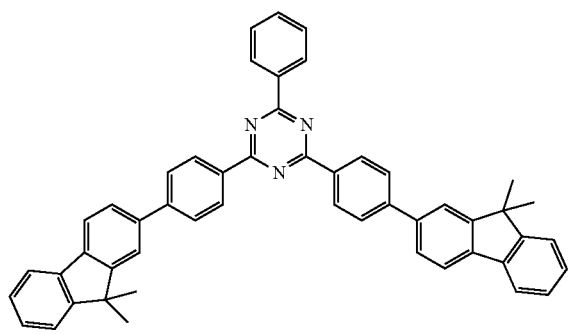
ET29
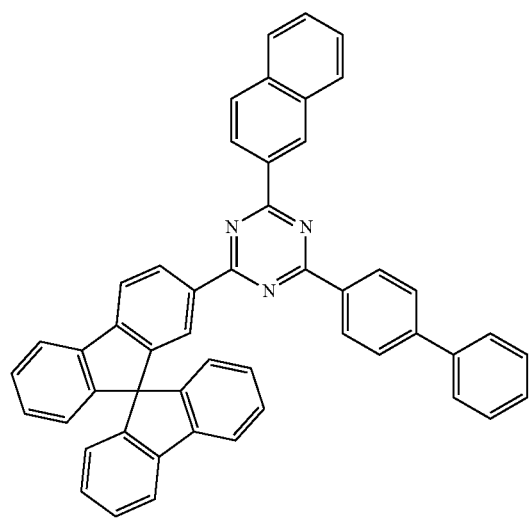
ET30
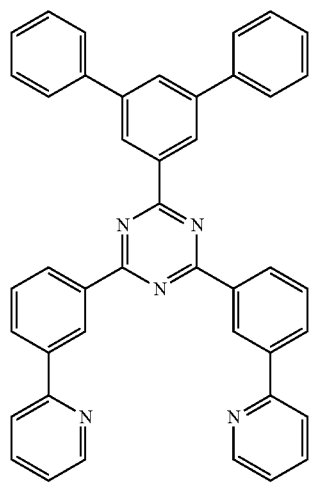
ET31
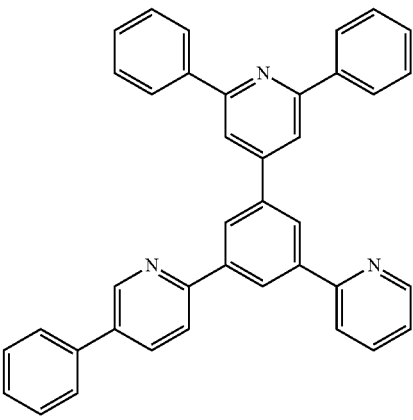
ET32
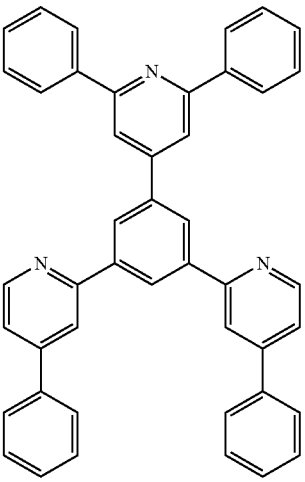
ET33
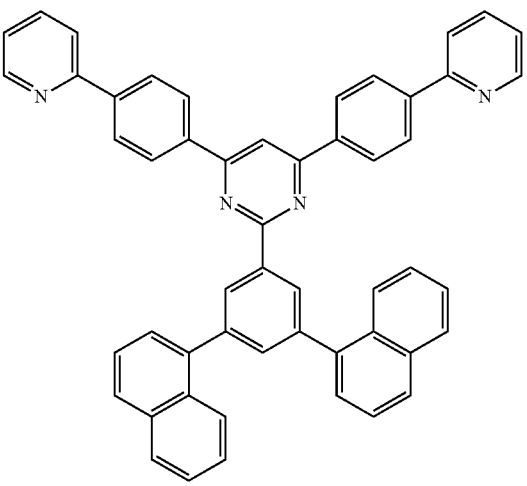

ET34
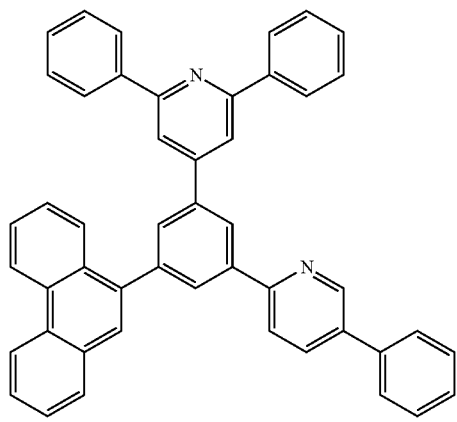
ET35
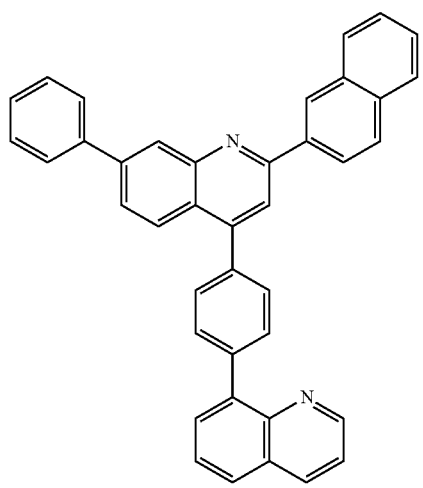
ET36
ET37
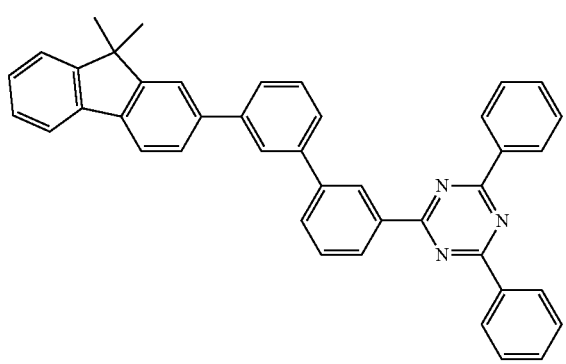
ET38
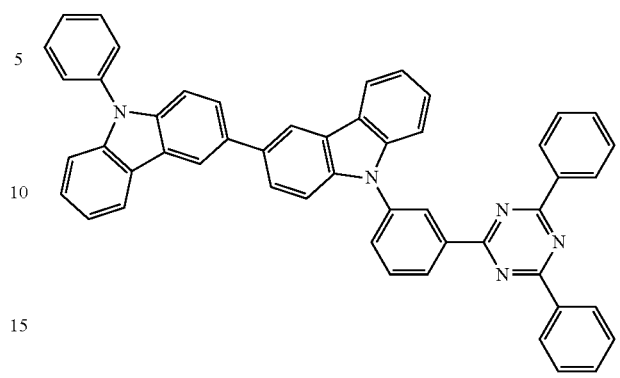
ET39
ET40
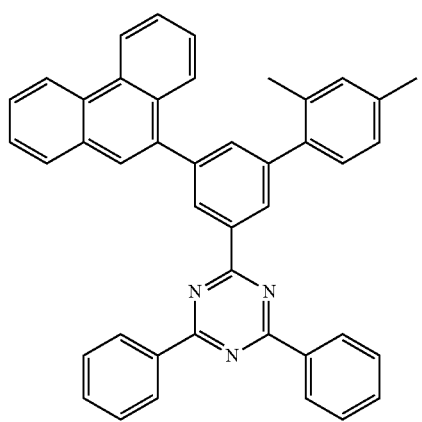

ET41
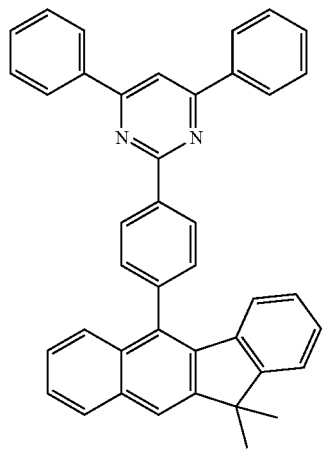
ET44
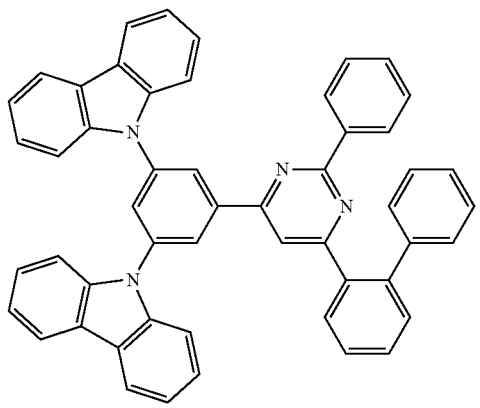
ET42
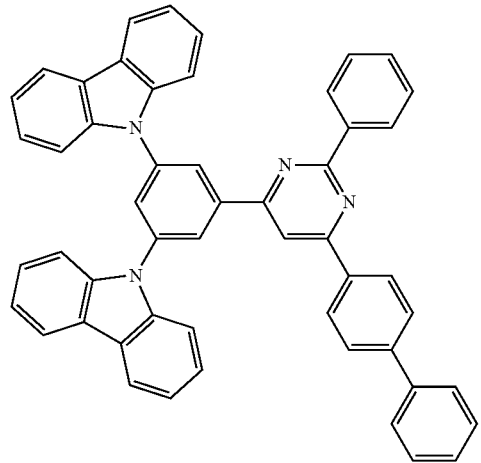
ET45
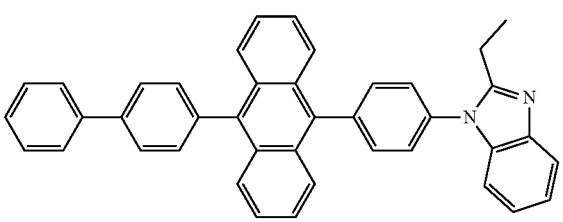
Alq₃
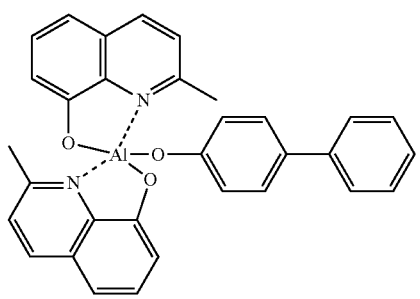
BAlq
ET43
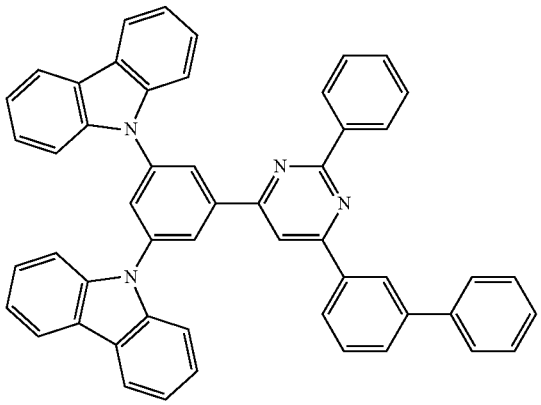
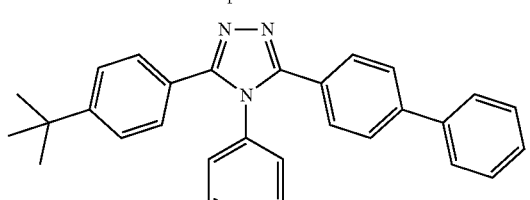
TAZ

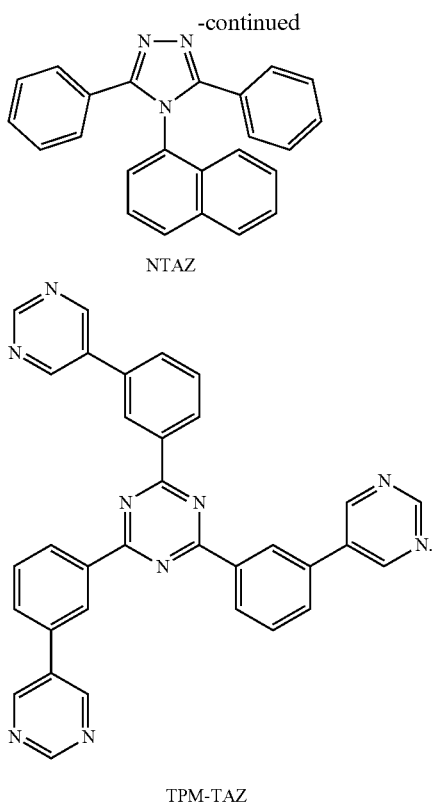

NTAZ

TPM-TAZ

In an embodiment, a weight ratio of the first electron transport material to the second electron transport material in the n-doped electron transport layer 154 may be about 1:9 to about 9:1. For example, the weight ratio of the first electron transport material to the second electron transport material may be about 8:2 to about 2:8, and as another example, about 7:3 to about 3:7.

In an embodiment, in the n-doped electron transport layer 154, the metal may be an alkali metal, an alkaline earth metal, a rare earth metal, a transition metal and a post-transition metal, or any combination thereof.

The alkali metal may be selected from Li, Na, K, Rb, and Cs. In an embodiment, the alkali metal may be Li, Na, or Cs. In one or more embodiments, the alkali metal may be Li or Cs, but embodiments of the present disclosure are not limited thereto.

The alkaline earth metal may be selected from Mg, Ca, Sr, and Ba.

The rare earth metal may be selected from Sc, Y, Ce, Tb, Yb, and Gd.

For example, the metal can be Li, Mg, Yb, or any combination thereof.

In an embodiment, the amount of the metal in the n-doped electron transport layer 154 may be about 1 parts by weight to about 20 parts by weight based on 100 parts by weight of the n-doped electron transport layer 154. For example, the amount of the metal in the n-doped electron transport layer 154 may be about 1 part by weight to about 20 parts by weight based on a total amount of 100 parts by weight of the first electron transport material and the second electron transport material.

A thickness of the n-doped electron transport layer 154 may be from about 100 Å to about 1000 Å. For example, a thickness of the n-doped electron transport layer 154 may be about 100 Å to about 500 Å, but embodiments of the present disclosure are not limited thereto. When a thickness of the n-doped electron transport layer 154 satisfies the above-described ranges, a high-quality light-emitting device may be implemented without a substantial increase in driving voltage.

In an embodiment, in the m−1 light-emitting units other than the light-emitting unit neighboring the second electrode, a kth light-emitting unit may include the n-doped electron transport layer, the kth light-emitting unit may include the kth emission layer, and the kth light-emitting unit may further include a hole blocking layer between the kth emission layer and the n-doped electron transport layer.

In an embodiment, in the m−1 light-emitting units other than the light-emitting unit neighboring the second electrode, a kth light-emitting unit may include the n-doped electron transport layer, the kth light-emitting unit may include the kth emission layer, and the kth light-emitting unit may directly contact the n-doped electron transport layer.

In an embodiment, the p-type charge generation layers 155P-1 and 155P-2 may include a p-dopant. The p-dopant is the same as described in connection with a hole transport region to be described herein below.

In an embodiment, in the charge generation layer 155-2, the n-type charge generation layer 155N-2 may directly contact (e.g., physically contact) the p-type charge generation layer 155P-2.

In a tandem light-emitting device of the related art, an n-type charge generation layer, in which a single host, which is an organic compound, is doped with a metal, is used, and an electron transport region including a plurality of layers such as an electron transport layer and a hole blocking layer is between an n-type charge generation layer and a neighboring emission layer, thus increasing the driving voltage.

In the light-emitting device according to an embodiment, at least one light-emitting unit may include an n-doped electron transport layer which may serve as an n-type charge generation layer. The n-doped electron transport layer may be a layer in which two or more types or kinds of electron transport materials are doped with a metal, and may serve as an electron transport layer and an n-type charge generation layer. Accordingly, compared to a light-emitting device of the related art, because the light-emitting device according to an embodiment has a structure with at least one organic layer removed, the number of interfaces between organic layers between the n-type charge generation layer and the emission layers is reduced, so that electrons can be efficiently injected into the emission layer. Accordingly, the driving voltage of the light-emitting device may be reduced and efficiency may be improved.

The light-emitting device according to an embodiment includes a compound in which the first electron transport material includes a phenanthroline group, a phosphine oxide group, a phosphine sulfide group, or any combination thereof. The phenanthroline group, the phosphine oxide group, and the phosphine sulfide group all have an unshared electron pair capable of binding to a metal. For example, when the first electron transport material contains a phenanthroline group, the nitrogen atom of the phenanthroline binds to a metal, so that the effective LUMO energy level of the first electron transport material is decreased compared to the case where the metal is not bound, and thus, the driving voltage of the light-emitting element 10 may be lowered and efficiency may be improved. In addition, because the first electron transport material has high charge mobility, electrons generated between the p-type charge generation layer and the n-doped electron transport layer can be efficiently transferred, thereby resulting the improvement of the efficiency of the light-emitting device.

In addition, in the light-emitting device according to an embodiment, the n-doped electron transport layer includes, as a co-host, a second electron transport material which is different from the first electron transport material. The second electron transport material may have a relatively high electron mobility compared to the first electron transport material bound to a metal. Accordingly, because the n-doped electron transport layer further includes a second electron transport material, electrons can be more efficiently injected into the emission layer, thereby resulting in improvement of the efficiency of the light-emitting device.

First Electrode 110

In FIG. 1, a substrate may be additionally located under the first electrode 110 and/or above the second electrode 190. As the substrate, a glass substrate and/or a plastic substrate may be used. In an embodiment, the substrate may be a flexible substrate, and may include plastics having excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing and/or sputtering a material for forming the first electrode 110 on the substrate. When the first electrode 110 is an anode, a material for forming the first electrode 110 may be a high work function material that facilitates injection of holes.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combinations thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming a first electrode.

The first electrode 110 may have a single layer including (e.g., consisting of) a single-layered structure or a multilayer structure including a plurality of layers. For example, the first electrode 110 may have a three-layered structure of ITO/Ag/ITO.

Interlayer 150

The interlayer 150 is on the first electrode 110. The interlayer 150 includes light-emitting units 150-1, 150-2, and 150-3, and the light-emitting units 150-1, 150-2, and 150-3 each include emission layers 153-1, 153-2, and 153-3.

The light-emitting units 150-1, 150-2, and 150-3 may each further include a hole transport region between the first electrode 110 and the emission layer and an electron transport region between the emission layer and the second electrode 190.

The interlayer 150 may further include metal-containing compounds such as organometallic compounds, inorganic materials such as quantum dots, and/or the like, in addition to various suitable organic materials.

Hole Transport Region

The hole transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110.

The hole transport region may include a compound represented by Formula 201, a compound represented by Formula 202, or any combination thereof:

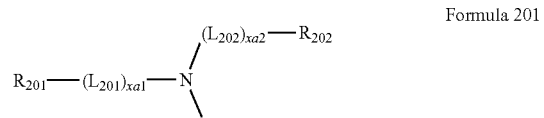

Formula 201

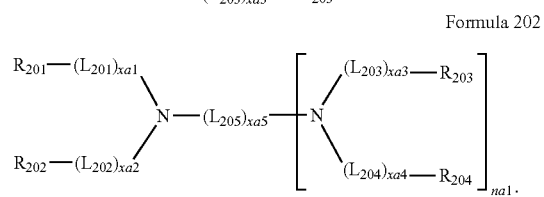

Formula 202

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently an integer from 0 to 5, xa5 may be an integer from 1 to 10, $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, to form a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group (for example, a carbazole group and/or the like) unsubstituted or substituted with at least one $R_{10a}$ (see Compound HT16 and/or the like), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 is an integer from 1 to 4.

In one or more embodiments, each of Formulae 201 and 202 may include at least one of groups represented by Formulae CY201 to CY217.

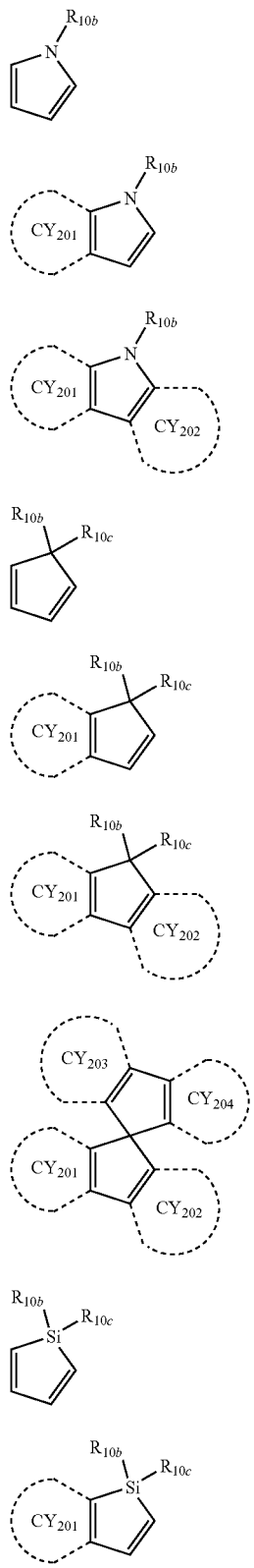

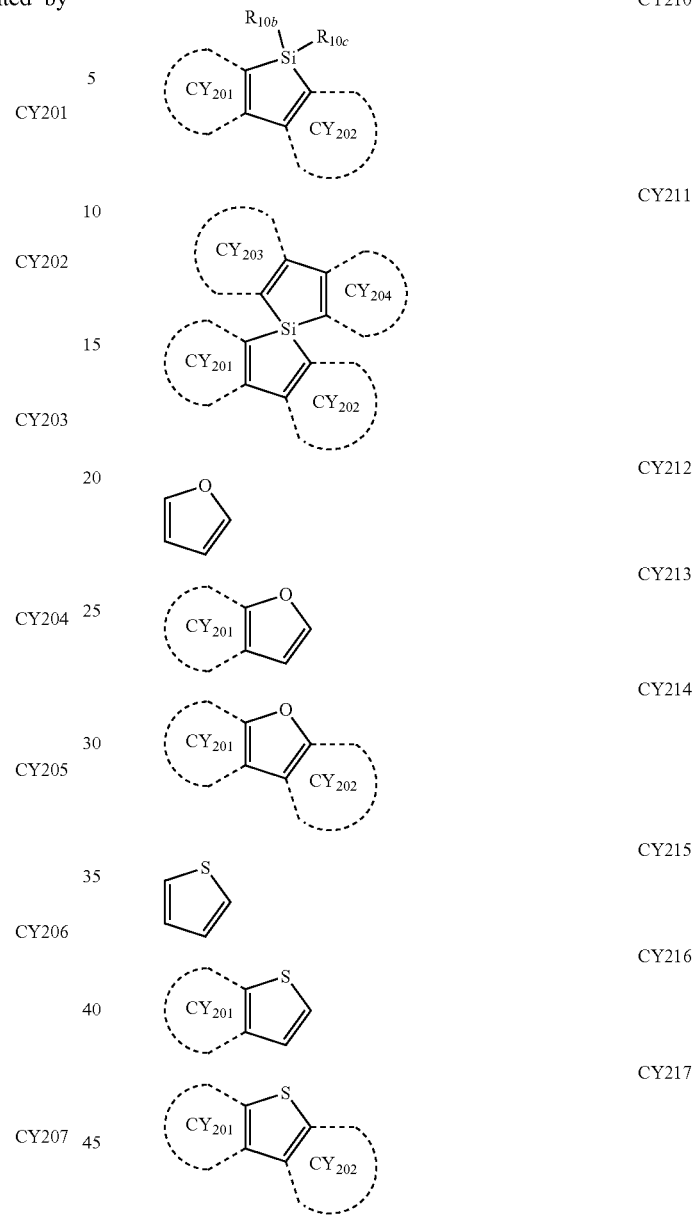

In Formulae CY201 to CY217, $R_{10b}$ and $R_{10c}$ are the same as described in connection with $R_{10a}$, and ring $CY_{201}$ to ring $CY_{204}$ may each independently be a $C_3$-$C_{20}$ carbocyclic group or a $C_1$-$C_{20}$ heterocyclic group, and at least one hydrogen in Formulae CY201 to CY217 may be unsubstituted or substituted with at least one $R_{10a}$.

In an embodiment, ring $CY_{201}$ to ring $CY_{204}$ in Formulae CY201 to CY217 may each independently be a benzene group, a naphthalene group, a phenanthrene group, or an anthracene group.

In one or more embodiments, each of Formulae 201 and 202 may include at least one of groups represented by Formulae CY201 to CY203.

In one or more embodiments, Formula 201 may include at least one of groups represented by Formulae CY201 to CY203 and at least one of groups represented by Formulae CY204 to CY217.

In one or more embodiments, xa1 in Formula 201 is 1, $R_{201}$ is a group represented by one of Formulae CY201 to CY203, xa2 may be 0, and $R_{202}$ may be a group represented by one of Formulae CY204 to CY207.

In one or more embodiments, each of Formulae 201 and 202 may not include a group represented by one of Formulae CY201 to CY203.

In one or more embodiments, each of Formulae 201 and 202 may not include a group represented by one of Formulae CY201 to CY203, and may include at least one of groups represented by Formulae CY204 to CY217.

In an embodiment, each of Formulae 201 and 202 may not include a group represented by one of Formulae CY201 to CY217.

In an embodiment, the hole transport region may include one of Compounds T1 to HT44, m-MTDATA, TDATA, 2-TNATA, NPB(NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

HT1

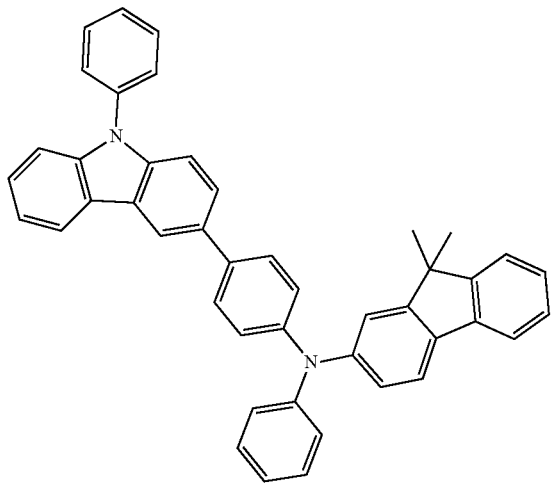

HT2

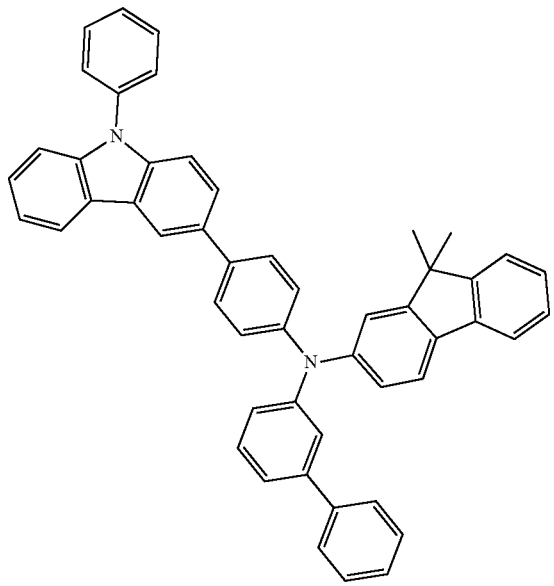

HT3

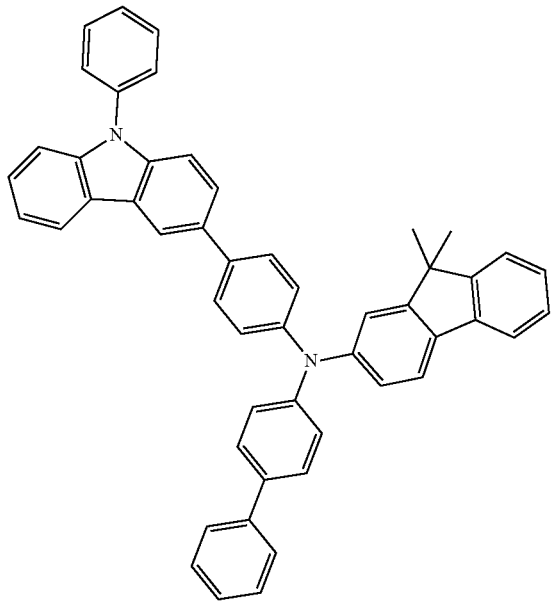

HT4

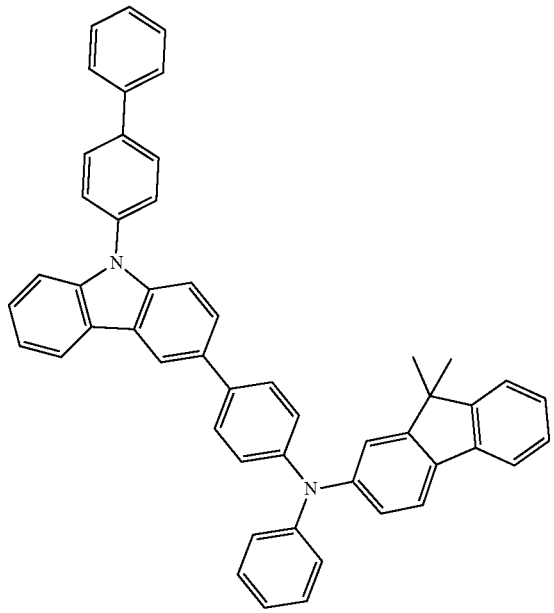

-continued
HT5
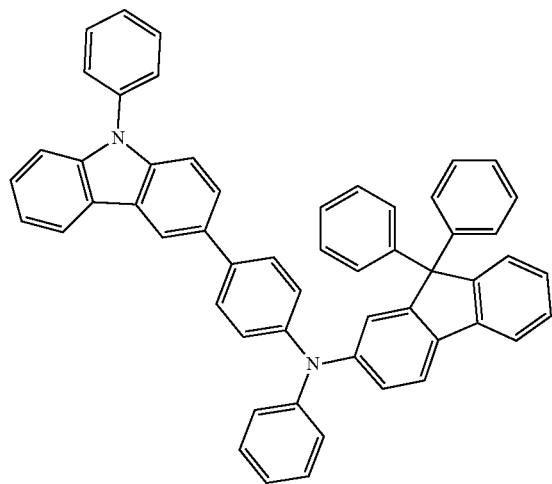
HT6
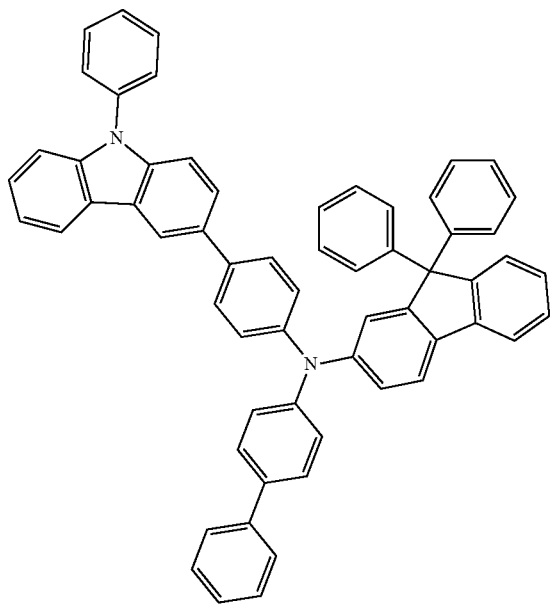
HT7
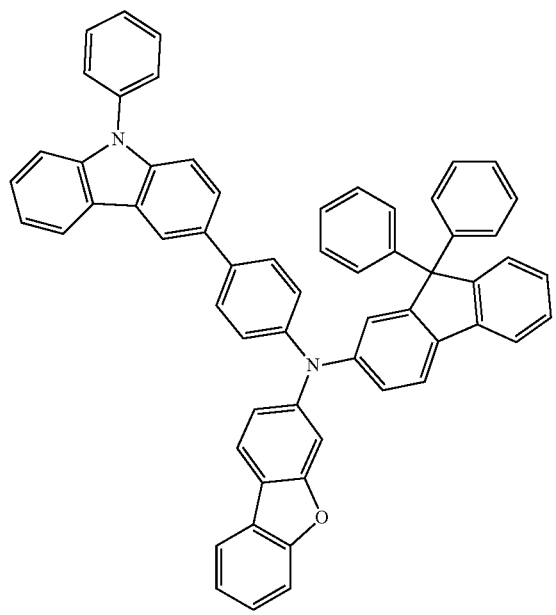
HT8
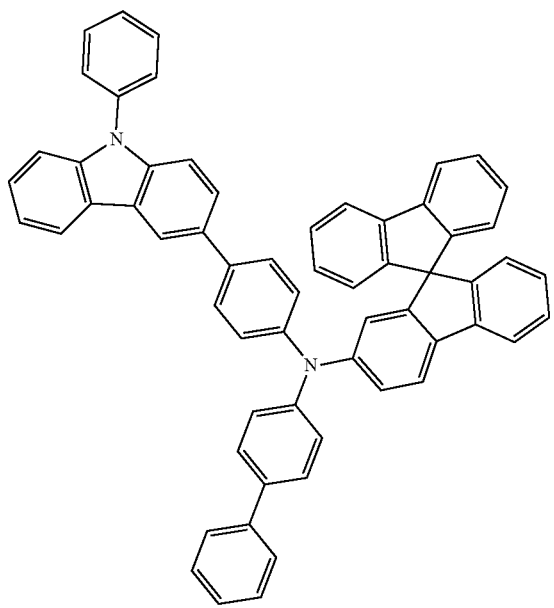

HT9
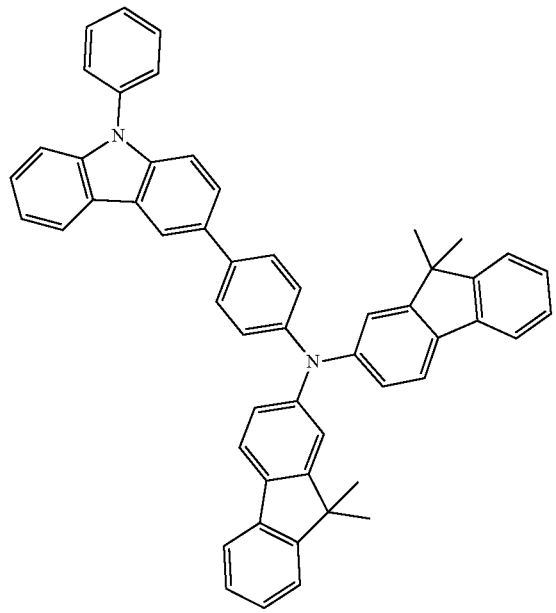
HT10
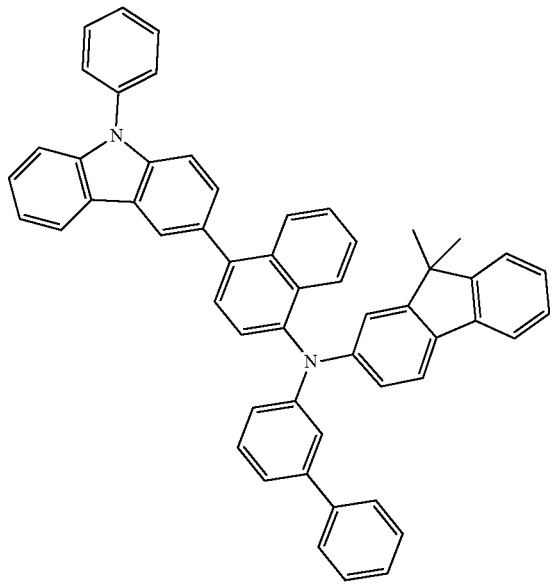
HT11
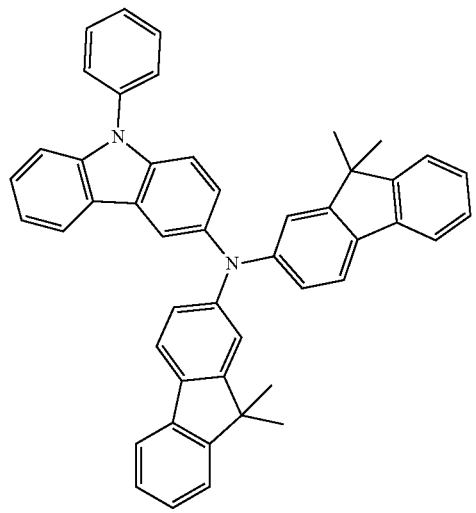
HT12
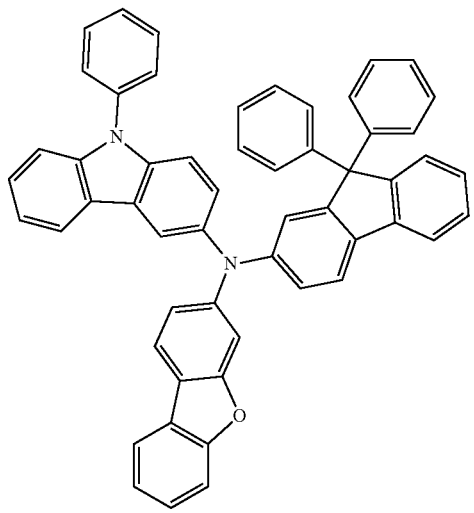

-continued
HT13
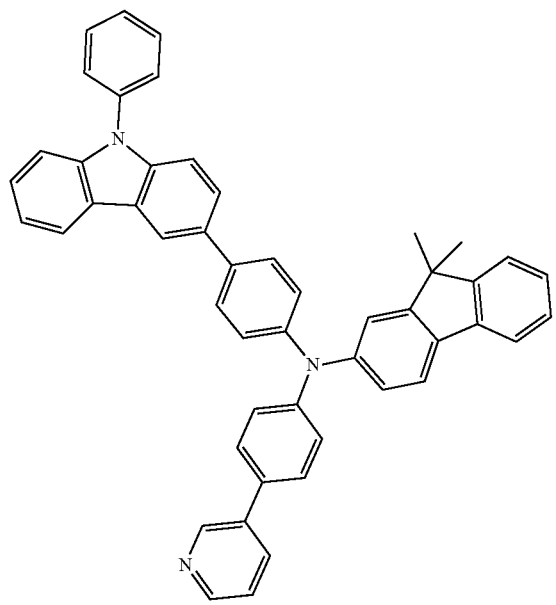
HT14
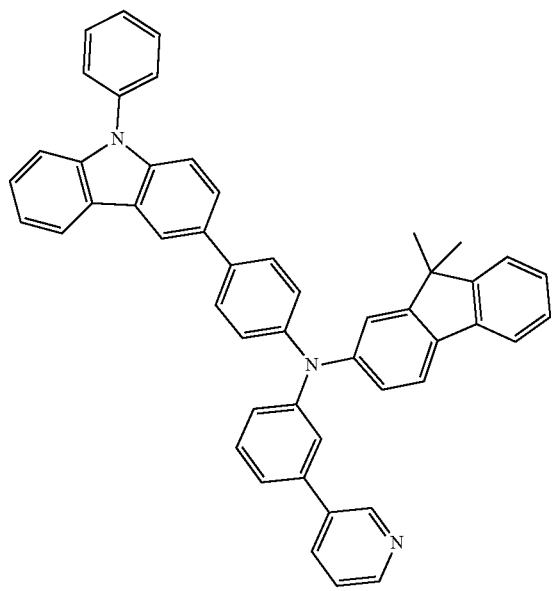
HT15
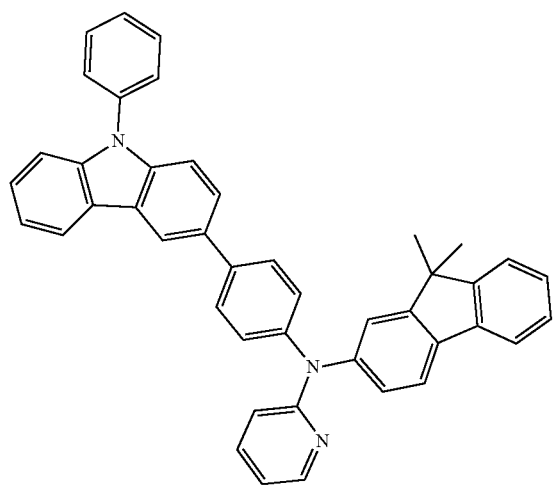
HT16
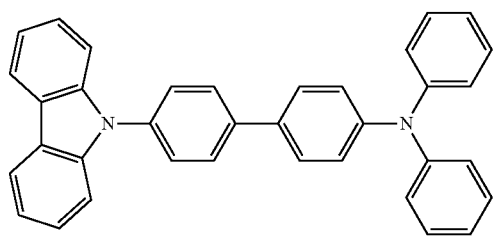
HT17
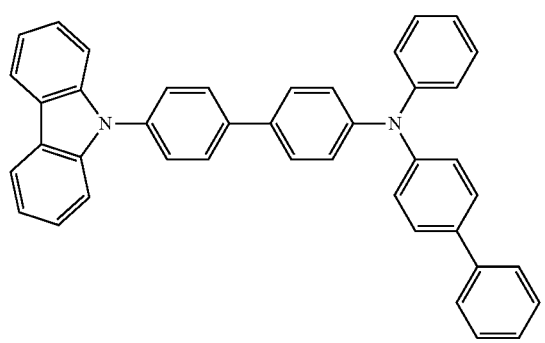
HT18
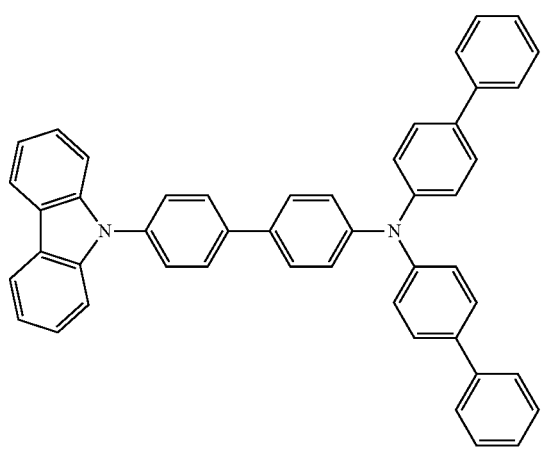

-continued
HT19
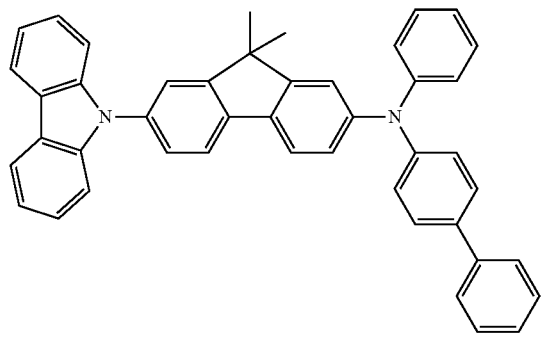
HT20
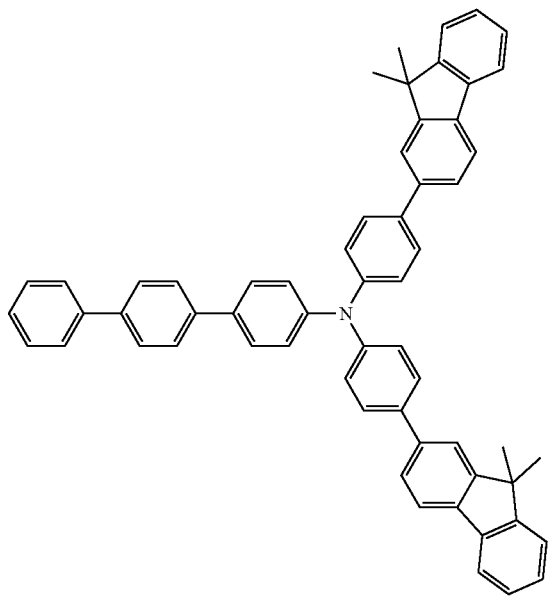
HT21
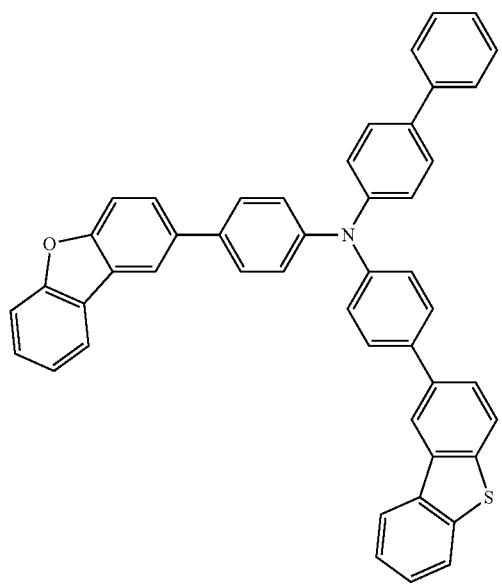
HT22
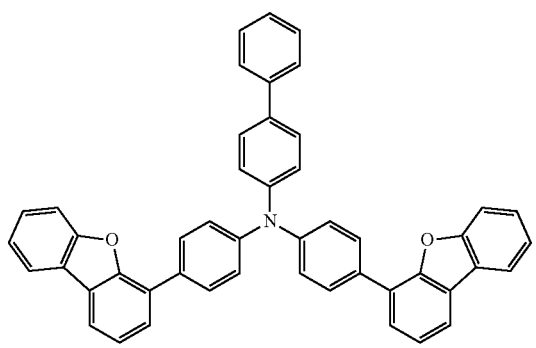

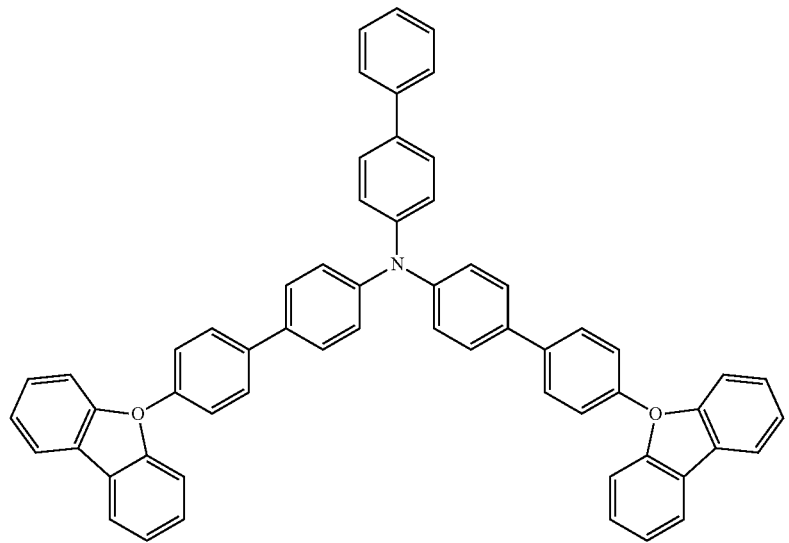
HT23
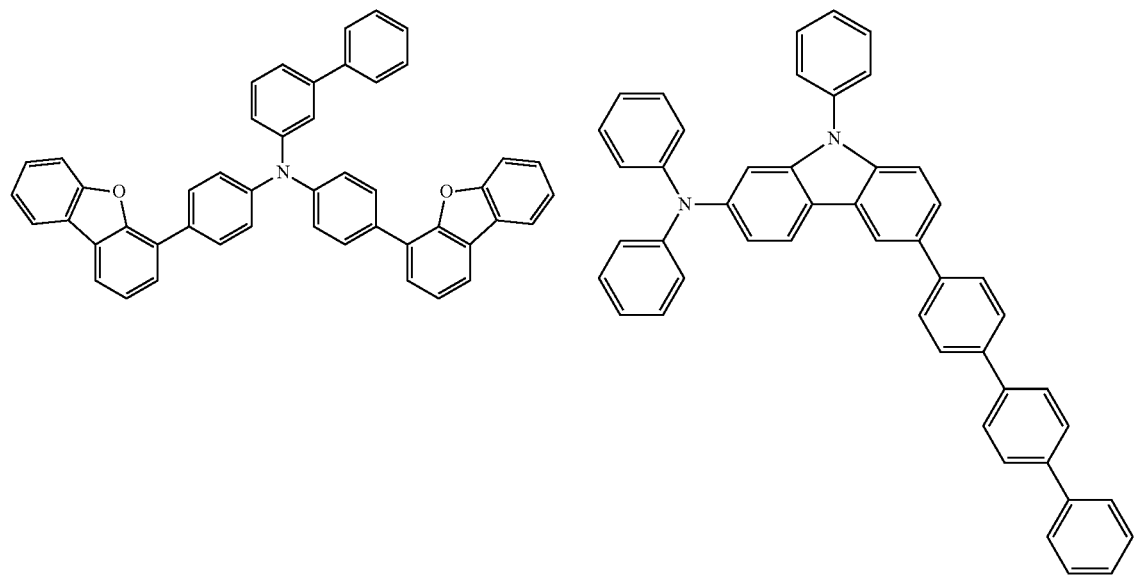
HT24
HT25

-continued
HT26
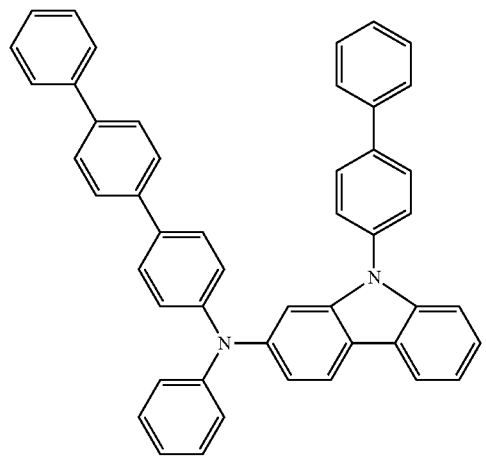
HT27
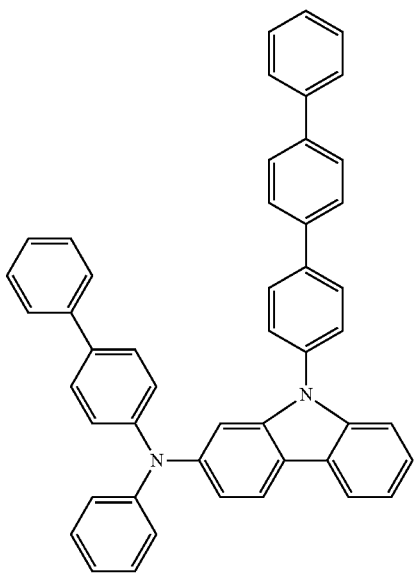
HT28
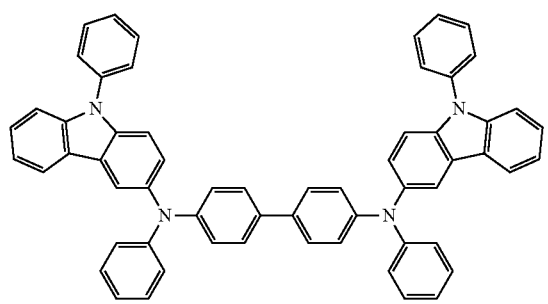
HT29
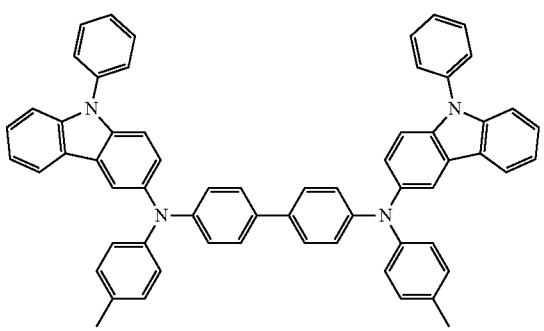
HT30
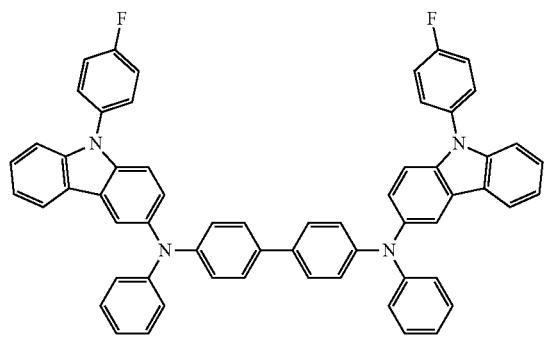
HT31
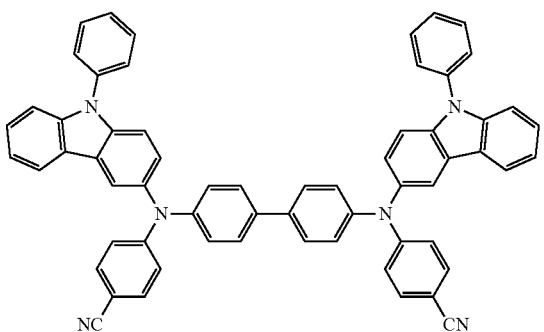

-continued
HT32
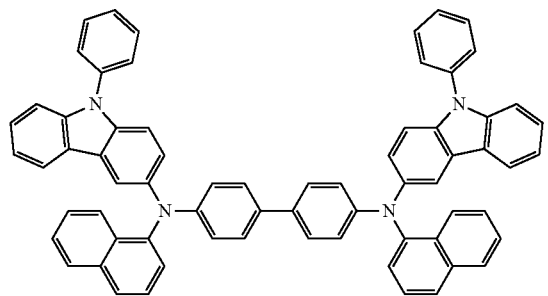
HT33
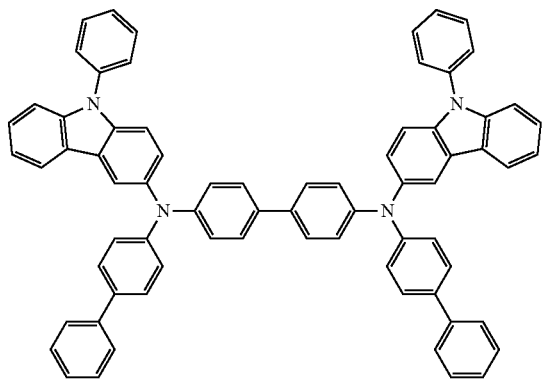
HT34
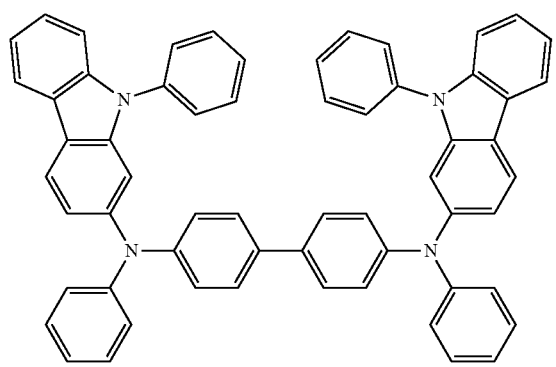
HT35
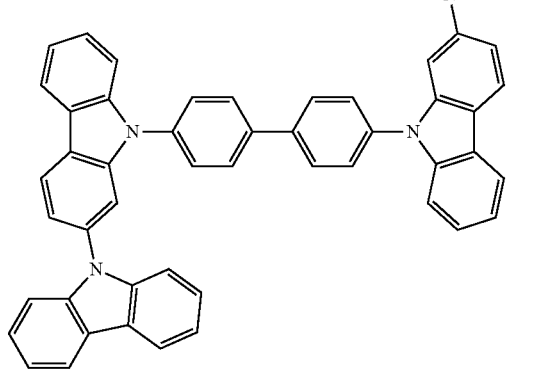
HT36
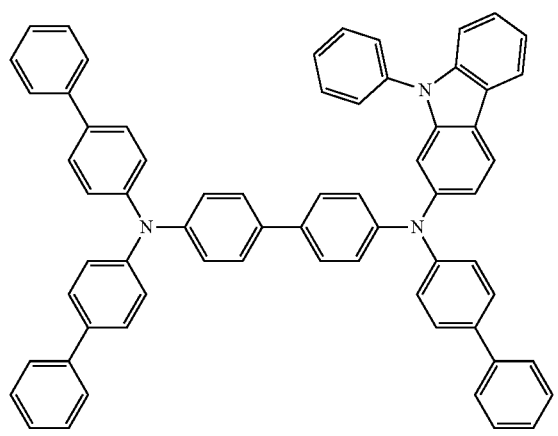
HT37
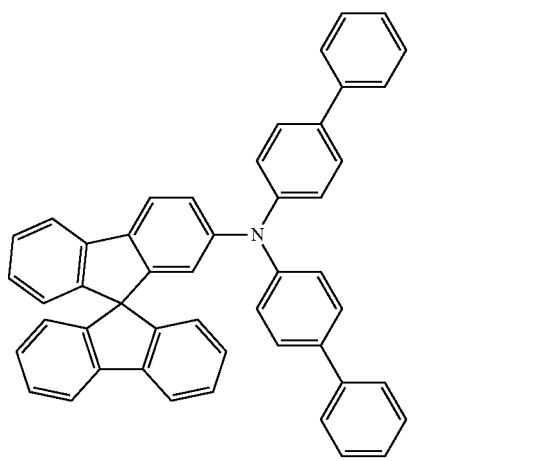

-continued
HT38
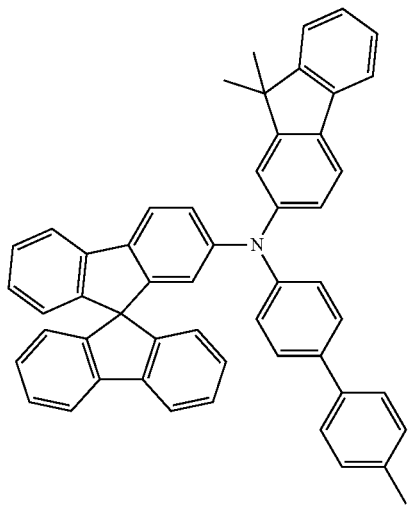
HT39
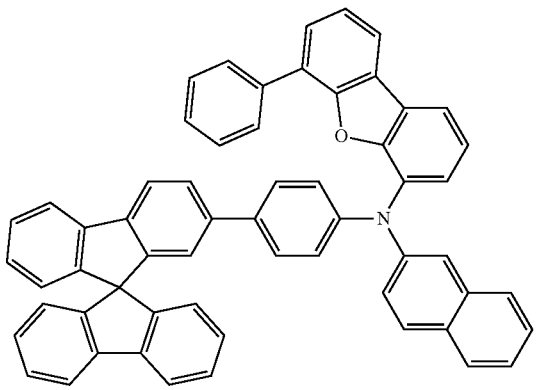
HT40
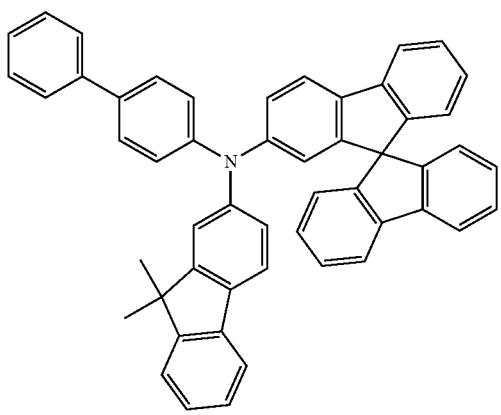
HT41
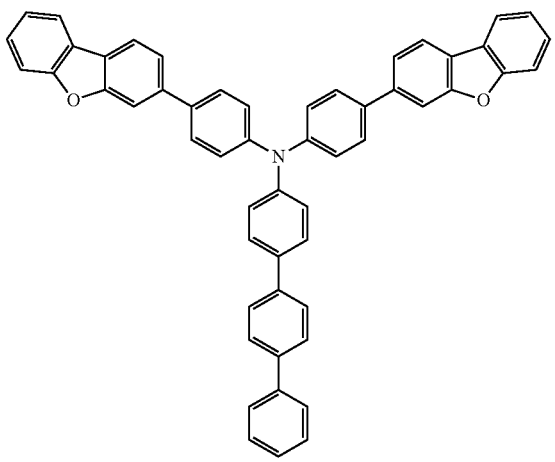
HT42
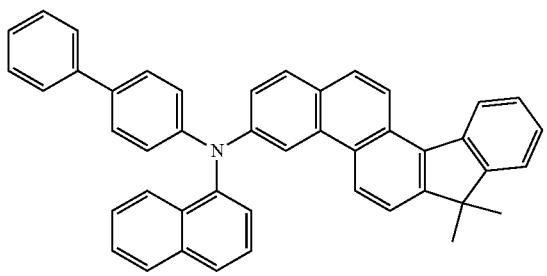
HT43
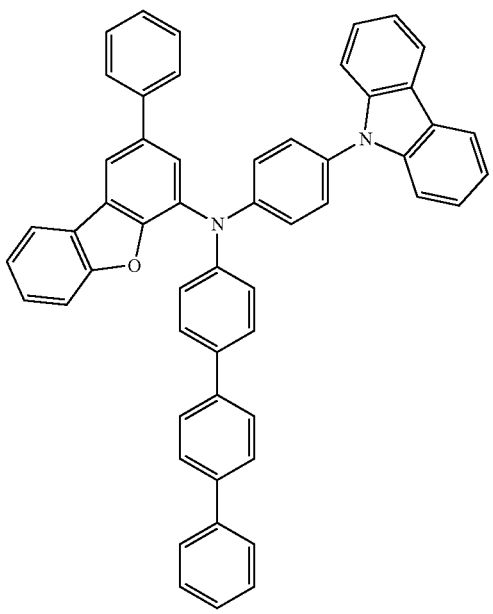

-continued
HT44
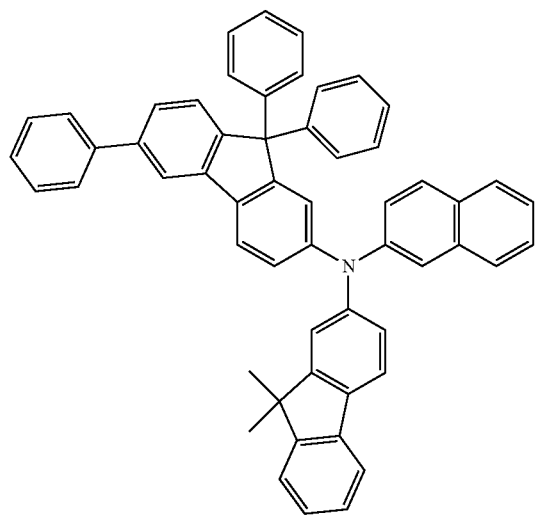
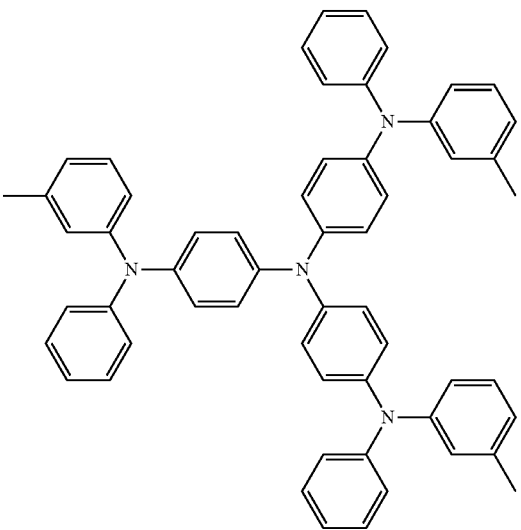
m-MTDATA
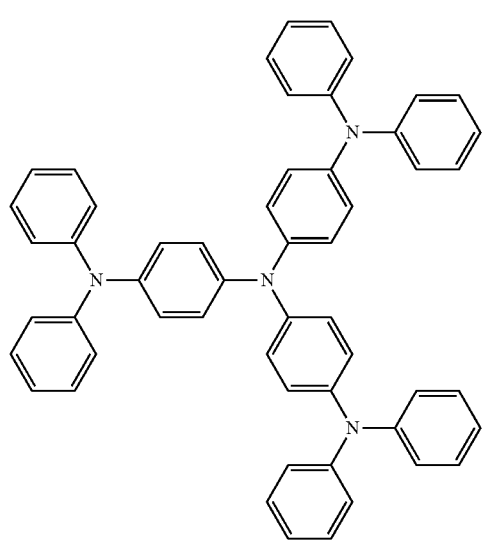
TDATA
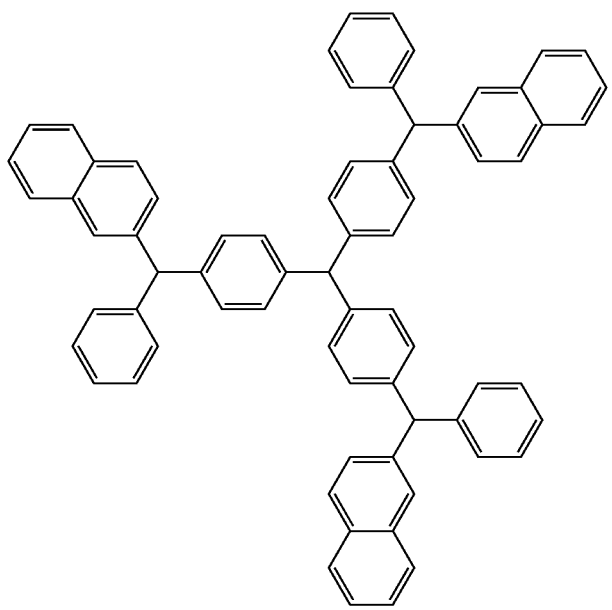
2-TNATA
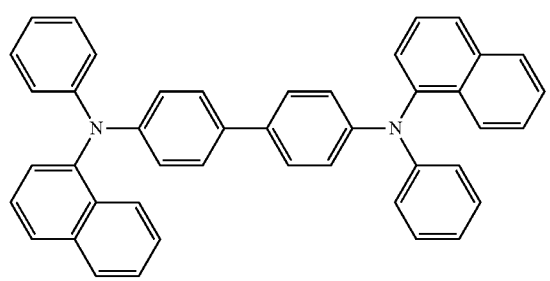
NPB -continued
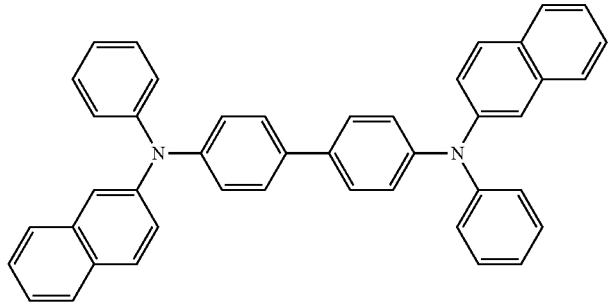
β-NPB
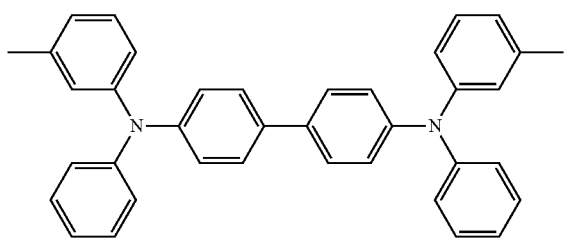
TPD
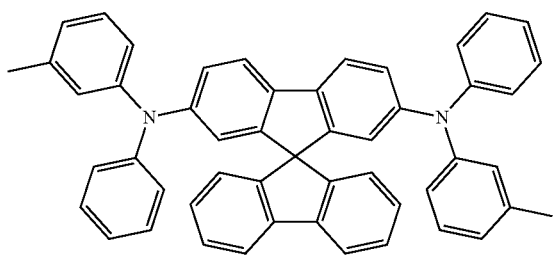
Spiro-TPD
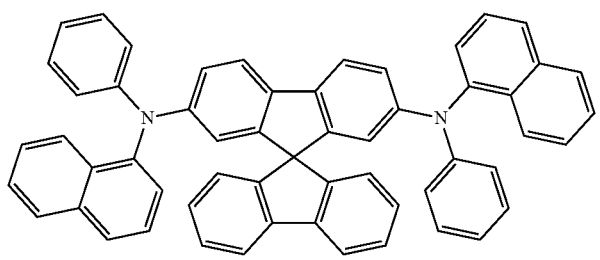
Spiro-NPB
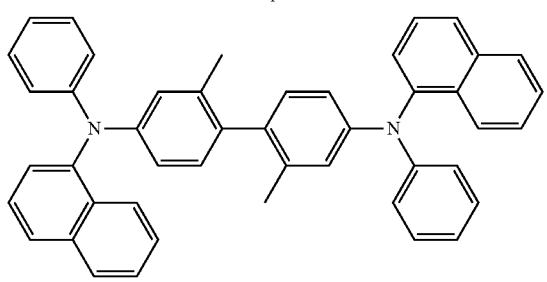
methylated-NPB

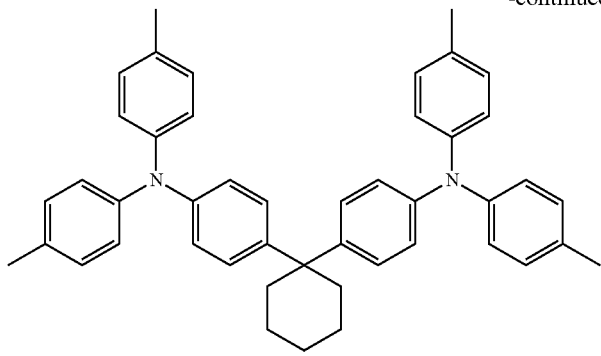

TAPC

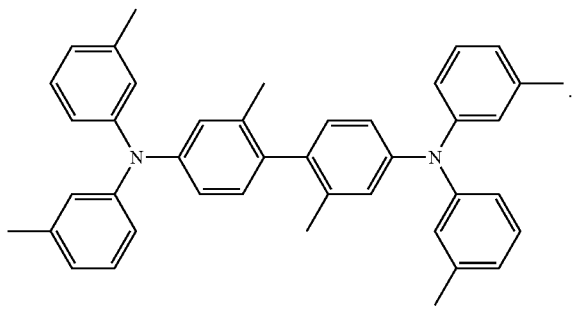

HMTPD

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, suitable or satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron-blocking layer may block or reduce the flow of electrons from an electron transport region. The emission auxiliary layer and the electron-blocking layer may include the materials as described above.

p-Dopant

The hole transport region may further include, in addition to these materials, a charge-generation material for the improvement of conductive properties (electrically conductive properties). The charge-generation material may be uniformly or non-uniformly dispersed in the hole transport region (for example, in the form of a single layer including (e.g., consisting of) a charge-generation material).

The charge-generation material may be, for example, a p-dopant.

In an embodiment, the lowest unoccupied molecular orbital (LUMO) energy level of the p-dopant may be −3.5 eV or less.

In an embodiment, the p-dopant may include a quinone derivative, a cyano group-containing compound, a compound containing element EL1 and element EL2, or any combination thereof.

Examples of the quinone derivative are TCNQ, F4-TCNQ, etc.

Examples of the cyano group-containing compound are HAT-CN, and a compound represented by Formula 221 below.

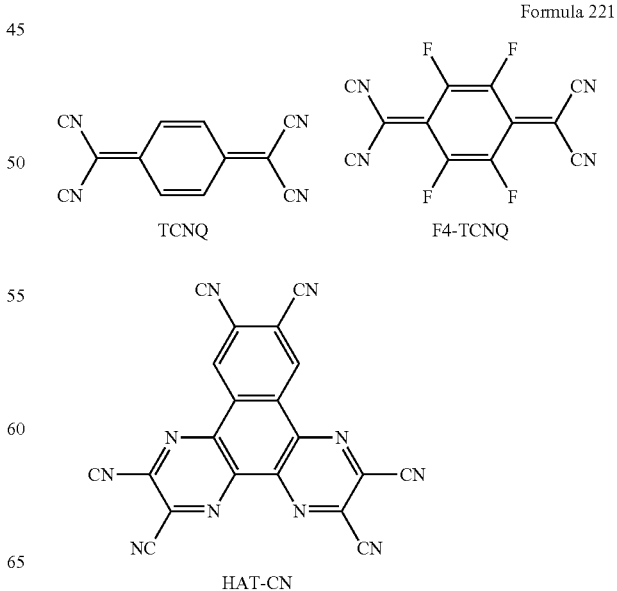

Formula 221

TCNQ     F4-TCNQ

HAT-CN

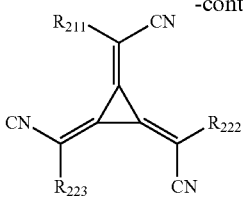

-continued

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{60}$ carbocyclic group or a $C_1$-$C_{60}$ heterocyclic group, each substituted with a cyano group; —F; —Cl; —Br; —I; a $C_1$-$C_{20}$ alkyl group substituted with a cyano group, —F, —Cl, —Br, —I, or any combination thereof; or any combination thereof.

In the compound containing element EL1 and element EL2, element EL1 may be metal, metalloid, or a combination thereof, and element EL2 may be non-metal, metalloid, or a combination thereof.

Examples of the metal may include: an alkali metal (for example, lithium (Li), sodium (Na), potassium (K), rubidium (Rb), cesium (Cs), etc.); an alkaline earth metal (for example, beryllium (Be), magnesium (Mg), calcium (Ca), strontium (Sr), barium (Ba), etc.); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), etc.); a post-transition metal (for example, zinc (Zn), indium (In), tin (Sn), etc.); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), etc.).

Examples of the metalloid are silicon (Si), antimony (Sb), and tellurium (Te).

Examples of the non-metal are oxygen (O) and halogen (for example, F, Cl, Br, I, etc.).

In an embodiment, examples of the compound containing element EL1 and element EL2 are metal oxide, metal halide (for example, metal fluoride, metal chloride, metal bromide, and/or metal iodide), metalloid halide (for example, metalloid fluoride, metalloid chloride, metalloid bromide, and/or metalloid iodide), metal telluride, or any combination thereof.

Examples of the metal oxide are tungsten oxide (for example, WO, $W_2O_3$, $WO_2$, $WO_3$, $W_2O_5$, etc.), vanadium oxide (for example, VO, $V_2O_3$, $VO_2$, $V_2O_5$, etc.), molybdenum oxide (MoO, $Mo_2O_3$, $MoO_2$, $MoO_3$, $Mo_2O_5$, etc.), and rhenium oxide (for example, $ReO_3$, etc.).

Examples of the metal halide are alkali metal halide, alkaline earth metal halide, transition metal halide, post-transition metal halide, and lanthanide metal halide.

Examples of the alkali metal halide are LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide are $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide are titanium halide (for example, $TiF_4$, $TiCl_4$, $TiBr_4$, $TiI_4$, etc.), zirconium halide (for example, $ZrF_4$, $ZrCl_4$, $ZrBr_4$, $ZrI_4$, etc.), hafnium halide (for example, $HfF_4$, $HfCl_4$, $HfBr_4$, $HfI_4$, etc.), vanadium halide (for example, $VF_3$, $VCl_3$, $VBr_3$, $VI_3$, etc.), niobium halide (for example, $NbF_3$, $NbCl_3$, $NbBr_3$, $NbI_3$, etc.), tantalum halide (for example, $TaF_3$, $TaCl_3$, $TaBr_3$, $TaI_3$, etc.), chromium halide (for example, $CrF_3$, $CrCl_3$, $CrBr_3$, $CrI_3$, etc.), molybdenum halide (for example, $MoF_3$, $MoCl_3$, $MoBr_3$, $MoI_3$, etc.), tungsten halide (for example, $WF_3$, $WCl_3$, $WBr_3$, $WI_3$, etc.), manganese halide (for example, $MnF_2$, $MnCl_2$, $MnBr_2$, $MnI_2$, etc.), technetium halide (for example, $TcF_2$, $TcCl_2$, $TcBr_2$, $TcI_2$, etc.), rhenium halide (for example, $ReF_2$, $ReCl_2$, $ReBr_2$, $ReI_2$, etc.), iron halide (for example, $FeF_2$, $FeCl_2$, $FeBr_2$, $FeI_2$, etc.), ruthenium halide (for example, $RuF_2$, $RuCl_2$, $RuBr_2$, $RuI_2$, etc.), osmium halide (for example, $OsF_2$, $OsCl_2$, $OsBr_2$, $OsI_2$, etc.), cobalt halide (for example, $CoF_2$, $CoCl_2$, $CoBr_2$, $CoI_2$, etc.), rhodium halide (for example, $RhF_2$, $RhCl_2$, $RhBr_2$, $RhI_2$, etc.), iridium halide (for example, $IrF_2$, $IrCl_2$, $IrBr_2$, $IrI_2$, etc.), nickel halide (for example, $NiF_2$, $NiCl_2$, $NiBr_2$, $NiI_2$, etc.), palladium halide (for example, $PdF_2$, $PdCl_2$, $PdBr_2$, $PdI_2$, etc.), platinum halide (for example, $PtF_2$, $PtCl_2$, $PtBr_2$, $PtI_2$, etc.), copper halide (for example, CuF, CuCl, CuBr, CuI, etc.), silver halide (for example, AgF, AgCl, AgBr, AgI, etc.), and gold halide (for example, AuF, AuCl, AuBr, AuI, etc.).

Examples of the post-transition metal halide are zinc halide (for example, $ZnF_2$, $ZnCl_2$, $ZnBr_2$, $ZnI_2$, etc.), indium halide (for example, $InI_3$, etc.), and tin halide (for example, $SnI_2$, etc.).

Examples of the lanthanide metal halide are YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

An example of the metalloid halide is antimony halide (for example, $SbCl_5$, etc.).

Examples of the metal telluride are alkali metal telluride (for example, $Li_2Te$, $Na_2Te$, $K_2Te$, $Rb_2Te$, $Cs_2Te$, etc.), alkaline earth metal telluride (for example, BeTe, MgTe, CaTe, SrTe, BaTe, etc.), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, $Au_2Te$, etc.), post-transition metal telluride (for example, ZnTe, etc.), and lanthanide metal telluride (for example, LaTe, CeTe, PrTe, NdTe, PmTe, EuTe, GdTe, TbTe, DyTe, HoTe, ErTe, TmTe, YbTe, LuTe, etc.).

Emission Layers 153-1, 153-2, and 153-3

When the light-emitting device 10 is a full-color light-emitting device, the emission layers 153-1, 153-2, and 153-3 may be patterned into a red emission layer, a green emission layer, and/or a blue emission layer, according to a subpixel. In one or more embodiments, the emission layers 153-1, 153-2, and 153-3 may have a stacked structure of two or more layers of a red emission layer, a green emission layer, and a blue emission layer, in which the two or more layers contact (e.g., physically contact) each other or are separated from each other. In one or more embodiments, the emission layers may include two or more materials of a red light-emitting material, a green light-emitting material, and a blue light-emitting material, in which the two or more materials are mixed with each other in a single layer to emit white light.

The emission layer 153-1, 153-2, and 153-3 may include a host and a dopant. The dopant may include a phosphorescent dopant, a fluorescent dopant, or any combination thereof.

In an embodiment, at least one of the emission layers 153-1, 153-2, and 153-3 includes two emission layers, and the two emission layers may directly contact (e.g., physically contact) each other.

For example, one of the two emission layers may include a first host and a fluorescent dopant, and the other may include a second host and a phosphorescent dopant. The first host and the second host are each the same as described in connection with a host to be described herein below, and the fluorescent dopant and the phosphorescent dopant will each be described in more detail herein below.

The amount of the dopant in the emission layers 153-1, 153-2, and 153-3 may be from about 0.01 parts by weight to about 15 parts by weight based on 100 parts by weight of the host.

In an embodiment, the emission layers 153-1, 153-2, and 153-3 may include a quantum dot.

In an embodiment, the emission layers 153-1, 153-2, and 153-3 may include a delayed fluorescence material. The delayed fluorescence material may act as a host or a dopant in the emission layer.

A thickness of the emission layers 153-1, 153-2, and 153-3 may be in a range of about 100 Å to about 1,000 Å, for example, about 200 Å to about 600 Å. When the thickness of the emission layer is within these ranges, excellent light-emission characteristics may be obtained without a substantial increase in driving voltage.

Host

In one or more embodiments, the host may include a compound represented by Formula 301 below:

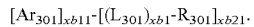

Formula 301

In Formula 301, $Ar_{301}$ and $L_{301}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, xb1 may be an integer from 0 to 5, $R_{301}$ may be hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{301}$)($Q_{302}$)($Q_{303}$), —N($Q_{301}$)($Q_{302}$), —B($Q_{301}$)($Q_{302}$), —C(=O)($Q_{301}$), —S(=O)$_2$($Q_{301}$), or —P(=O)($Q_{301}$)($Q_{302}$), xb21 may be an integer from 1 to 5, and $Q_{301}$ to $Q_{303}$ are the same as described in connection with $Q_1$.

For example, xb11 in Formula 301 is 2 or more, two or more of $Ar_{301}$(s) may be linked to each other via a single bond.

In an embodiment, the host may include a compound represented by Formula 301-1, a compound represented by Formula 301-2, or any combination thereof:

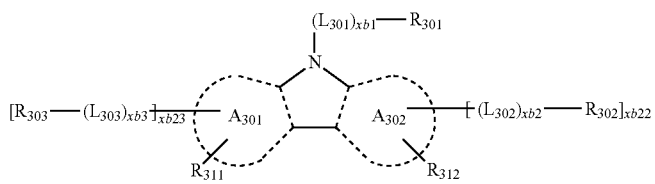

Formula 301-1

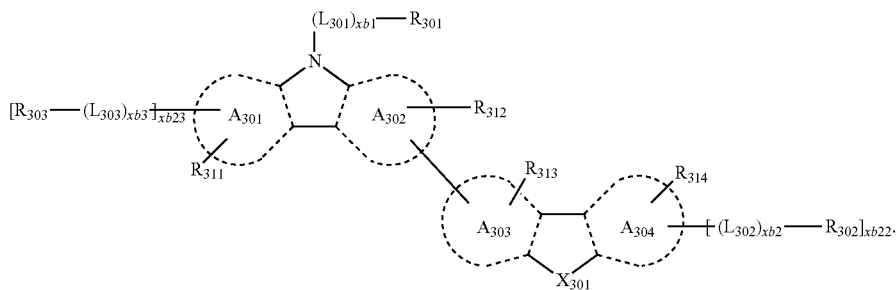

Formula 301-2

In Formulae 301-1 to 301-2, ring $A_{301}$ to ring $A_{304}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[($L_{304}$)$_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ are the same as described in the present specification, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ are the same as described in connection with $R_{301}$.

In an embodiment, the host may include an alkaline earth-metal complex. In an embodiment, the host may include a Be complex (for example, Compound H55), an Mg complex, a Zn complex, or a combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof, but embodiments of the present disclosure are not limited thereto:
H1
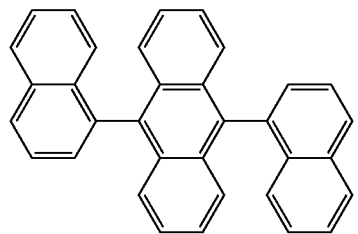
H2
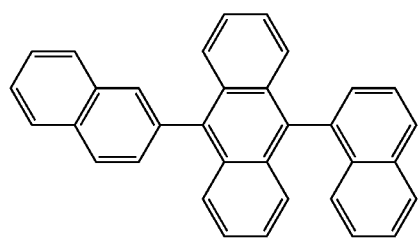
H3
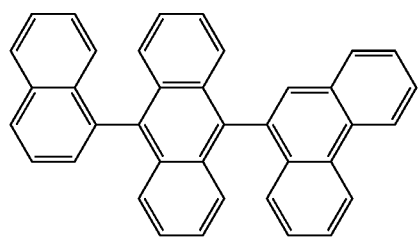
H4
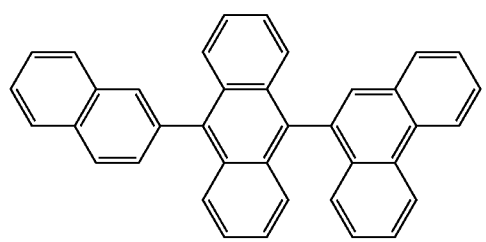
H5
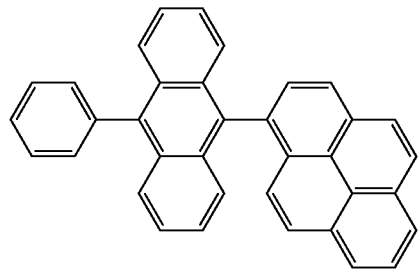
-continued
H6
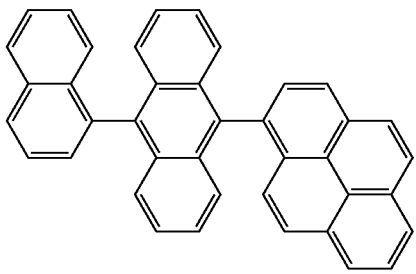
H7
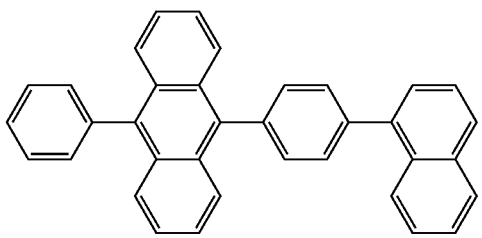
H8
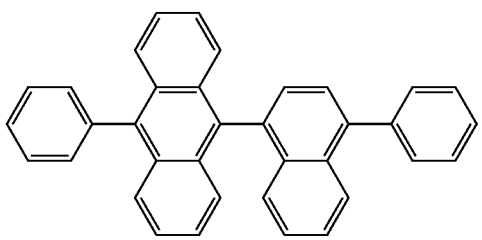
H9
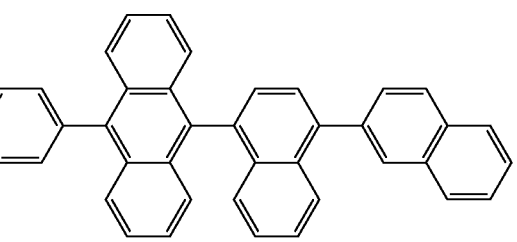
H10
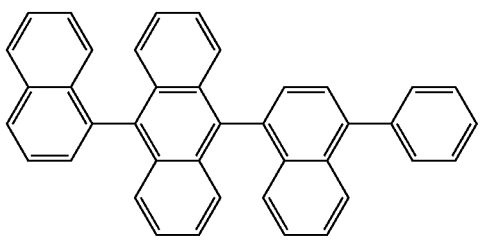
H11
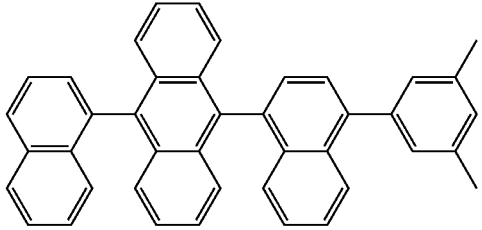

-continued
H12
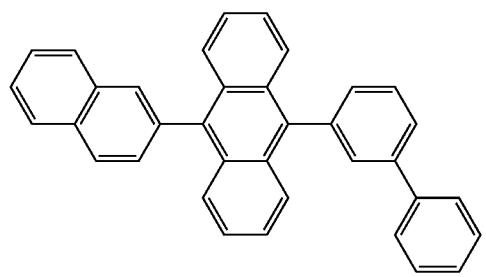
H13
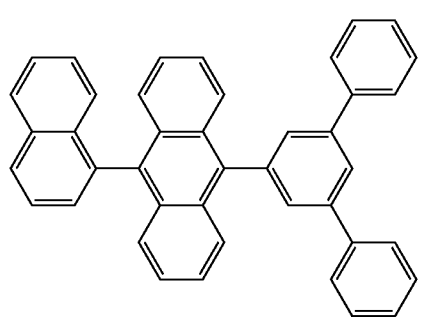
H14
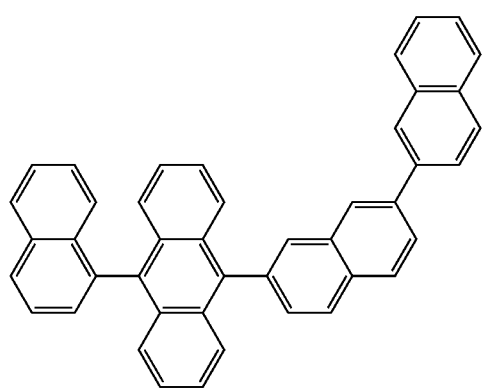
H15
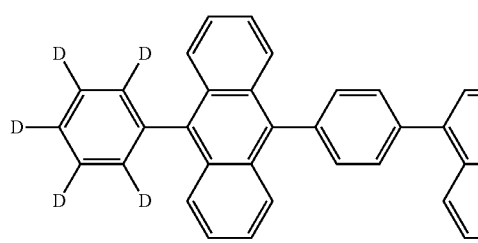
H16
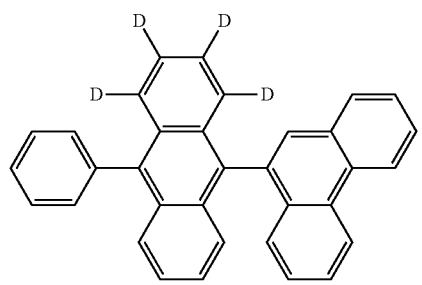
-continued
H17
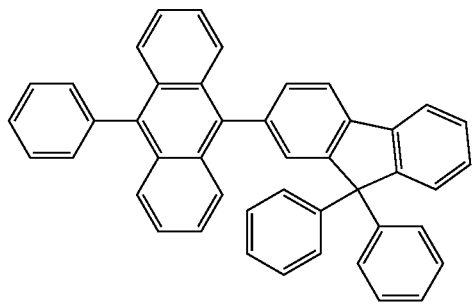
H18
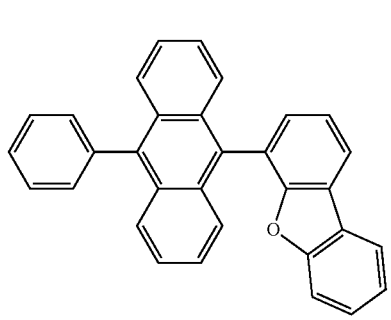
H19
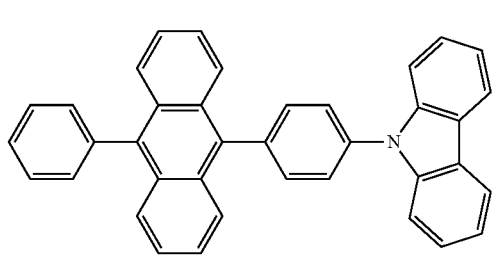
H20
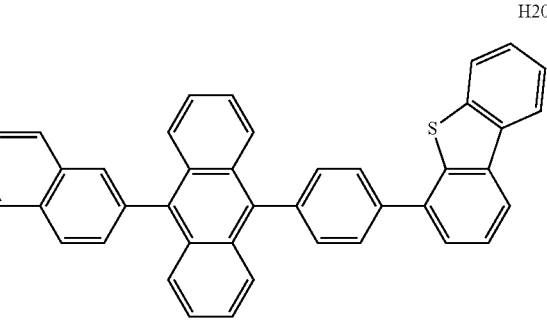
H21
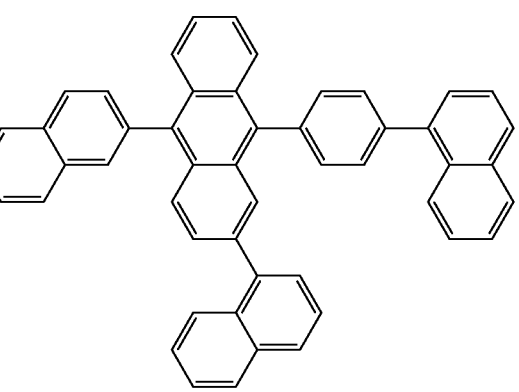

H22
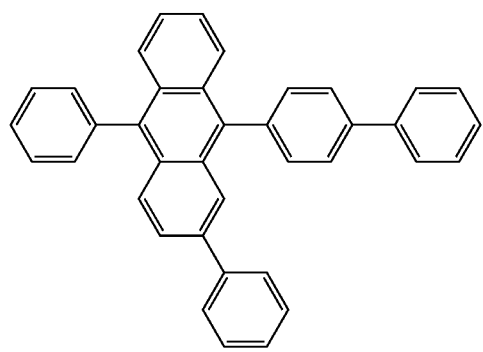
H23
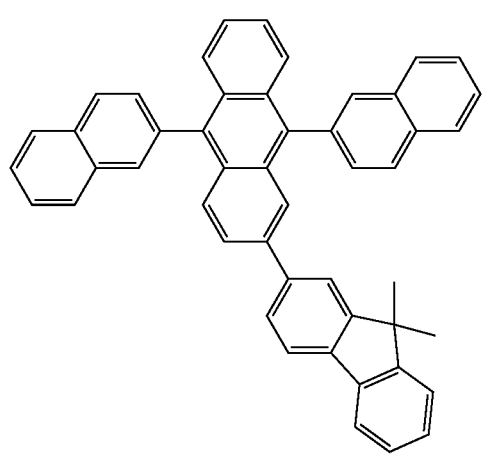
H24
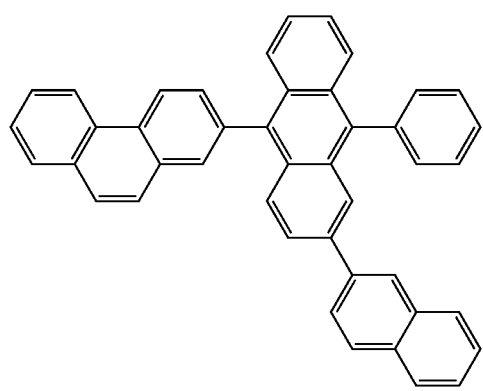
H25
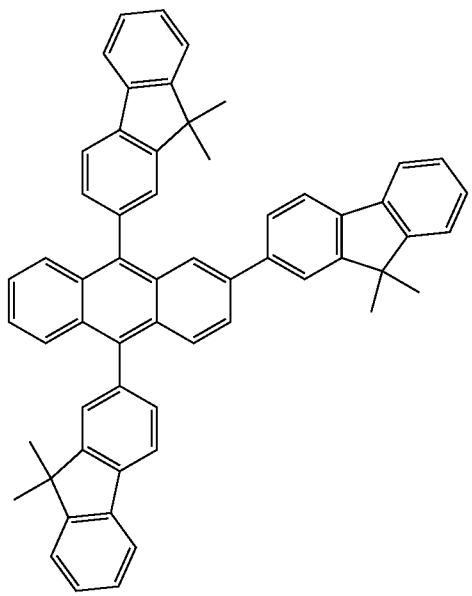
H26
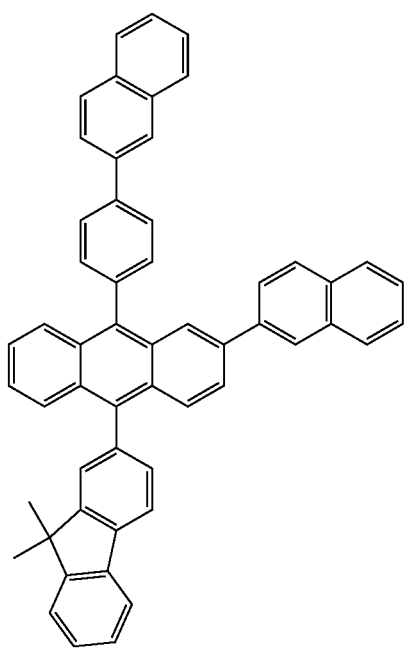

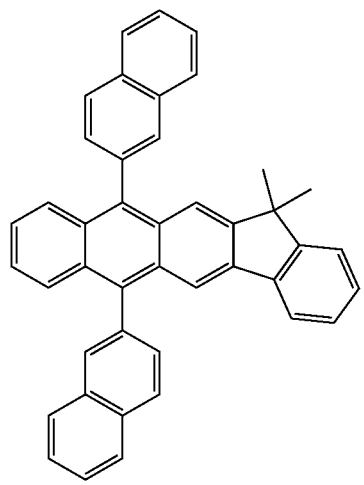
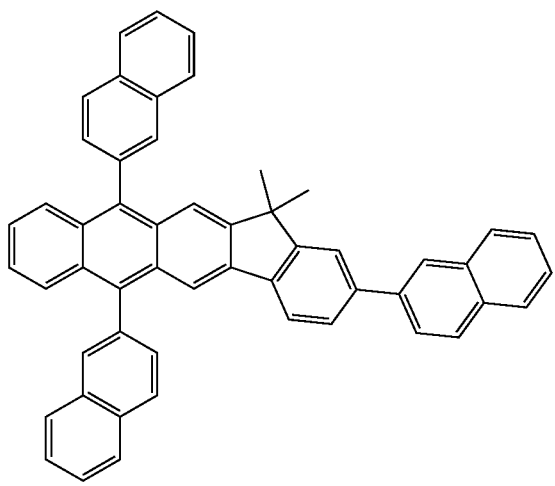
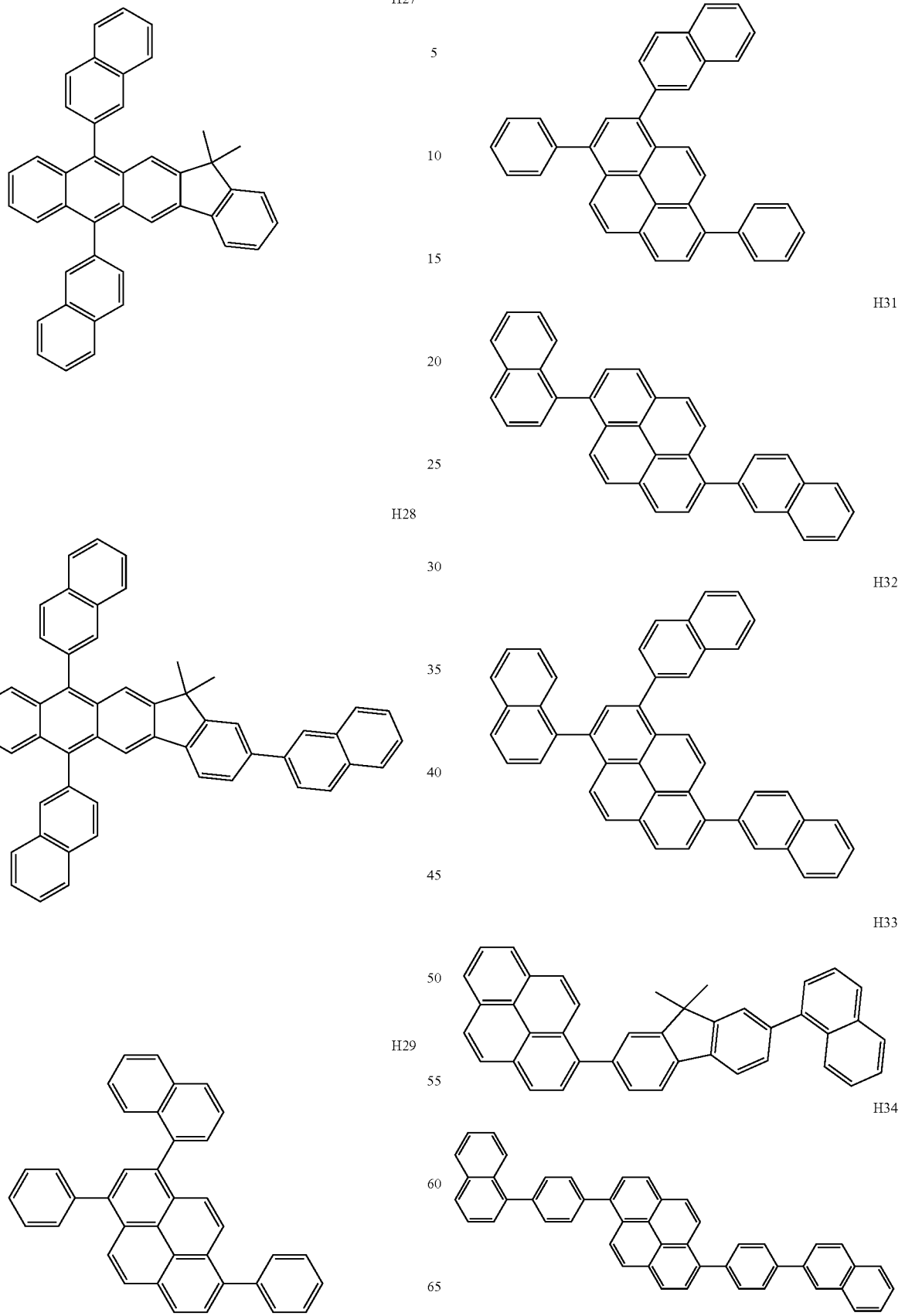
H27
H28
H29
H30
H31
H32
H33
H34

H35
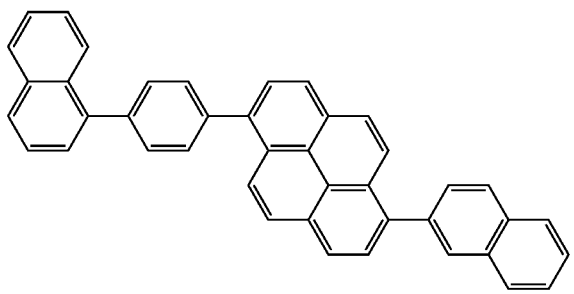
H36
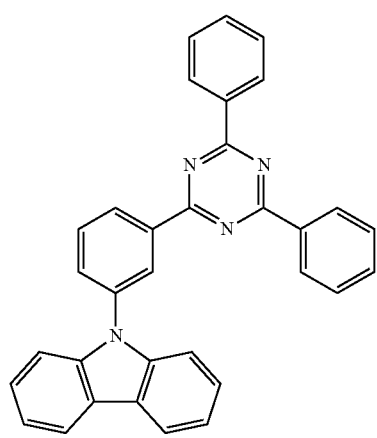
H37
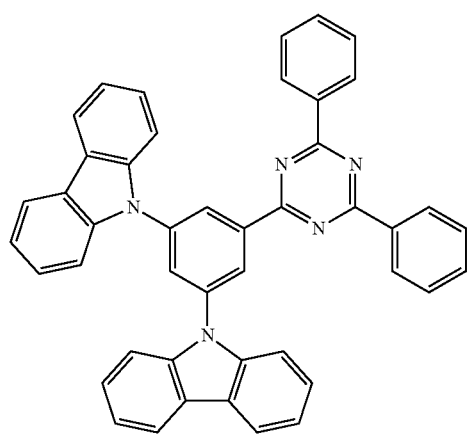
H38
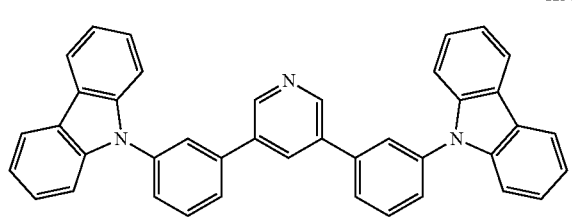
H39
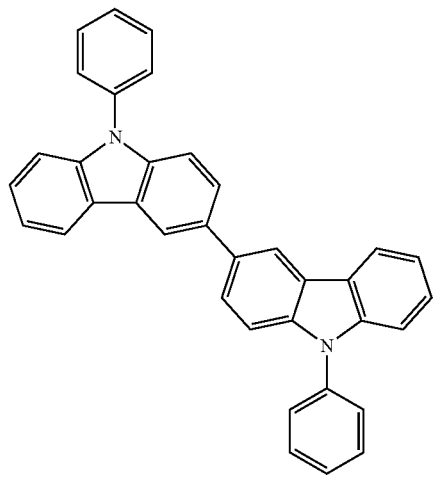
H40
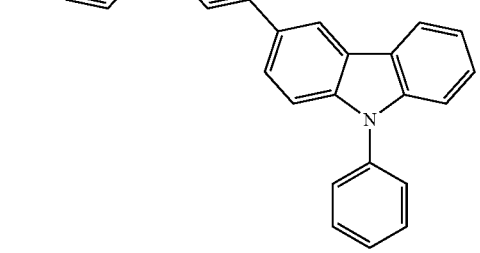
H41

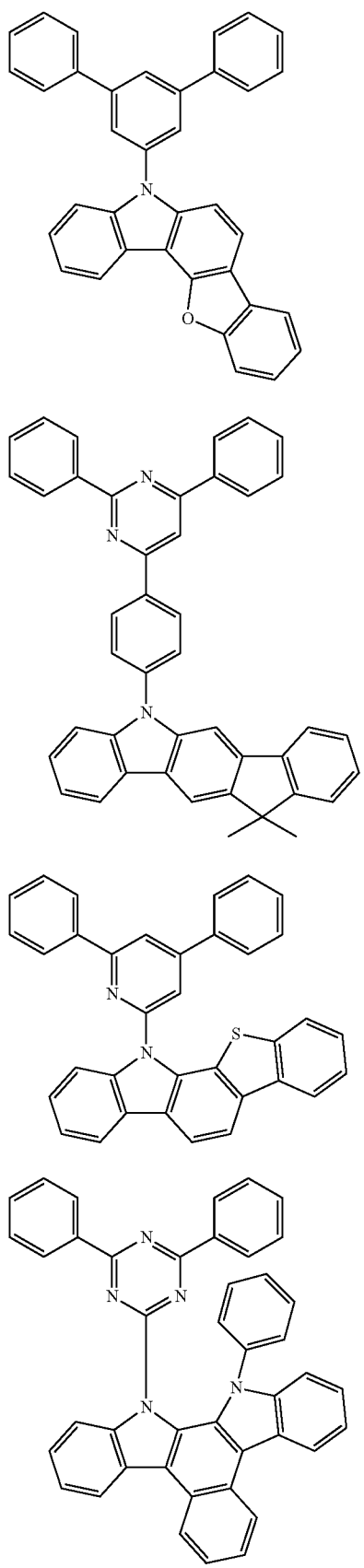
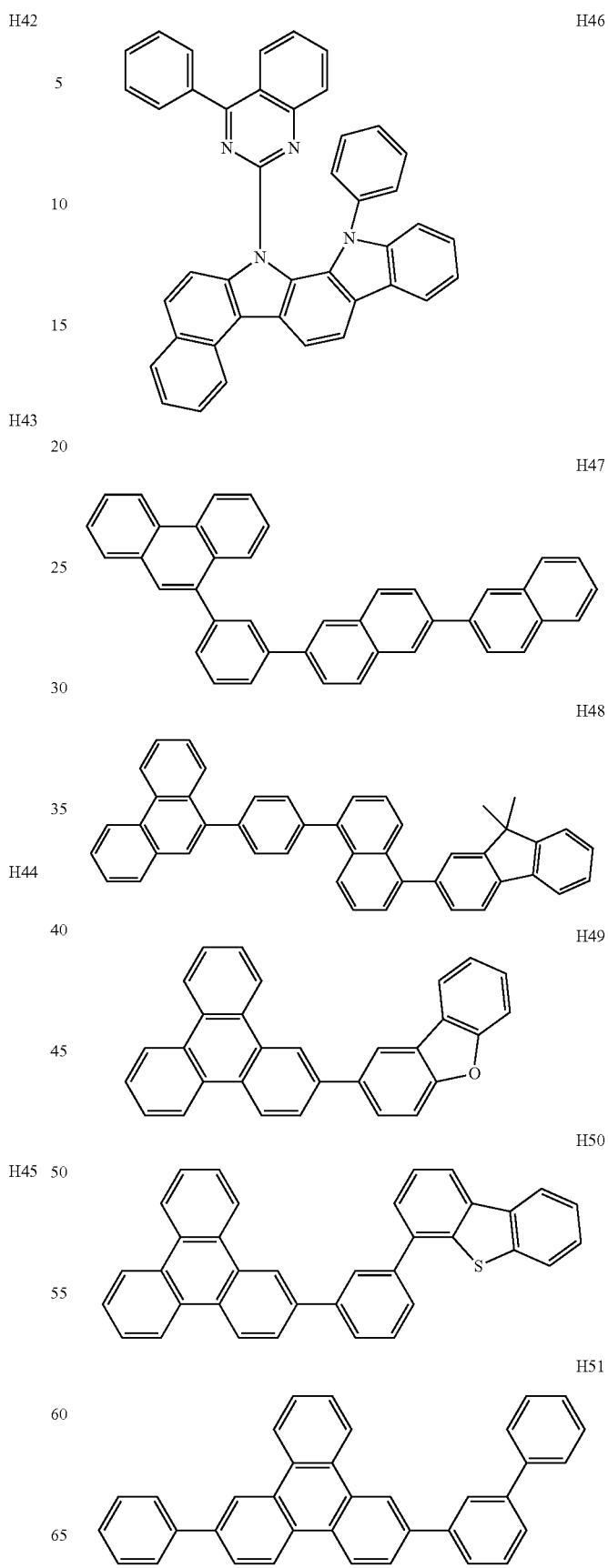

H52
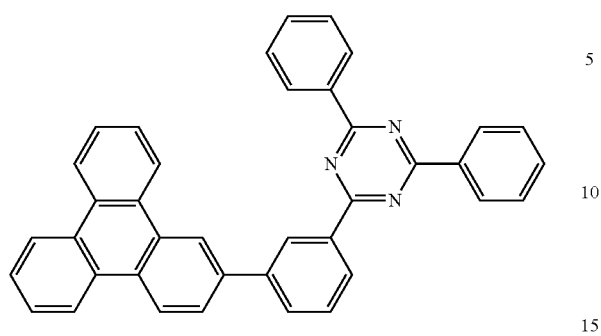
H53
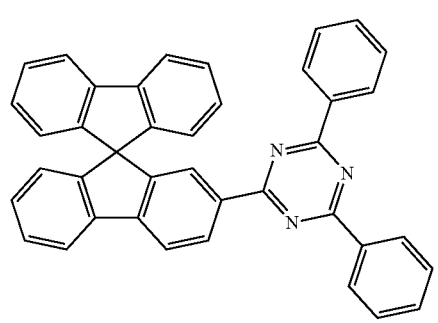
H54
H55
H56
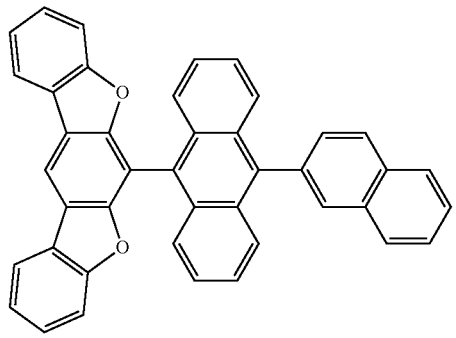
H57
H58
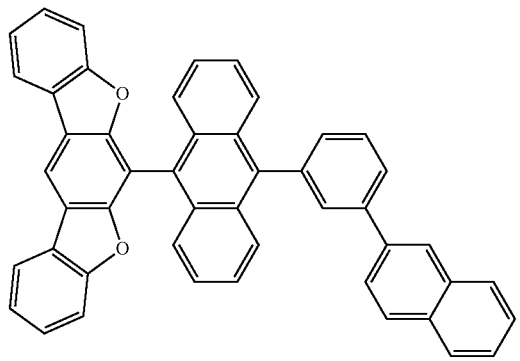
H59
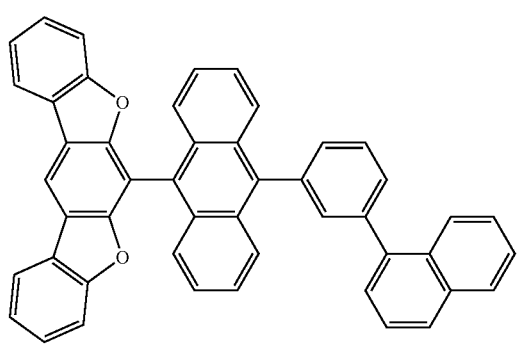

H60
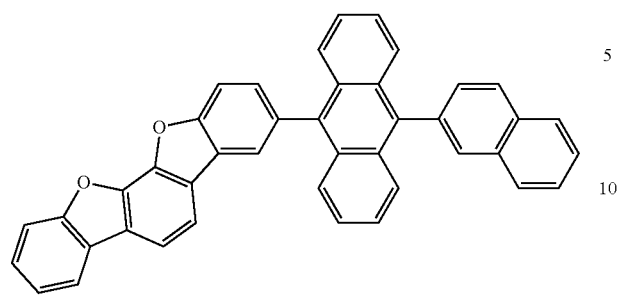
H61
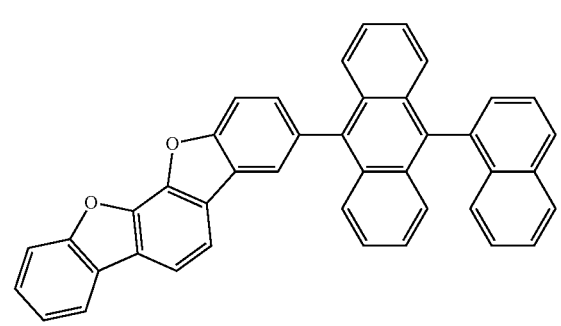
H62
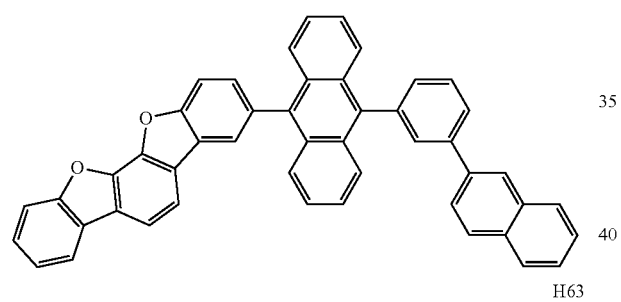
H63
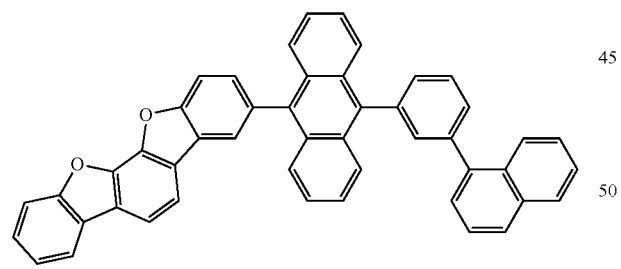
H64
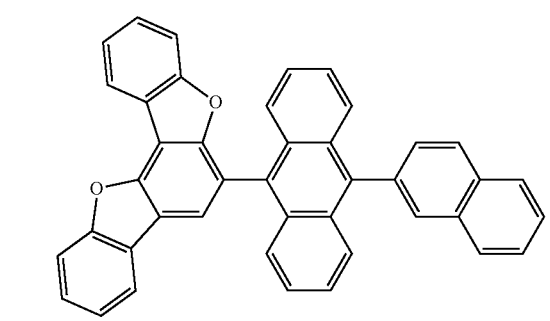
H65
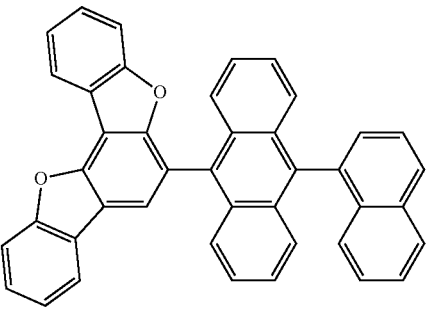
H66
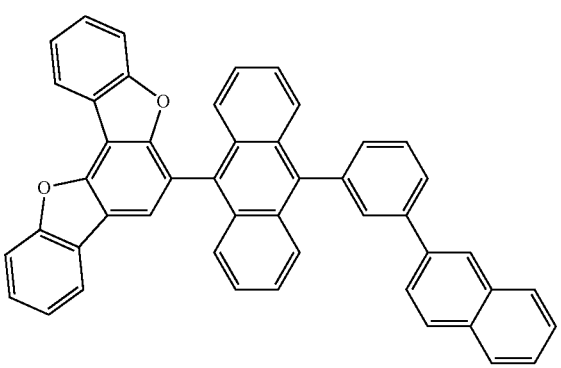
H67
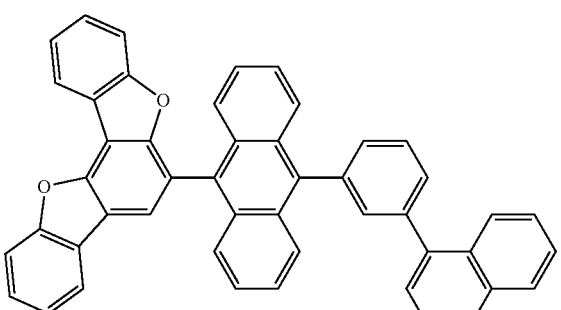
H68
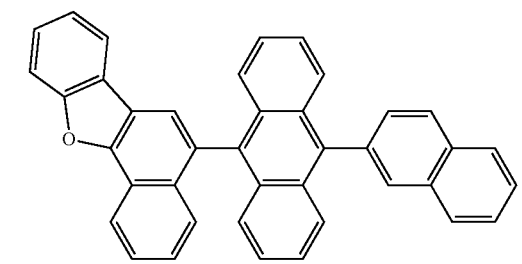
H69
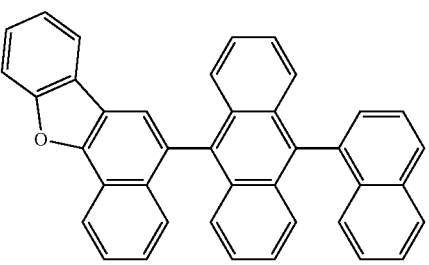

H70
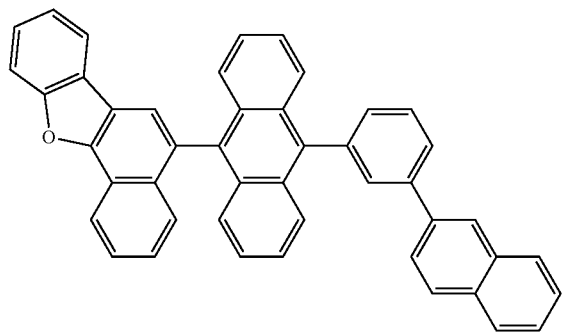
H71
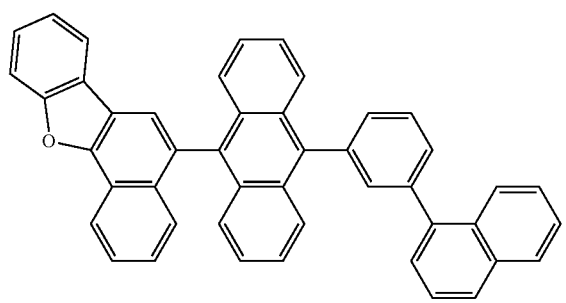
H72
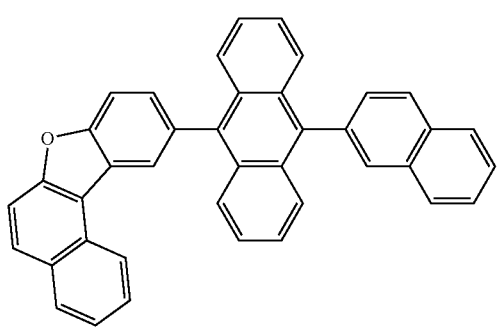
H73
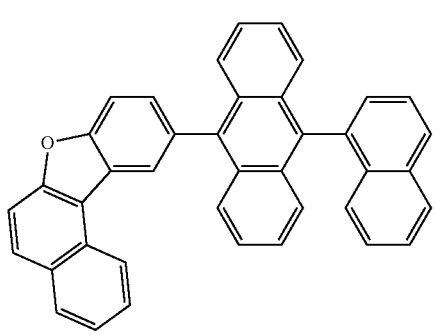
H74
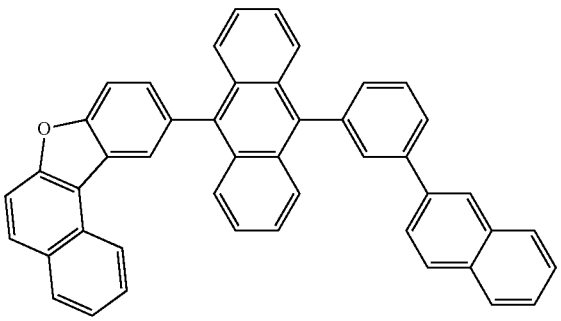
H75
H76
H77
H78
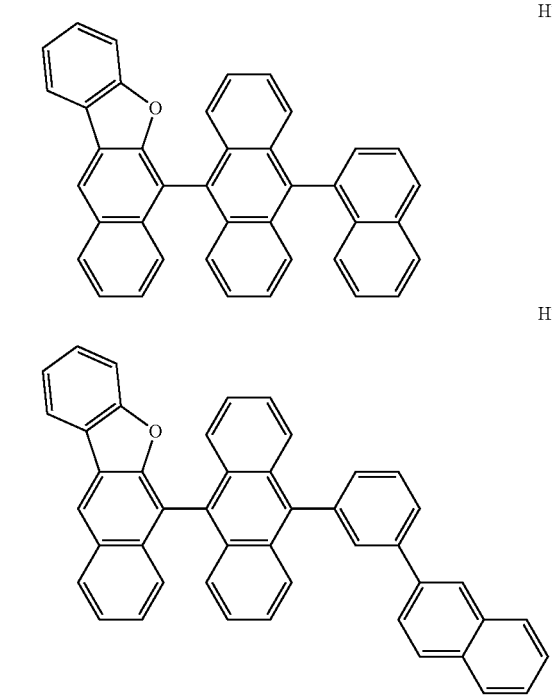

H79
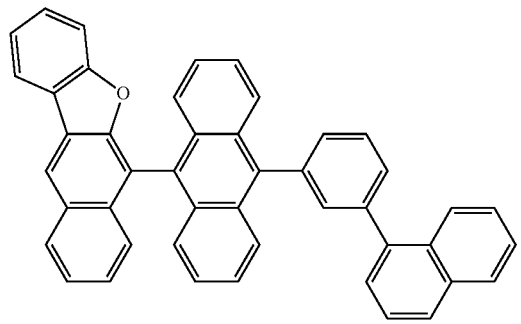
H80
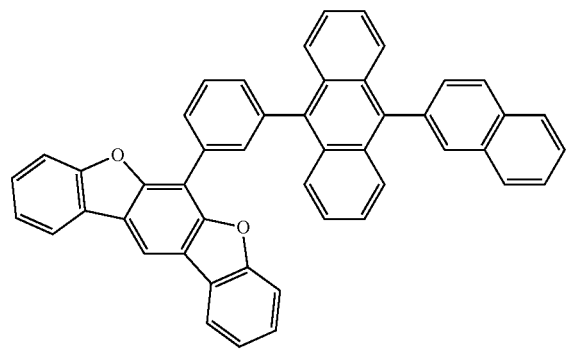
H81
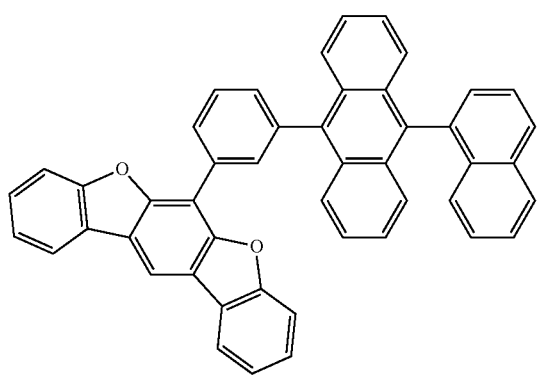
H82
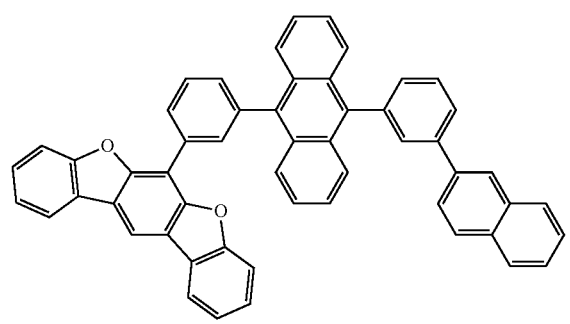
H83
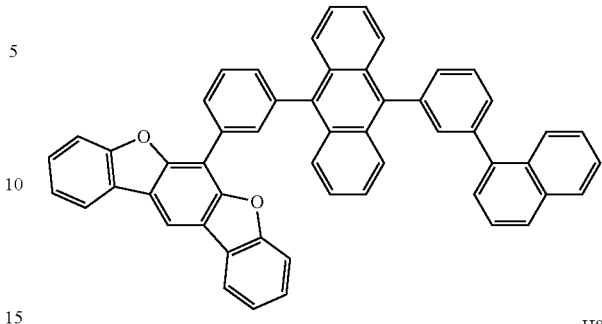
H84
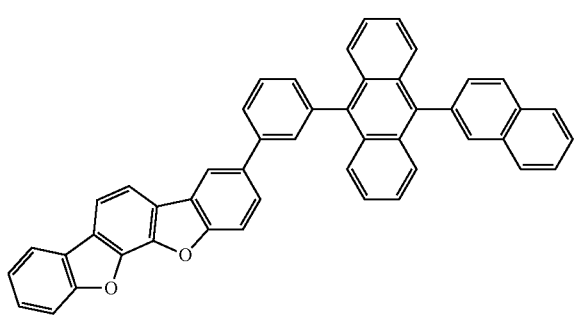
H85
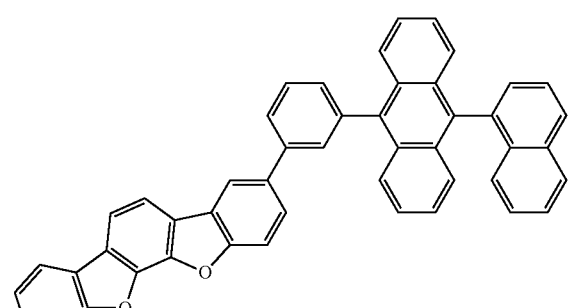
H86
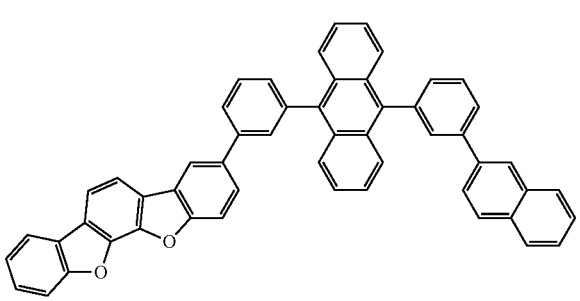
H87
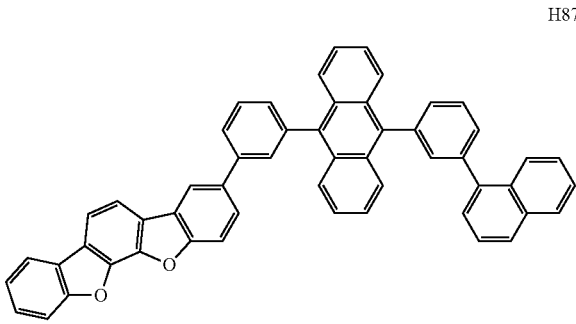

H88
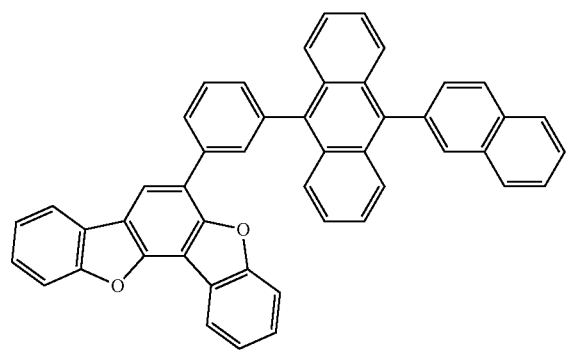
H89
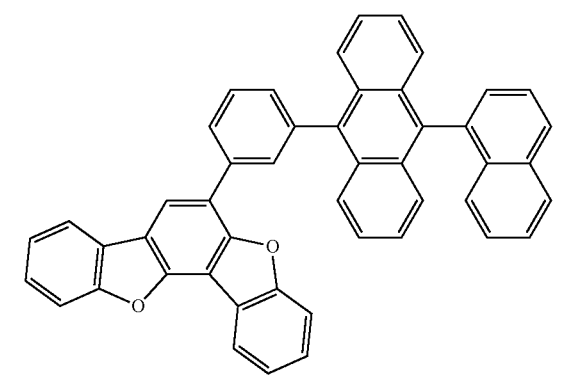
H90
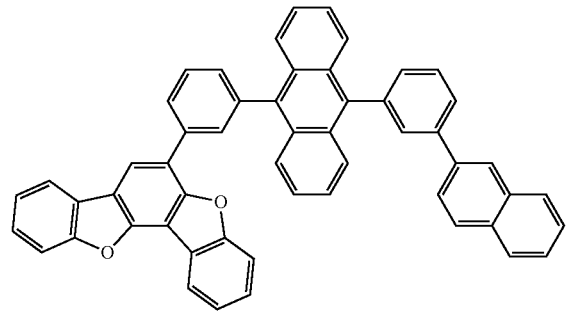
H91
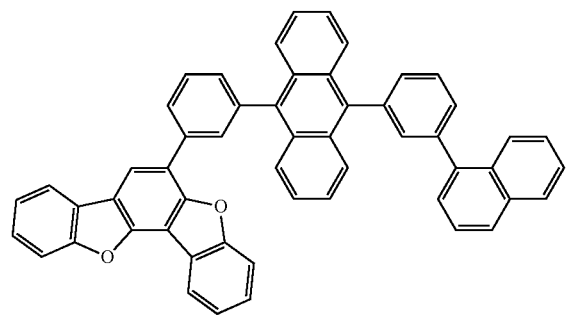
H92
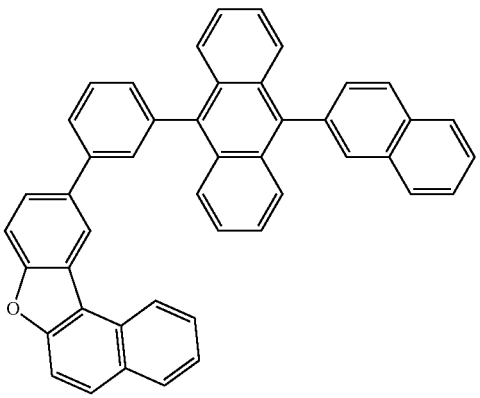
H93
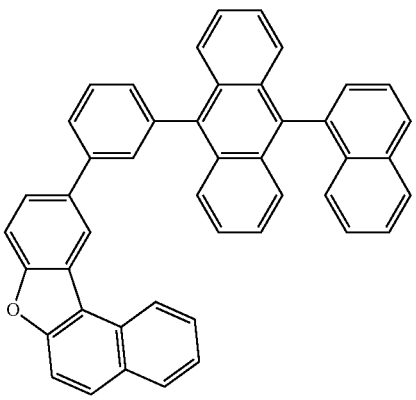
H94
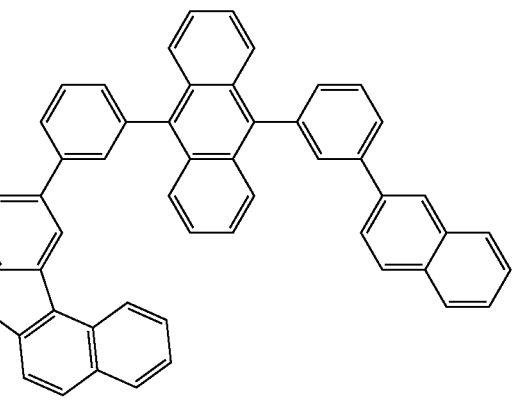
H95
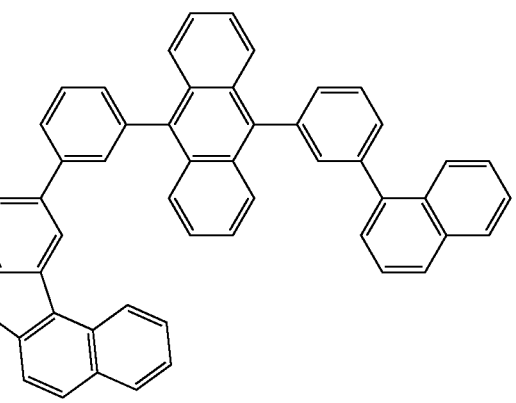

H96
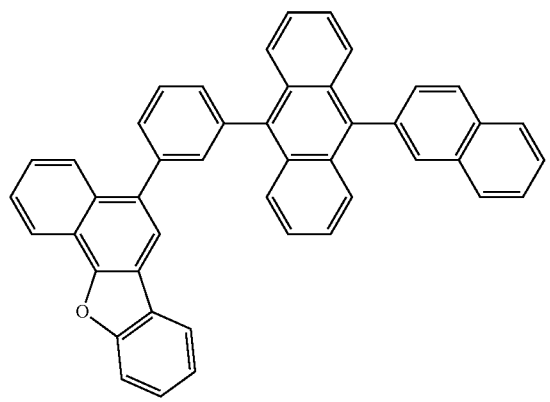
H97
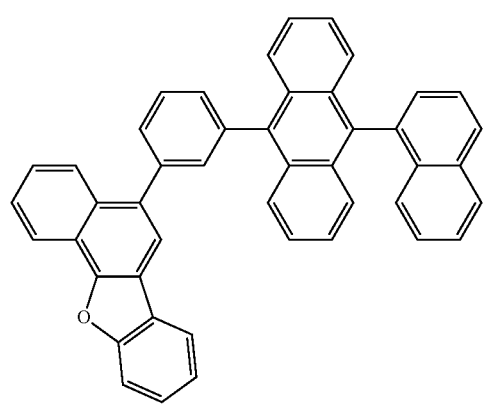
H98
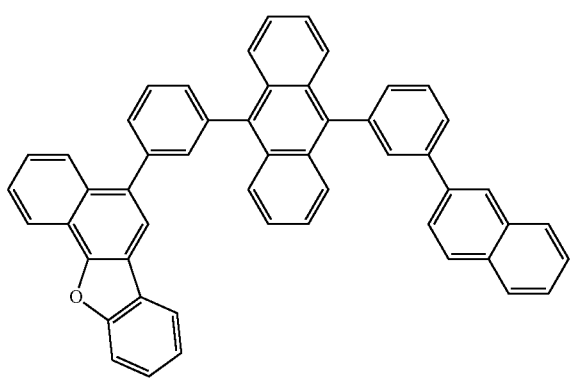
H99
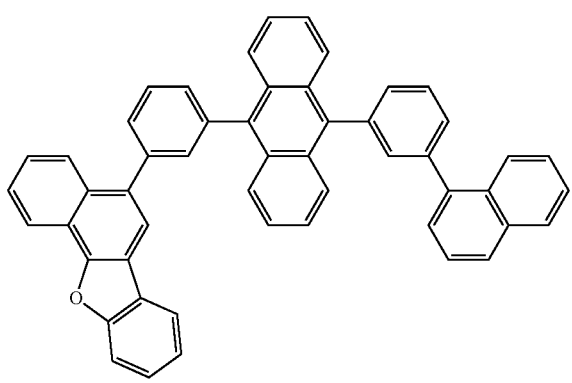
H100
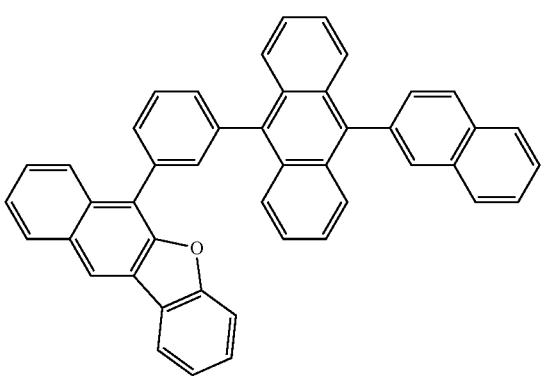
H101
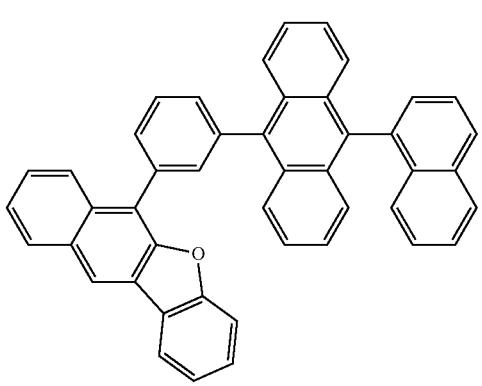
H102
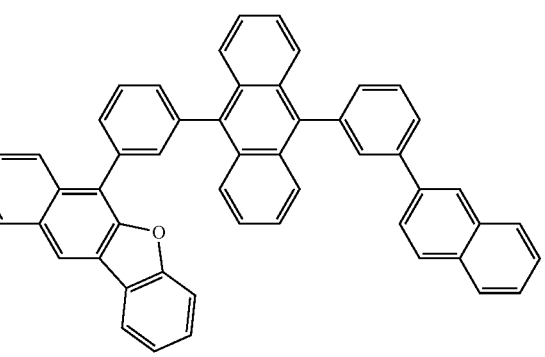
H103
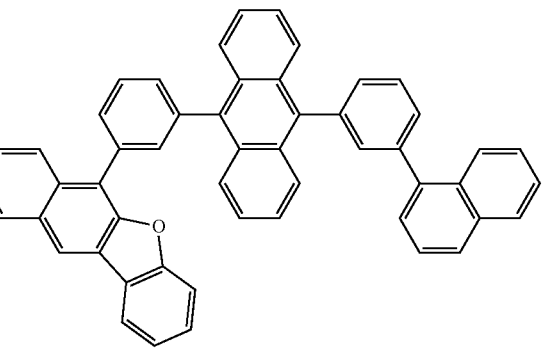

H104
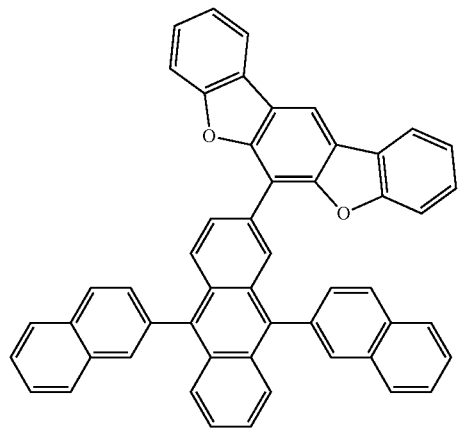
H105
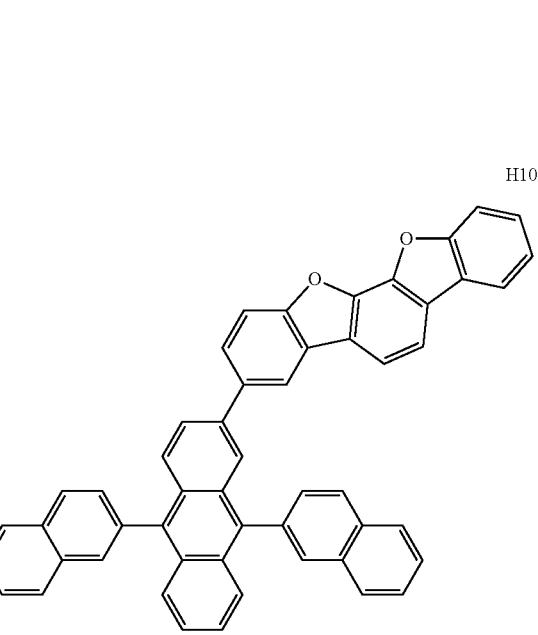
H106
H107
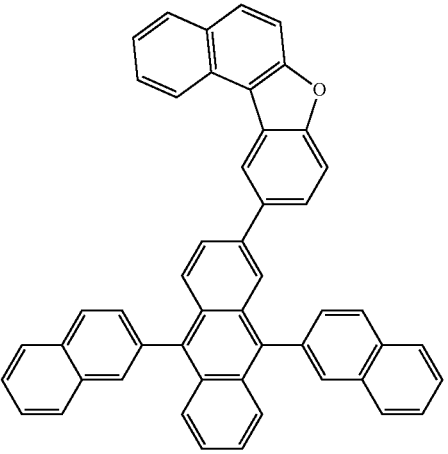
H108
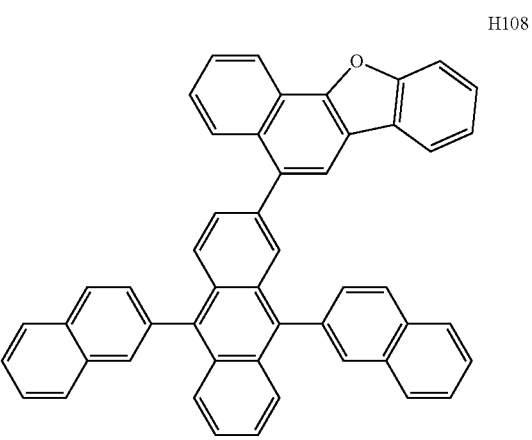
H109
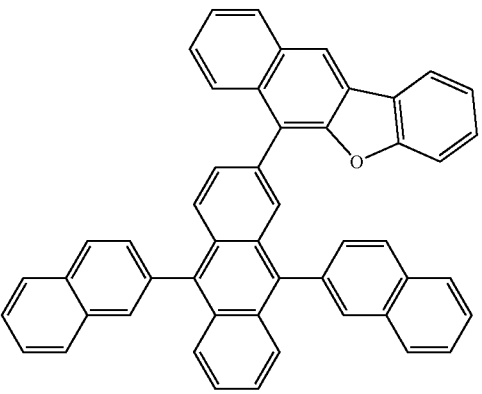
H110
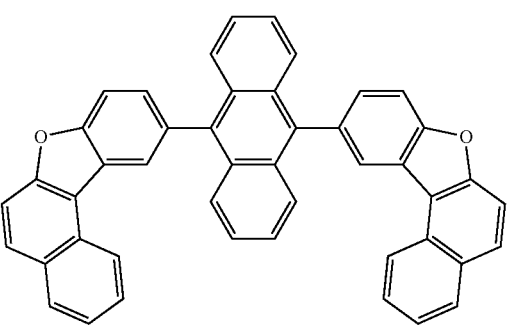

H111
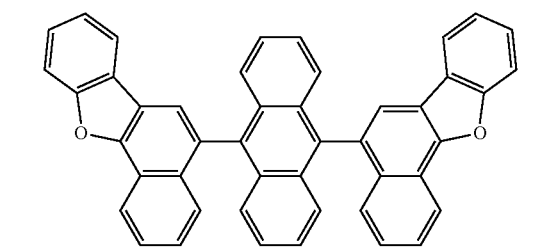
H112
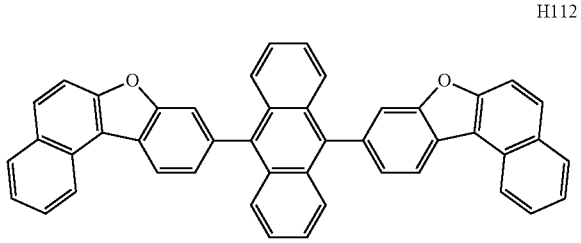
H113
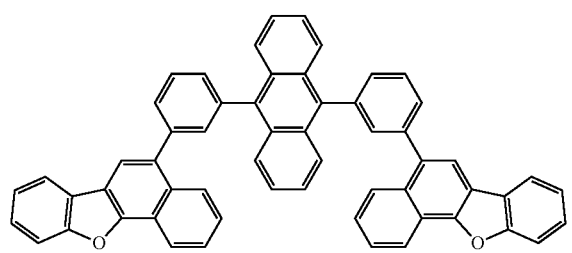
H114
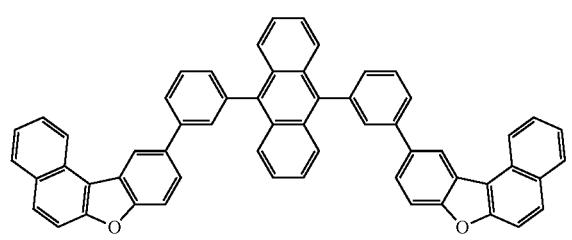
H115
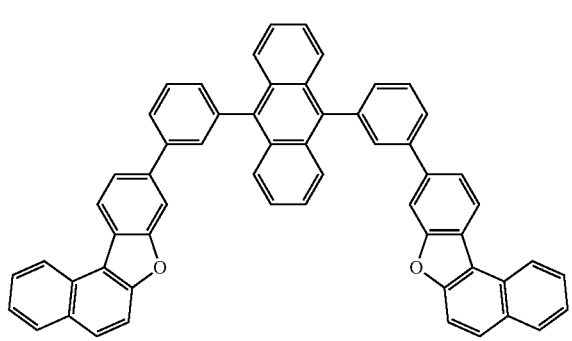
H116
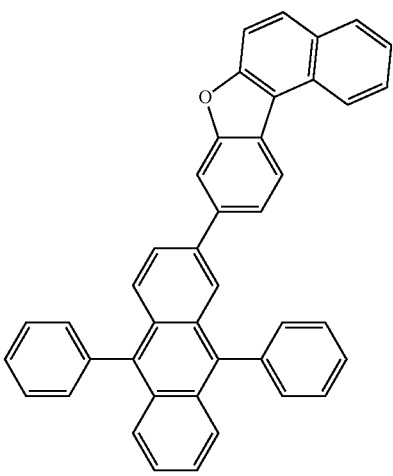
H117
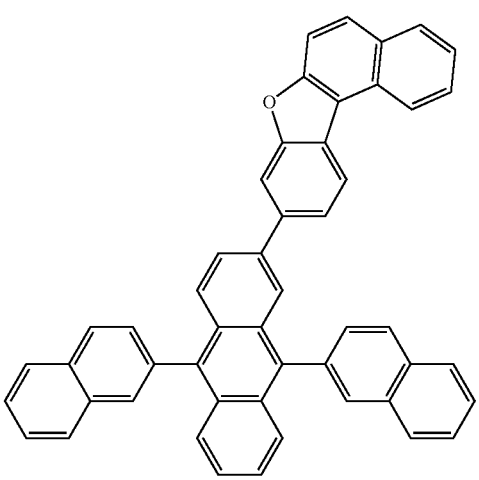
H118
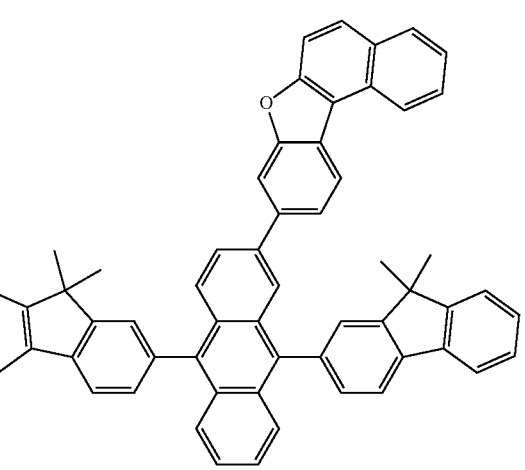

H119

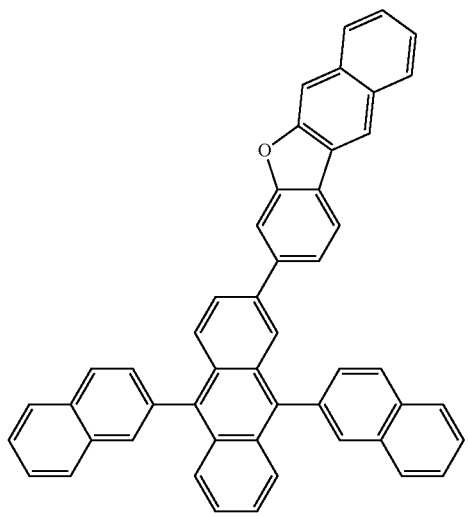

H120

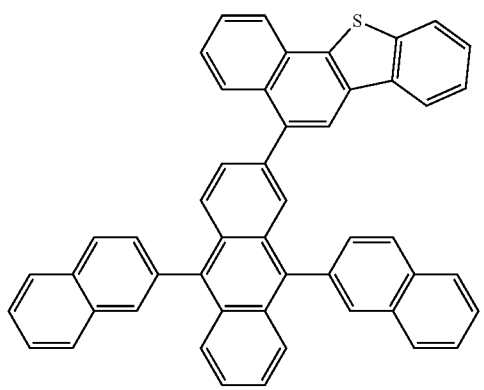

H121

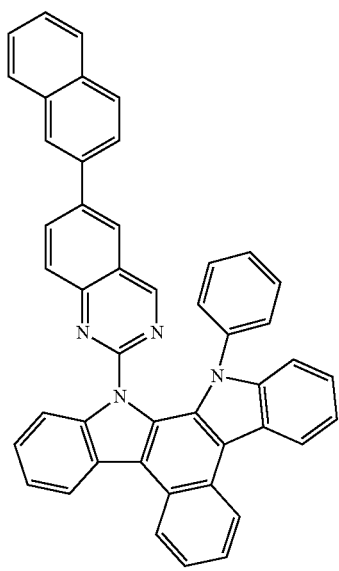

H122

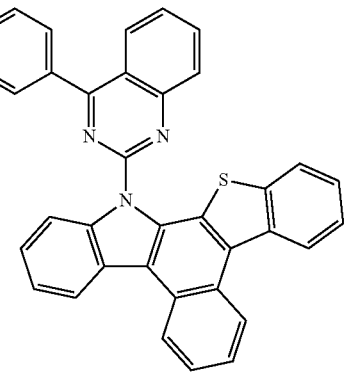

H123

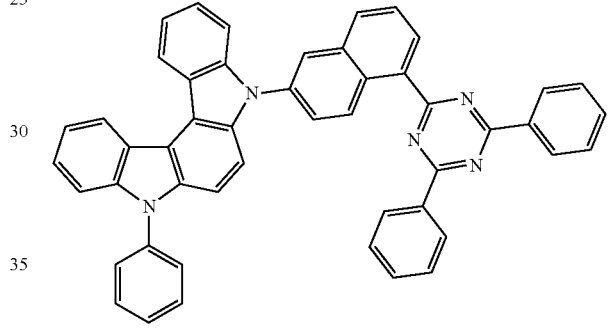

H124

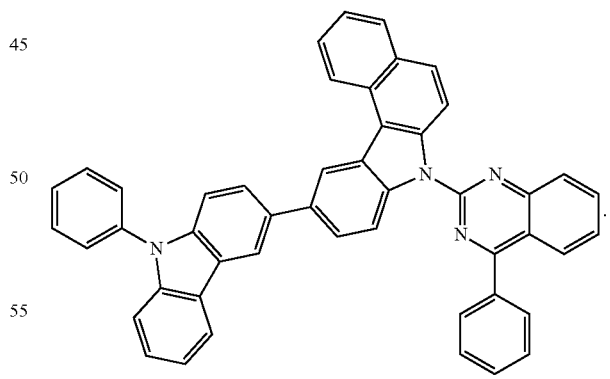

Phosphorescent Dopant

In an embodiment, the phosphorescent dopant may include at least one transition metal as a central metal atom.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

For example, the phosphorescent dopant may include an organometallic compound represented by Formula 401:

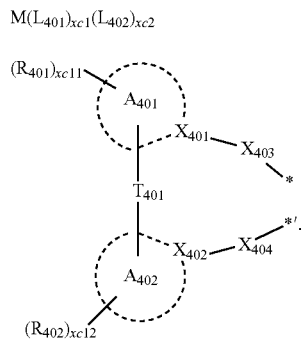

$M(L_{401})_{xc1}(L_{402})_{xc2}$  Formula 401

Formula 402

In Formulae 401 and 402,

M may be transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein when xc1 is two or more, two or more of $L_{401}$(s) may be identical to or different from each other, $L_{402}$ may be an organic ligand, and xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-*', *—C($Q_{411}$)=*', or *=C=*', $X_{403}$ and $X_{404}$ may each independently be a chemical bond (for example, a covalent bond or a coordination bond (e.g., a dative bond or a coordinate covalent bond)), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are the same as described in connection with $Q_1$, xc11 and xc12 may each independently be an integer from 0 to 10, and and *' in Formula 402 each indicate a binding site to M in Formula 401.

For example, in Formula 402, i) $X_{401}$ is nitrogen, and $X_{402}$ is carbon, or ii) each of $X_{401}$ and $X_{402}$ is nitrogen.

In an embodiment, when xc1 in Formula 402 is 2 or more, two ring $A_{401}$ in two or more of $L_{401}$(s) may be optionally linked to each other via $T_{402}$, which is a linking group, and two ring $A_{402}$ may optionally be linked to each other via $T_{403}$, which is a linking group (see Compounds PD1 to PD4 and PD7). $T_{402}$ and $T_{403}$ are the same as described in connection with $T_{401}$.

$L_{402}$ in Formula 401 may be an organic ligand. For example, $L_{402}$ may include a halogen group, a diketone group (for example, an acetylacetonate group), a carboxylic acid group (for example, a picolinate group), —C(=O), an isonitrile group, —CN group, a phosphorus group (for example, a phosphine group, a phosphite group, etc.), or any combination thereof.

The phosphorescent dopant may include, for example, one of compounds PD1 to PD25, or any combination thereof:

PD1

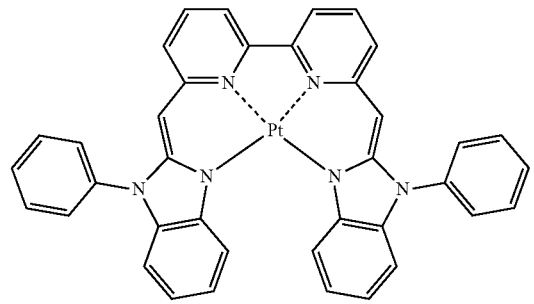

PD2

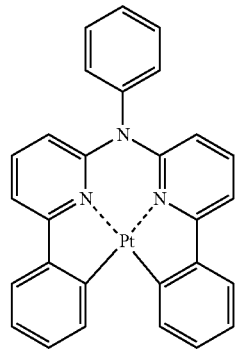

PD3

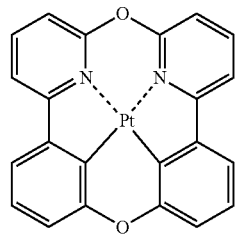

PD4

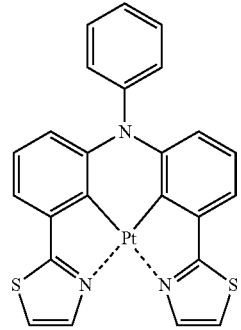

-continued
PD5
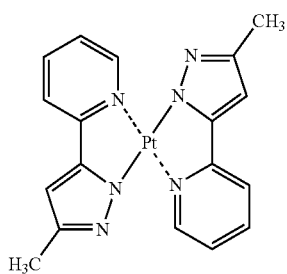
PD6
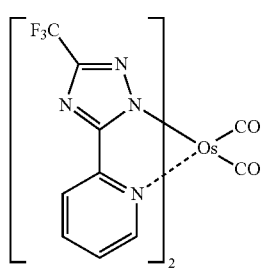
PD7
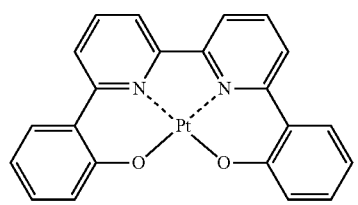
PD8
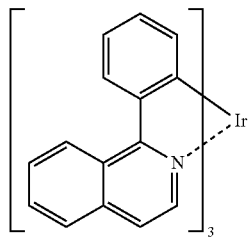
PD9
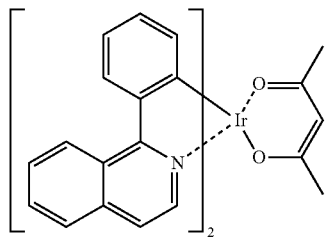
PD10
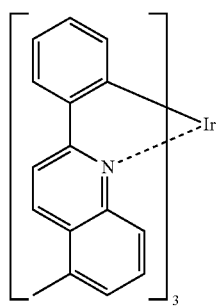
-continued
PD11
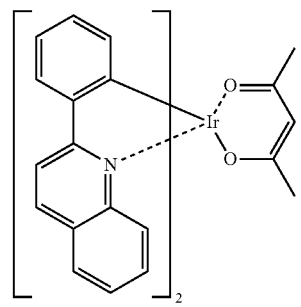
PD12
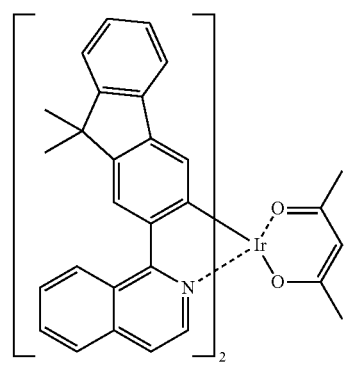
PD13
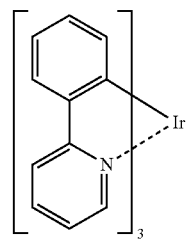
PD14
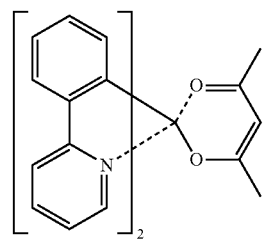
PD15
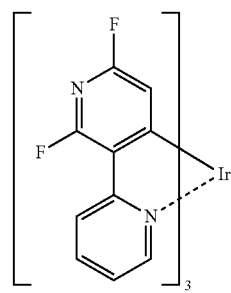

-continued
PD16
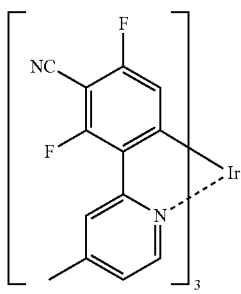
PD17
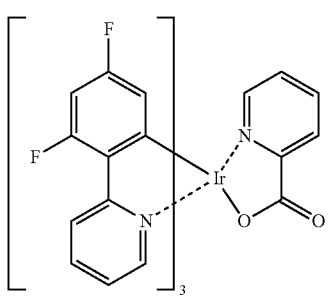
PD18
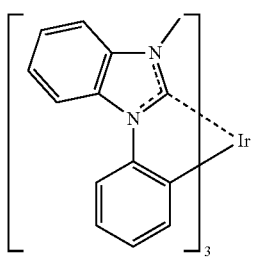
PD19
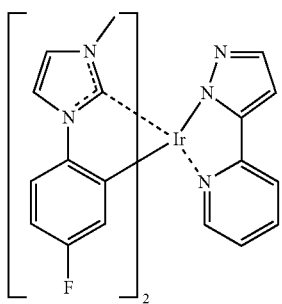
PD20
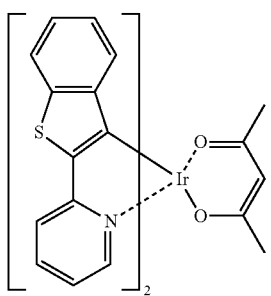
-continued
PD21
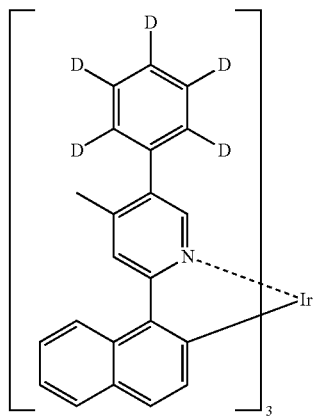
PD22
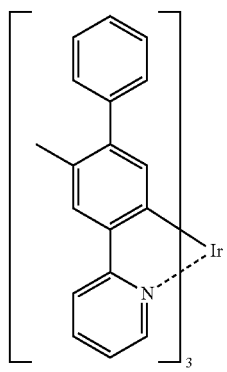
PD23
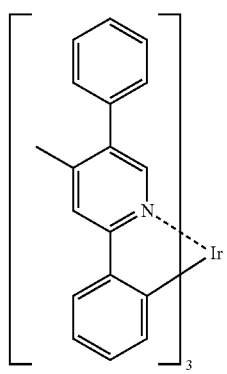
PD24
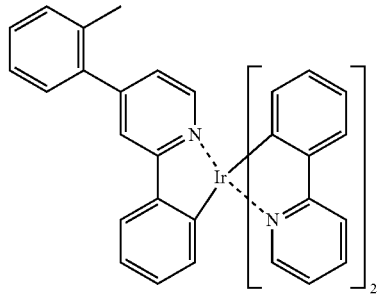

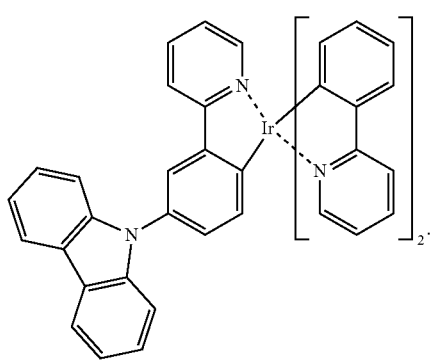

PD25

Fluorescent Dopant

The fluorescent dopant may include an amine group-containing compound, a styryl group-containing compound, or any combination thereof.

In an embodiment, the fluorescent dopant may include a compound represented by Formula 501:

$$Ar_{501}\text{---}[(L_{503})_{xd3}\text{---}N\begin{pmatrix}(L_{501})_{xd1}\text{---}R_{501}\\(L_{502})_{xd2}\text{---}R_{501}\end{pmatrix}]_{xd4}.$$

Formula 501

In Formula 501,
$Ar_{501}$, $L_{501}$ to $L_{503}$, $R_{501}$, and $R_{502}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
xd1 to xd3 may each independently be 0, 1, 2, or 3, and
xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed together (e.g., combined together with each other).

In one or more embodiments, xd4 in Formula 501 may be 2.

In an embodiment, the fluorescent dopant may include: one of Compounds FD1 to FD36; DPVBi; DPAVBi; or any combination thereof:

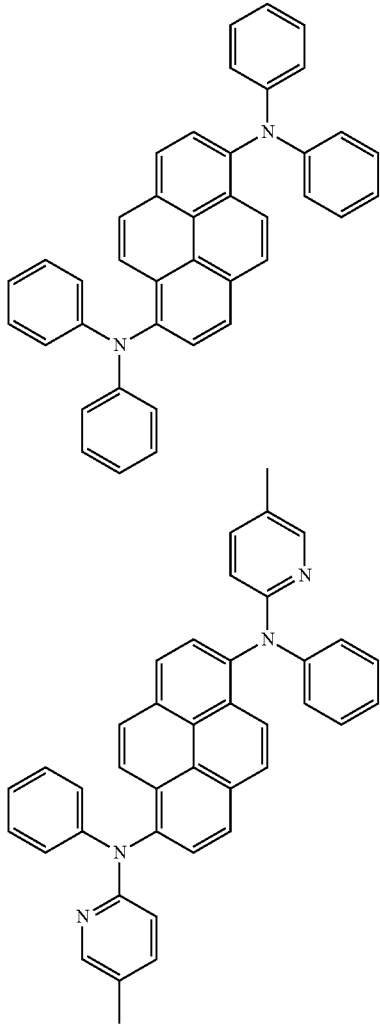

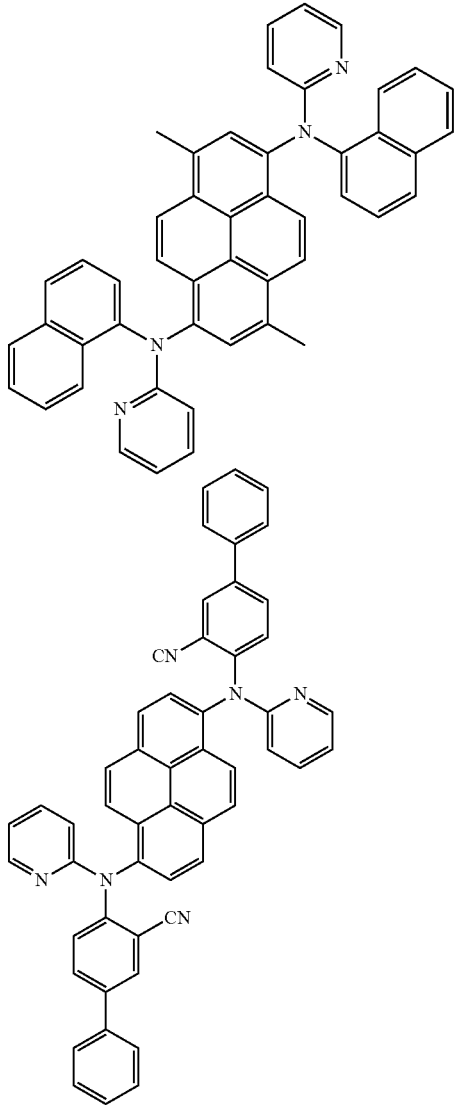

-continued
FD5
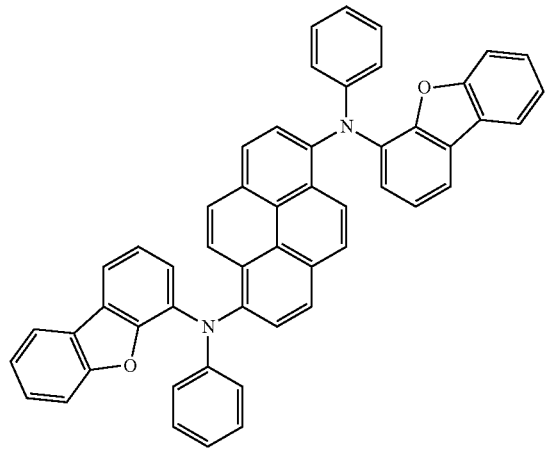
FD6
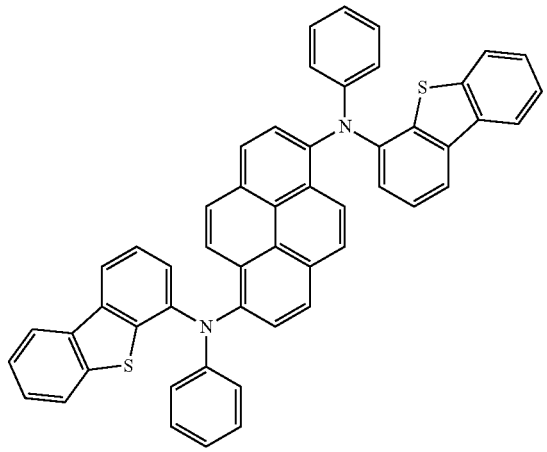
FD7
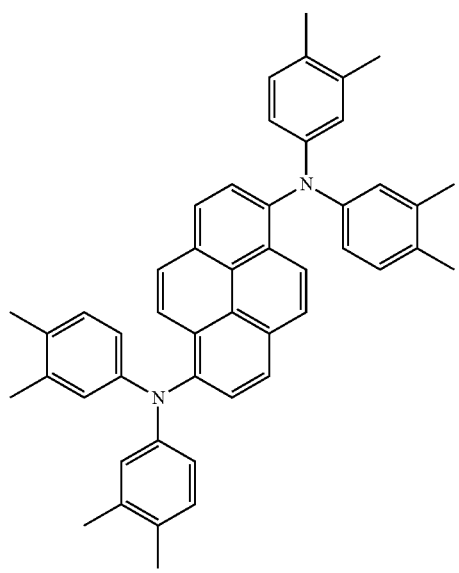
FD8
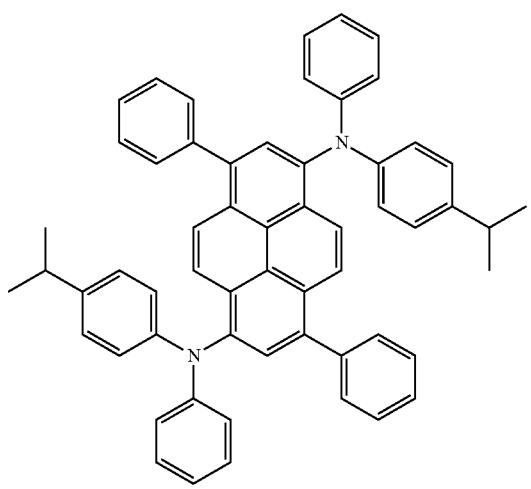
FD9
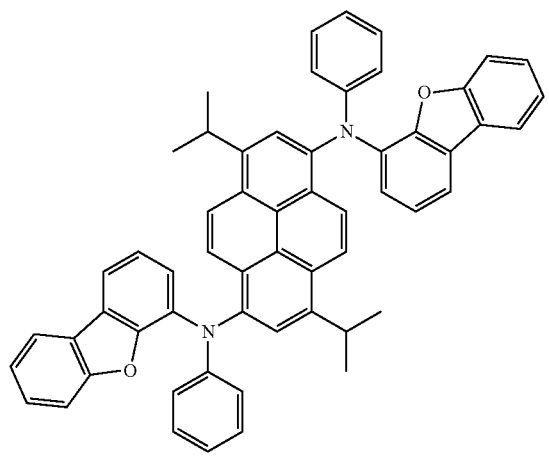
FD10
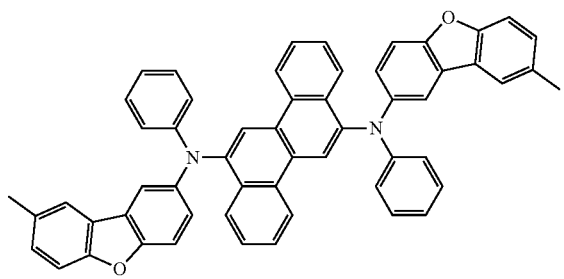

-continued
FD11
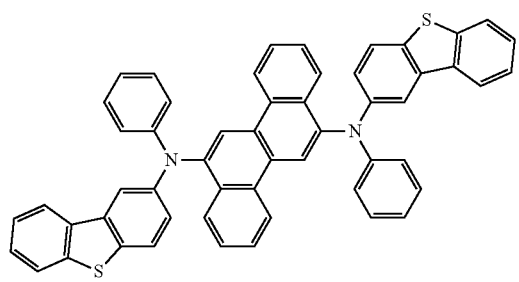
FD12
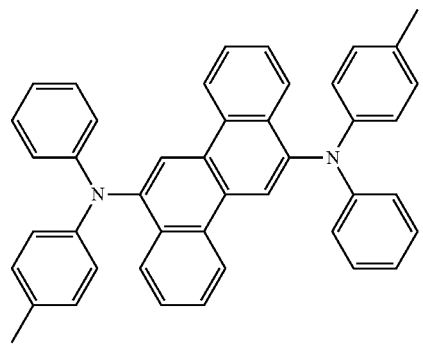
F13
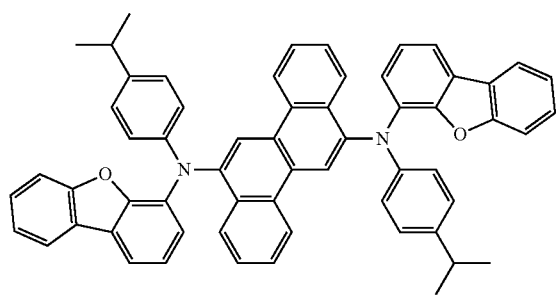
F14
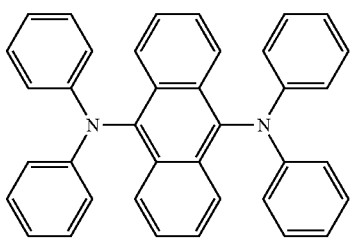
FD15
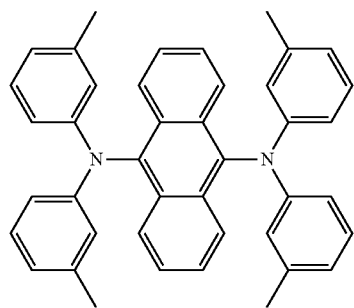
FD16
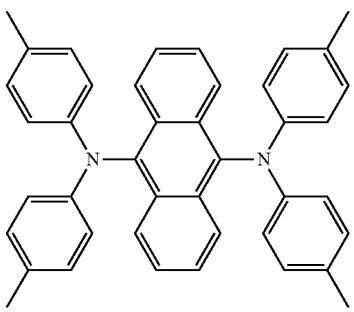
FD17
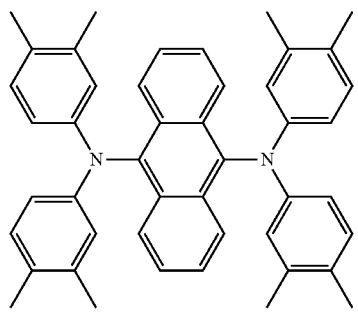
FD18
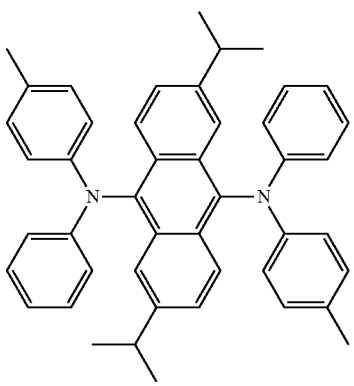

-continued
FD19
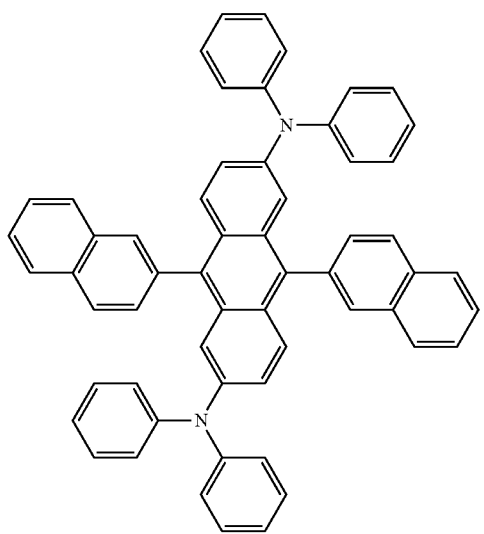
FD20
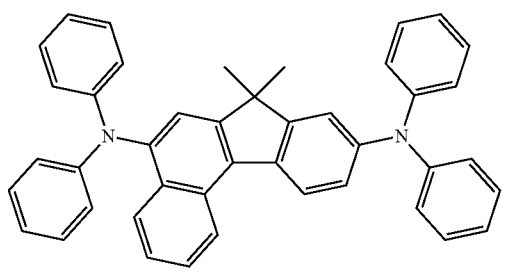
FD21
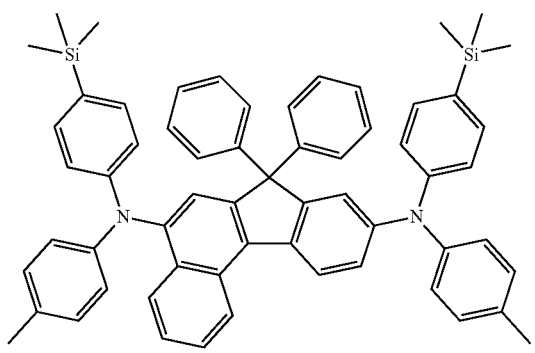
FD22
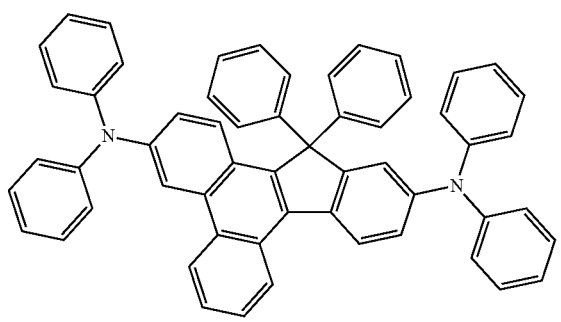
FD23
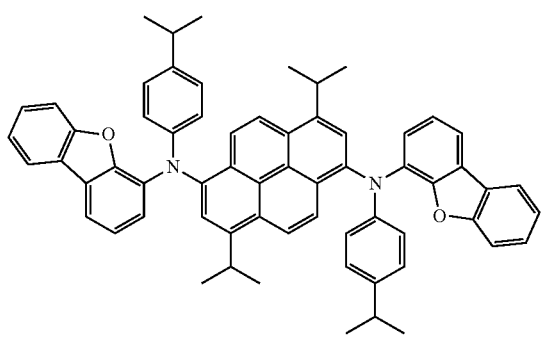
FD24
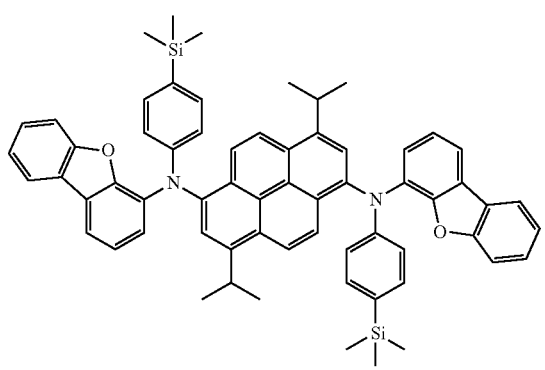

-continued
FD25
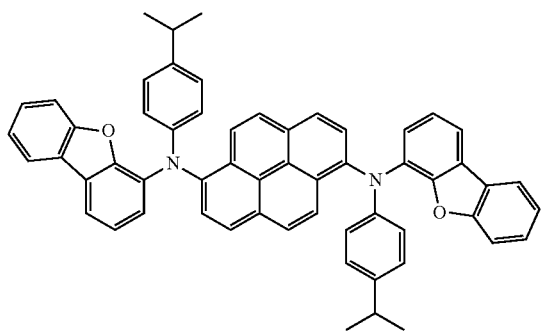
FD26
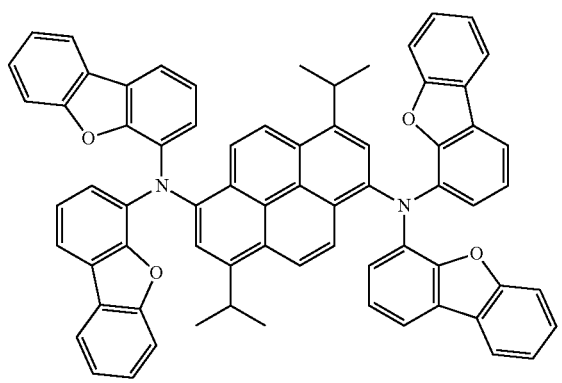
FD27
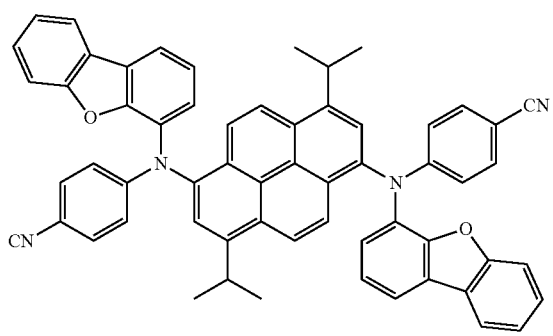
FD28
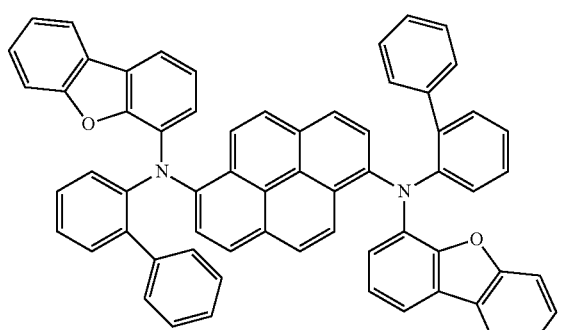
FD29
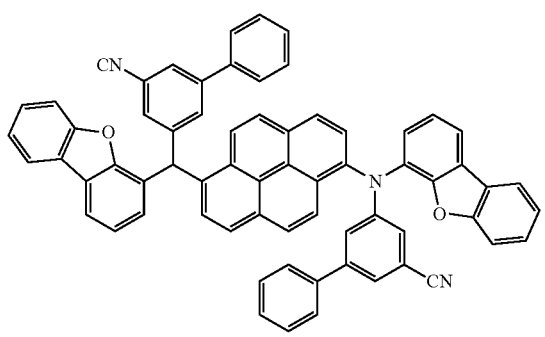
FD30
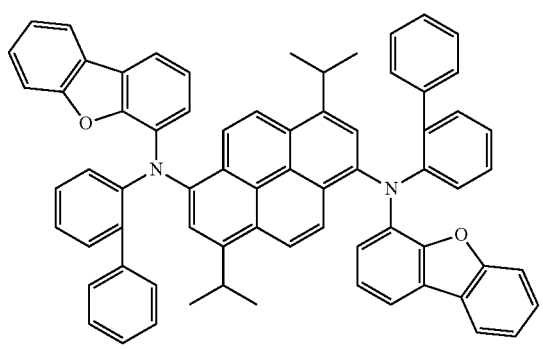
FD31
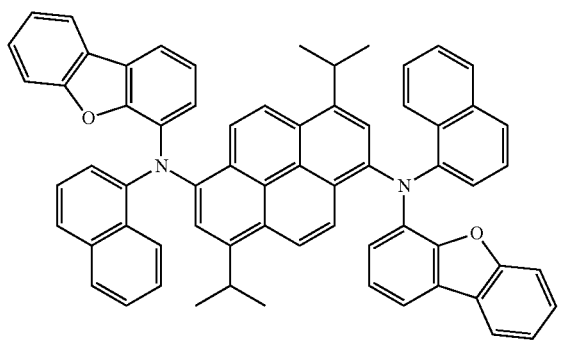
FD32
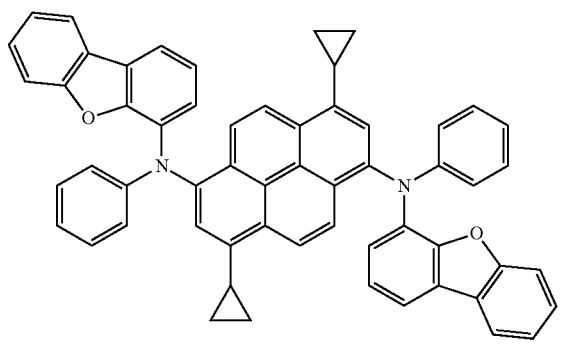

-continued

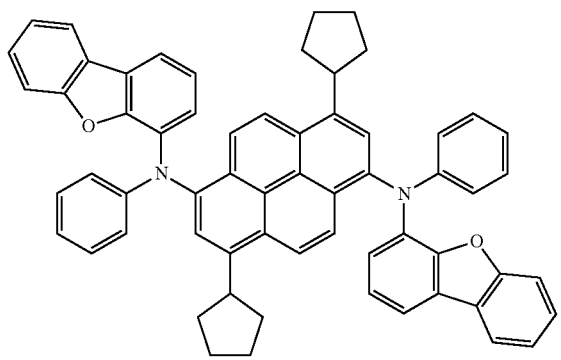
FD33

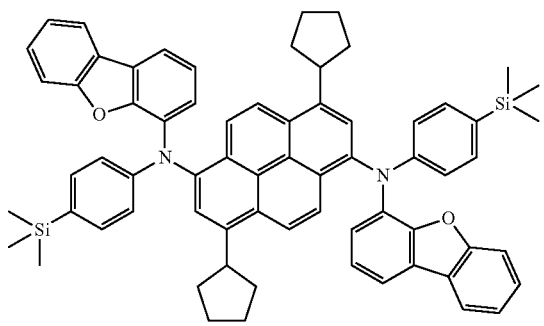
FD34

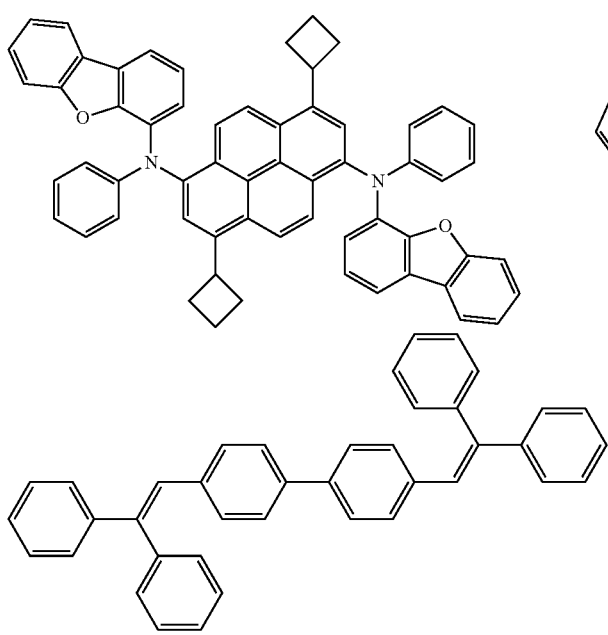
FD35

FD36

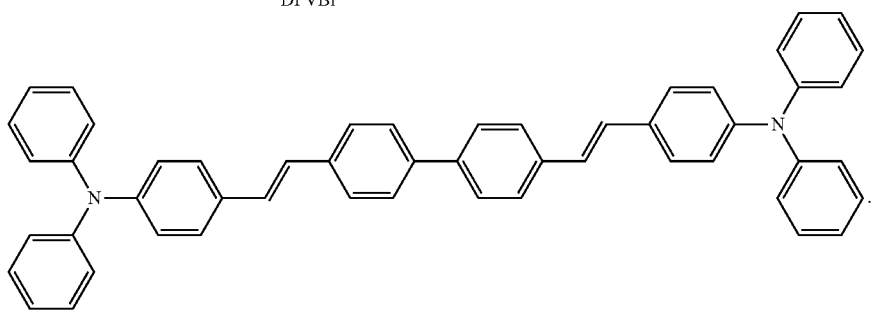

DPVBi

DPAVBi

Delayed Fluorescence Material

The emission layers 153-1, 153-2, and 153-3 may include a delayed fluorescence material.

In the present specification, the delayed fluorescence material may be selected from compounds capable of emitting delayed fluorescence based on a delayed fluorescence emission mechanism.

The delayed fluorescent material included in the emission layer may act as a host or a dopant depending on the type or kind of other materials included in the emission layer.

In an embodiment, the difference between the triplet energy level (eV) of the delayed fluorescence material and the singlet energy level (eV) of the delayed fluorescence material may be greater than or equal to 0 eV and less than or equal to 0.5 eV. When the difference between the triplet energy level (eV) of the delayed fluorescent material and the singlet energy level (eV) of the delayed fluorescent material satisfies the above-described range, up-conversion from the triplet state to the singlet state of the delayed fluorescent materials may effectively occur, and thus, the emission efficiency of the light-emitting device 10 may be improved.

In an embodiment, the delayed fluorescence material may include i) a material including at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), and ii) a material including a $C_8$-$C_{60}$ polycyclic group in which two or more cyclic groups are condensed (e.g., combined together) while sharing boron (B).

In an embodiment, the delayed fluorescence material may include at least one of the following compounds DF1 to DF9:

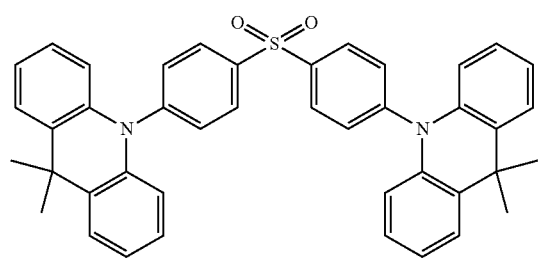

(DMAC-DPS) DF1

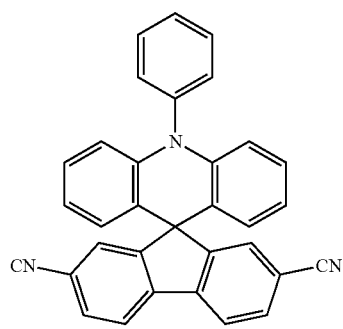

(ACRFLCN) DF2

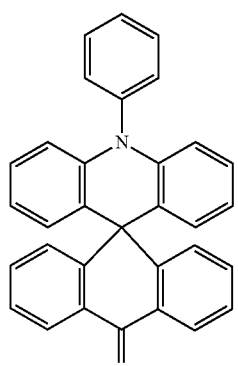

(ACRSA) DF3

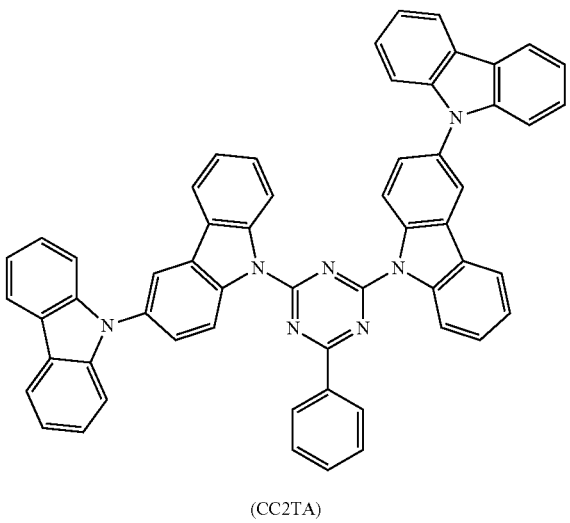

(CC2TA) DF4

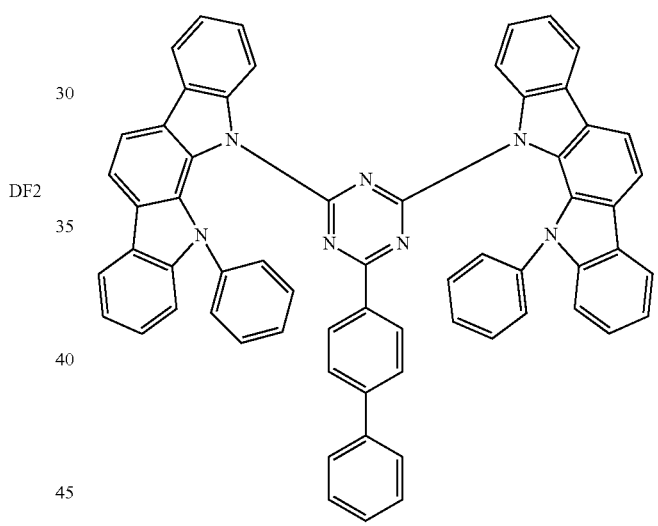

(PIC-TRZ) DF5

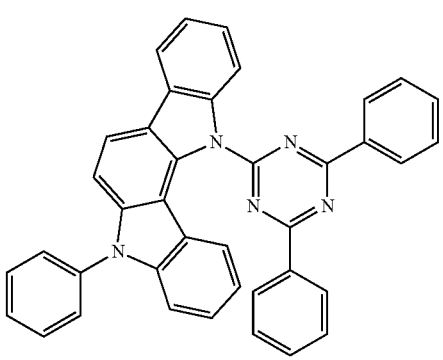

(PIC-TRZ2) DF6

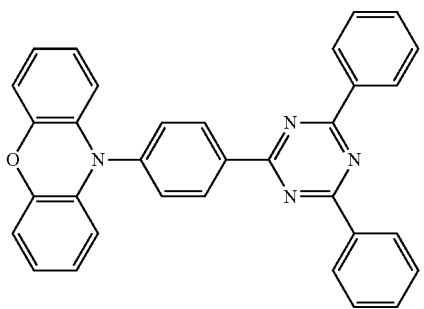

(PXZ-TRZ)

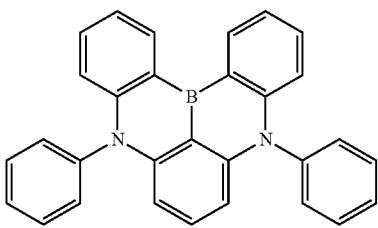

(DABNA-1)

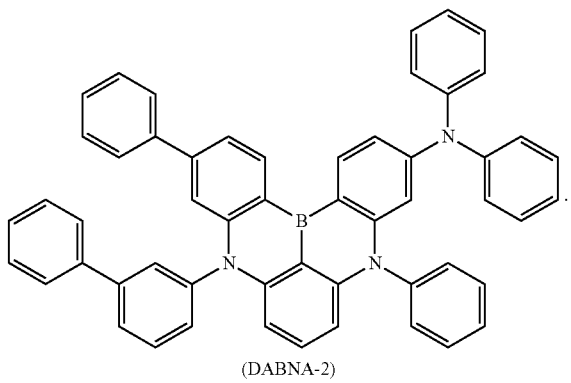

(DABNA-2)

Quantum Dot

The emission layer may include a quantum dot.

In the present specification, a quantum dot refers to a crystal of a semiconductor compound, and may include any suitable material capable of emitting light of various suitable emission wavelengths according to the size of the crystal.

A diameter of the quantum dot may be, for example, in a range of about 1 nm to about 10 nm.

The quantum dot may be synthesized by a wet chemical process, a metal organic chemical vapor deposition process, a molecular beam epitaxy process, and/or any suitable process similar thereto.

According to the wet chemical process, a precursor material is mixed with an organic solvent to grow a quantum dot particle crystal. When the crystal grows, the organic solvent naturally acts as a dispersant coordinated on the surface of the quantum dot crystal and controls the growth of the crystal so that the growth of quantum dot particles can be controlled through a process which is more easily performed than vapor deposition methods, such as metal organic chemical vapor deposition (MOCVD) or molecular beam epitaxy (MBE), and which requires or operates at low costs.

The quantum dot may include a Group II-VI semiconductor compound; a Group III-V semiconductor compound; a Group III-VI semiconductor compound; a Group I-III-VI semiconductor compound; a Group IV-VI semiconductor compound; a Group IV element or compound; or any combination thereof.

Examples of the Group II-VI semiconductor compound are a binary compound, such as CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Examples of the Group III-V semiconductor compound are a binary compound, such as GaN, GaP, GaAs, GaSb, AlN, AlP, AlAs, AlSb, InN, InP, InAs, InSb, and/or the like; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and/or the like; a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and/or the like; or any combination thereof. In one or more embodiments, the Group III-V semiconductor compound may further include Group II elements. Examples of the Group III-V further including Group II elements are InZnP, InGaZnP, InAlZnP, etc.

Examples of the Group III-VI semiconductor compound are a binary compound, such as GaS, GaSe, $Ga_2Se_3$, GaTe, InS, $In_2S_3$, InSe, $In_2Se_3$, and/or InTe; a ternary compound, such as $InGaS_3$, and/or $InGaSe_3$; and any combination thereof.

Examples of the Group semiconductor compound are a ternary compound, such as AgInS, $AgInS_2$, CuInS, $CuInS_2$, $CuGaO_2$, $AgGaO_2$, and/or $AgAlO_2$; or any combination thereof.

Examples of the Group IV-VI semiconductor compound are a binary compound, such as SnS, SnSe, SnTe, PbS, PbSe, PbTe, and/or the like; a ternary compound, such as SnSeS, SnSeTe, SnSTe, PbSeS, PbSeTe, PbSTe, SnPbS, SnPbSe, SnPbTe, and/or the like; a quaternary compound, such as SnPbSSe, SnPbSeTe, SnPbSTe, and/or the like; or any combination thereof.

The Group IV element or compound may include a single element compound, such as Si or Ge; a binary compound, such as SiC and/or SiGe; or any combination thereof.

Each element included in a multi-element compound such as the binary compound, ternary compound and quaternary compound, may exist in a particle with a uniform concentration or non-uniform concentration.

In one or more embodiments, the quantum dot may have a single structure or a dual core-shell structure. In the case of the quantum dot having a single structure, the concentration of each element included in the corresponding quantum dot is uniform (e.g., substantially uniform). In an embodiment, the material contained in the core and the material contained in the shell may be different from each other.

The shell of the quantum dot may act as a protective layer to prevent or reduce chemical degeneration of the core to maintain semiconductor characteristics and/or as a charging layer to impart electrophoretic characteristics to the quantum dot. The shell may be a single layer or a multi-layer. The interface between the core and the shell may have a concentration gradient that decreases along a direction toward the center of the element present in the shell.

Examples of the shell of the quantum dot may be an oxide of metal, and/or non-metal, a semiconductor compound, and any combination thereof. Examples of the oxide of metal and/or non-metal are a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound, such as $MgAl_2O_4$, $CoFe_2O_4$, $NiFe_2O_4$, and/or $CoMn_2O_4$; and any combination thereof. Examples of the semiconductor compound are, as described herein, a Group II-VI semiconductor compound; a Group III-V semiconductor compound; a Group III-VI semiconductor compound; a Group I-III-VI semiconductor compound; a Group IV-VI semiconductor compound; and any combination thereof. In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWHM) of an emission wavelength spectrum of the quantum dot may be about 45 nm or less, for example, about 40 nm or less, for example, about 30 nm or less, and within these ranges, color purity and/or color gamut may be increased. In addition, because the light emitted through the quantum dot is emitted in all directions, the wide viewing angle can be improved.

In addition, the quantum dot may be a spherical particle, a pyramidal particle, a multi-arm particle, a cubic nanoparticle, a nanotube particle, a nanowire particle, a nanofiber particle, and/or a nanoplate particle.

Because the energy band gap can be adjusted by controlling the size of the quantum dot, light having various suitable wavelength bands can be obtained from the quantum dot emission layer. Therefore, by using quantum dots of different sizes, a light-emitting display that emits light of various suitable wavelengths may be implemented. In an embodiment, the size of the quantum dot may be selected from to emit red, green and/or blue light. In addition, the size of the quantum dot may emit white light by combining light of various suitable colors.

Electron Transport Region

The electron transport region may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron transport region may include a buffer layer, a hole blocking layer, an electron control layer, an electron transport layer, an electron injection layer, or any combination thereof.

In an embodiment, the electron transport region may have an electron transport layer/electron injection layer structure, a hole blocking layer/electron transport layer/electron injection layer structure, an electron control layer/electron transport layer/electron injection layer structure, or a buffer layer/electron transport layer/electron injection layer structure, wherein, for each structure, constituting layers are stacked sequentially from an emission layer.

In an embodiment, the electron transport region (for example, the buffer layer, the hole blocking layer, the electron control layer, and/or the electron transport layer in the electron transport region) may include a metal-free compound including at least one π electron-deficient nitrogen-containing $C_1$-$C_{60}$ cyclic group.

In an embodiment, the electron transport region may include a compound represented by Formula 601 below:

Formula 601

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, $-Si(Q_{601})(Q_{602})(Q_{603})$, $-C(=O)(Q_{601})$, $-S(=O)_2(Q_{601})$, or $-P(=O)(Q_{601})(Q_{602})$, $Q_{601}$ to $Q_{603}$ are the same as described in connection with $Q_1$, xe21 may be 1, 2, 3, 4, or 5, and at least one of $Ar_{601}$, $L_{601}$, and $R_{601}$ may each independently be a π electron-deficient nitrogen-containing $C_1$-$C_{60}$ cyclic group unsubstituted or substituted with at least one $R_{10a}$.

For example, when xe11 in Formula 601 is 2 or more, two or more of $Ar_{601}$(s) may be linked via a single bond.

In an embodiment, $Ar_{601}$ in Formula 601 may be a substituted or unsubstituted anthracene group.

In an embodiment, the electron transport region may include a compound represented by Formula 601-1:

Formula 601-1

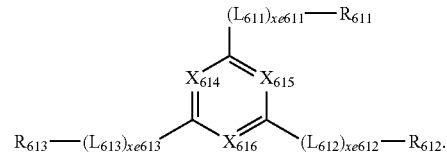

In Formula 601-1, $X_{614}$ may be N or $C(R_{614})$, $X_{615}$ may be N or $C(R_{615})$, $X_{616}$ may be N or $C(R_{616})$, at least one of $X_{614}$ to $X_{616}$ may be N, $L_{611}$ to $L_{613}$ are the same as described in connection with $L_{601}$, xe611 to xe613 are the same as described in connection with xe1

$R_{611}$ to $R_{613}$ are the same as described in connection with $R_{601}$, $R_{614}$ to $R_{616}$ may each independently be hydrogen, deuterium, $-F$, $-Cl$, $-Br$, $-I$, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group substituted or unsubstituted at least one $R_{10a}$.

For example, xe1 and xe611 to xe613 in Formulae 601 and 601-1 may each independently be 0, 1, or 2.

The second electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, TPM-TAZ, or any combination thereof:

ET1
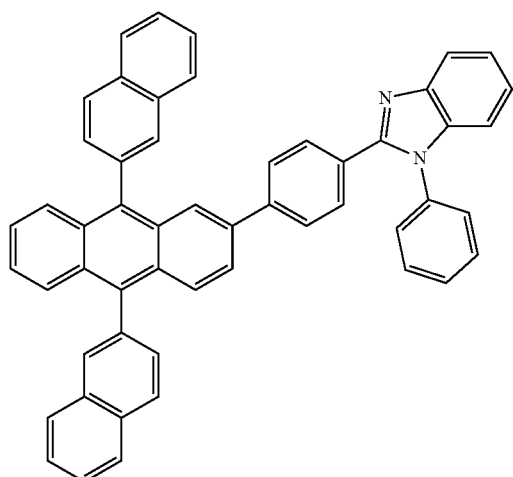
ET2
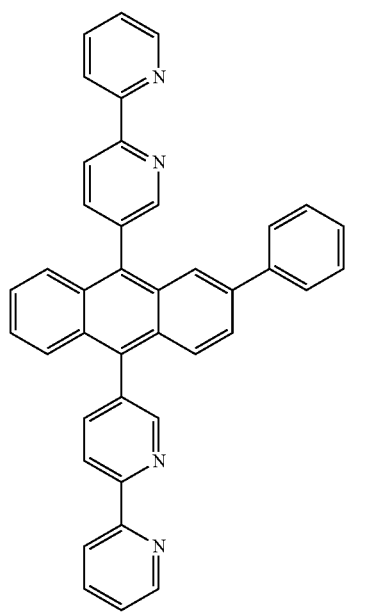
ET3
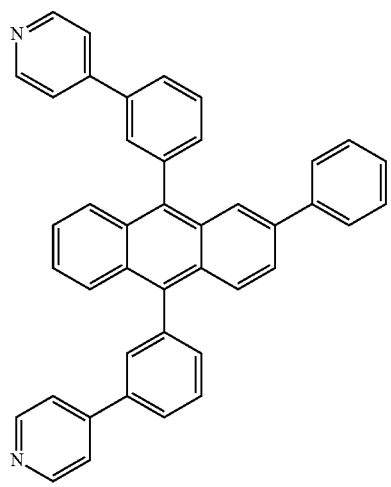
ET4
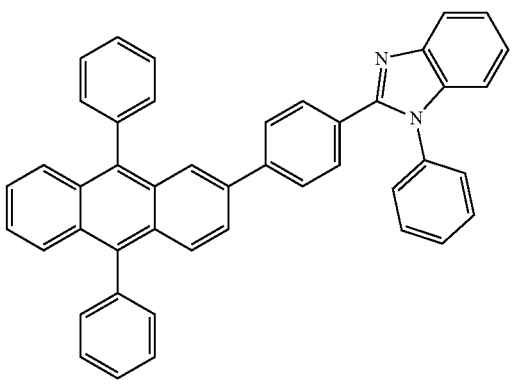
ET5
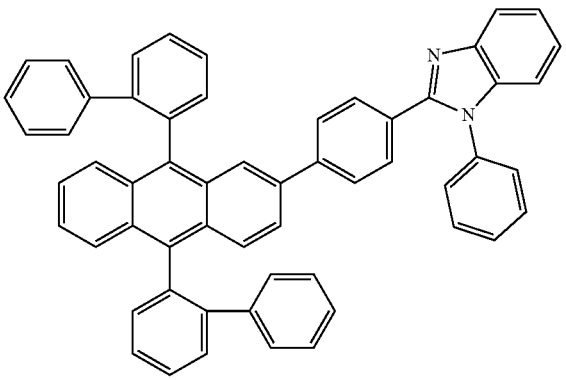
ET6
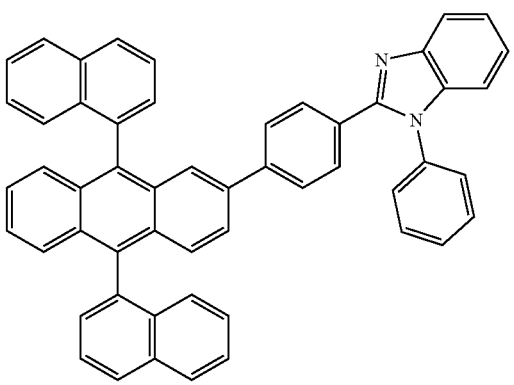

ET7
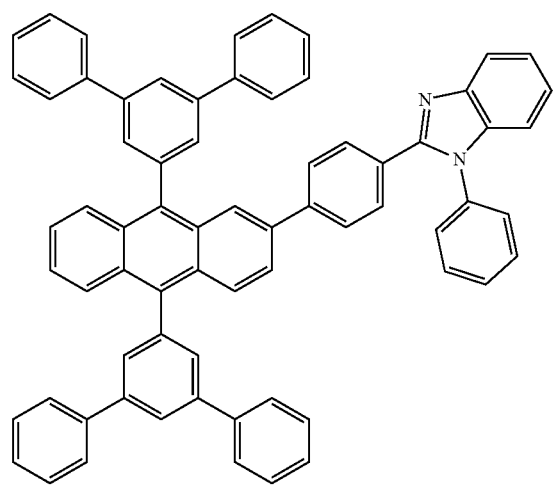
ET8
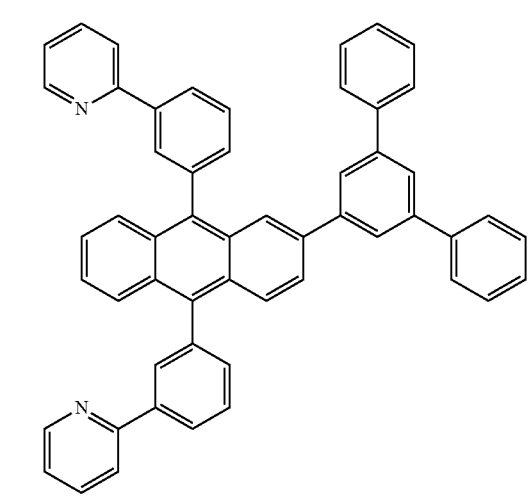
ET9
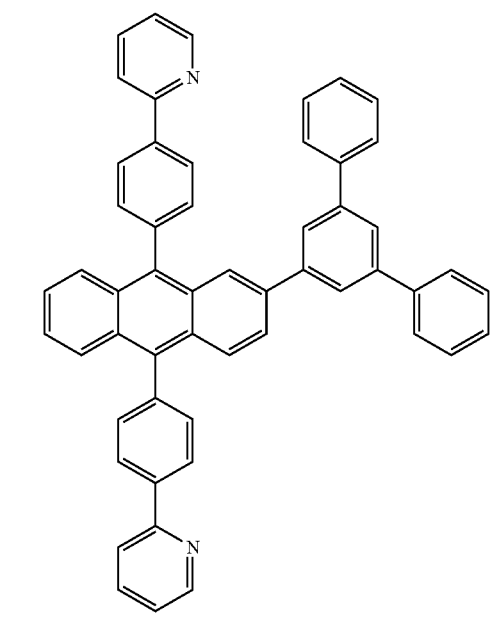
ET10
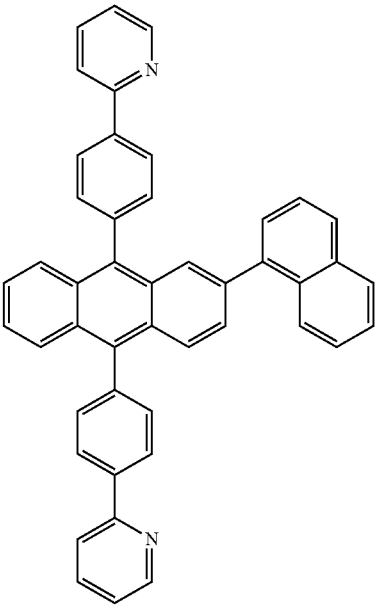
ET11
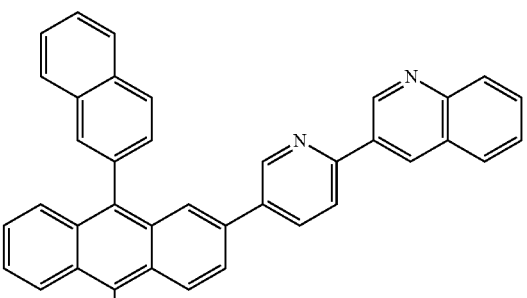
ET12
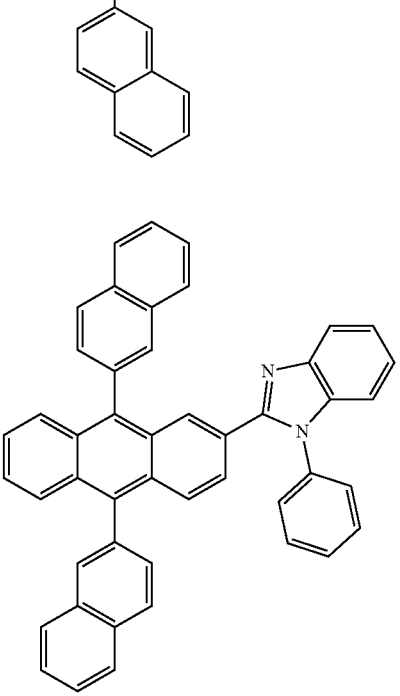

ET13
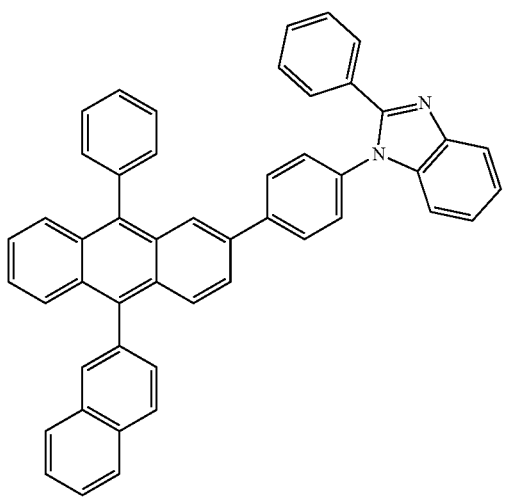
ET16
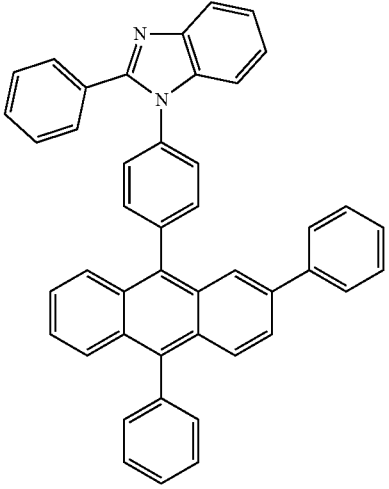
ET14
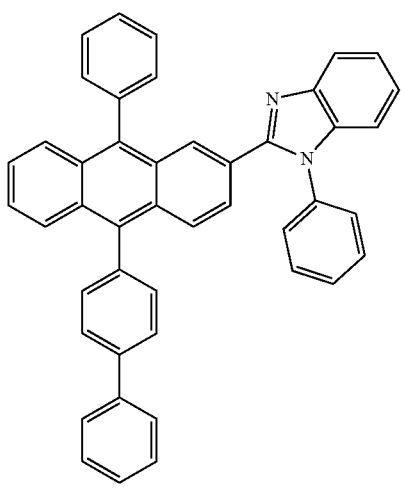
ET17
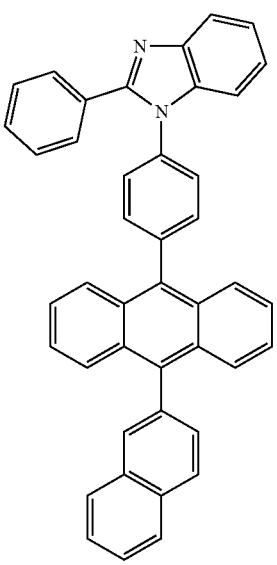
ET15
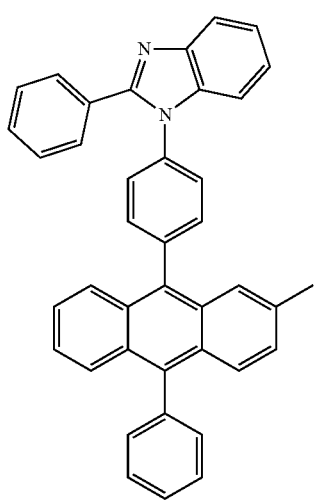
ET18
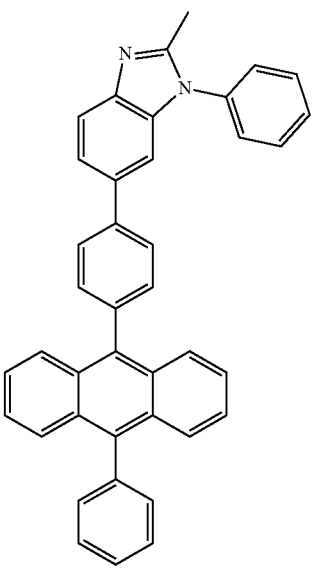

ET19
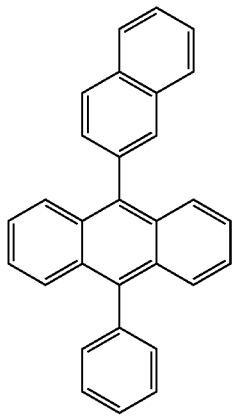
ET20
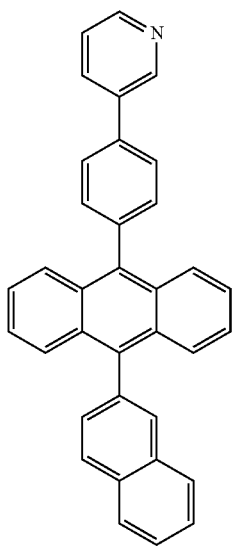
ET21
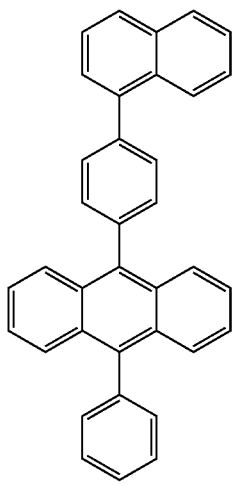
ET22
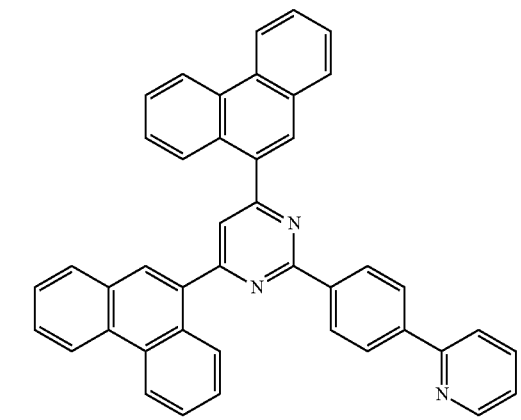
ET23
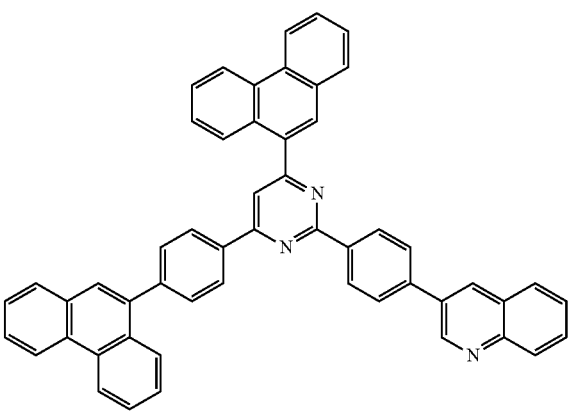
ET24
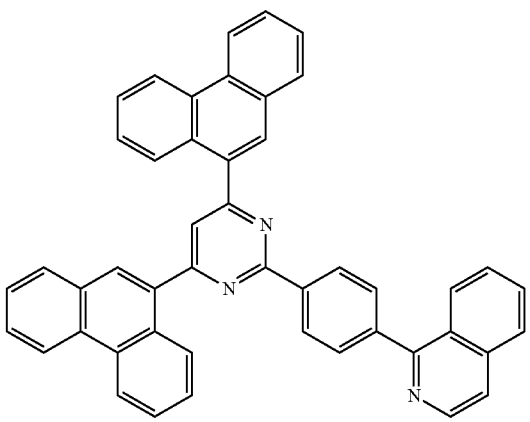

ET25
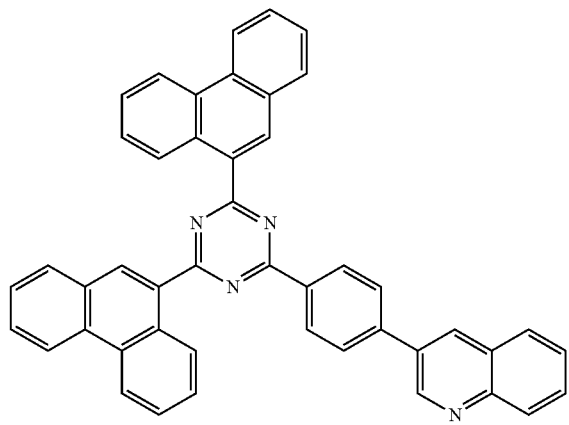
ET26
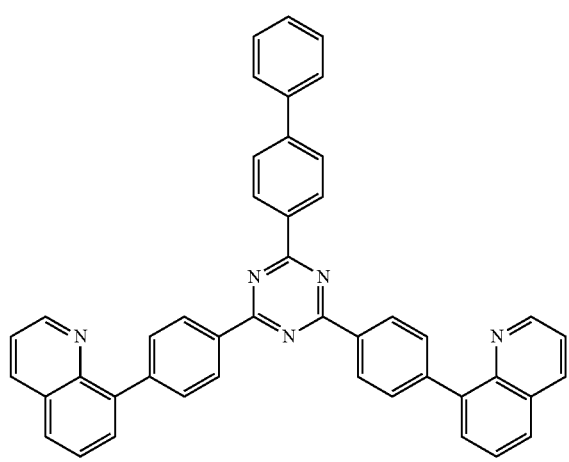
ET27
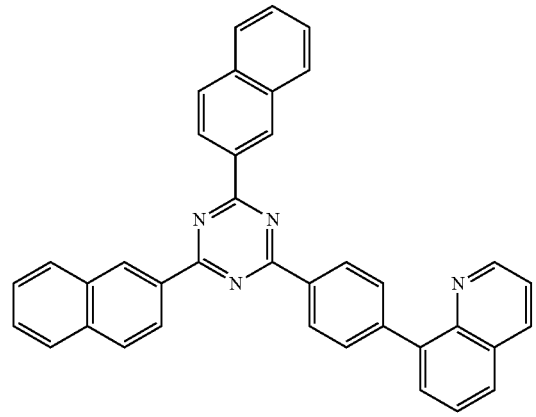
ET28
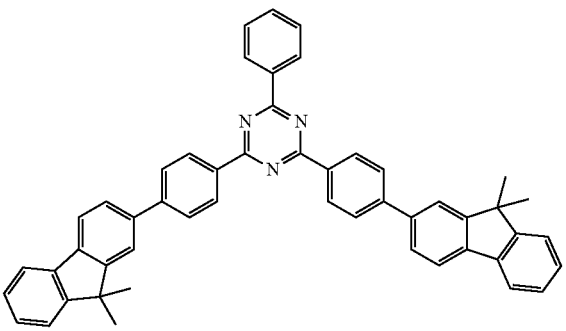
ET29
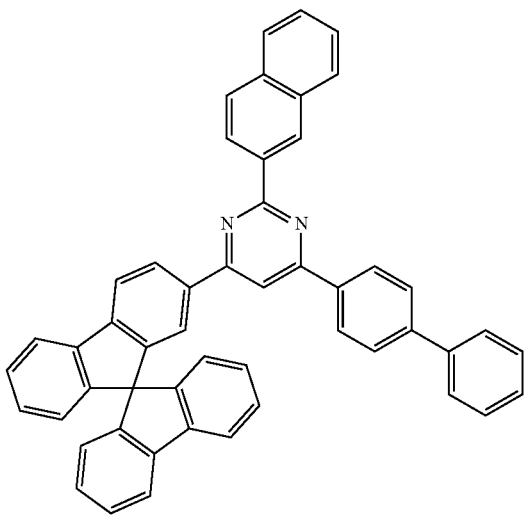
ET30
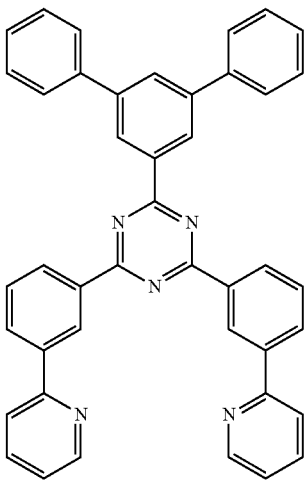

ET31
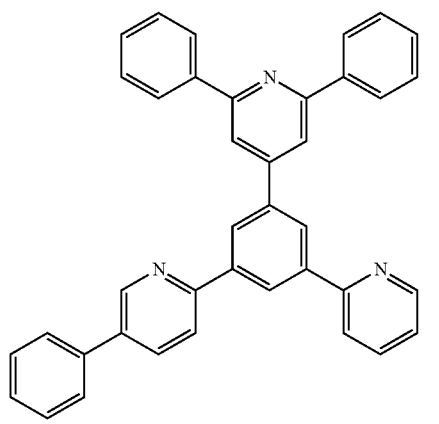
ET32
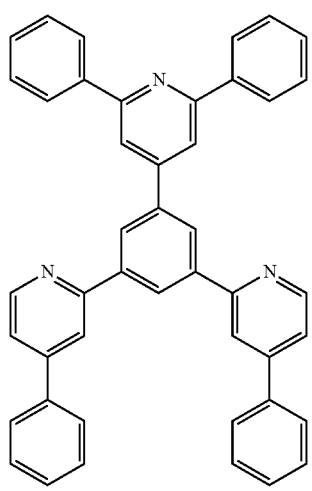
ET33
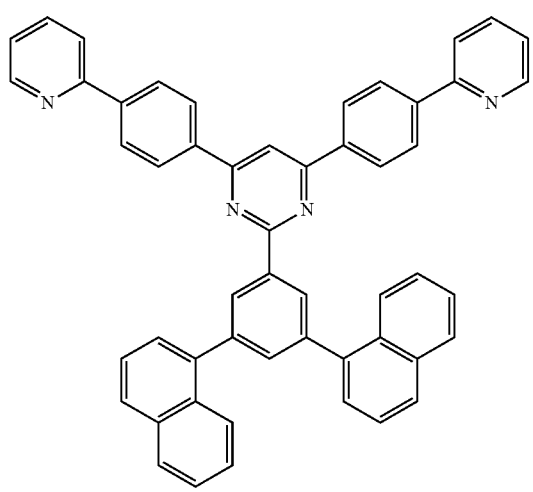
ET34
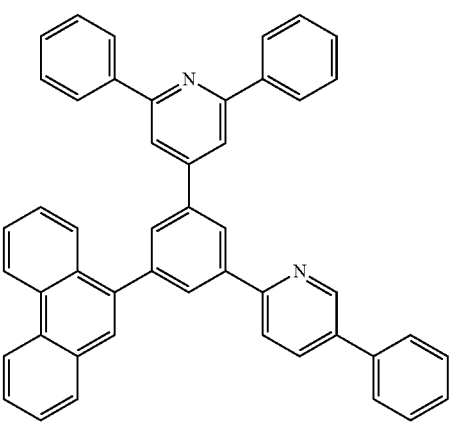
ET35
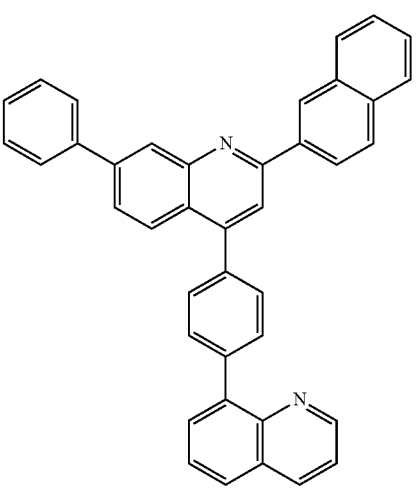
ET36
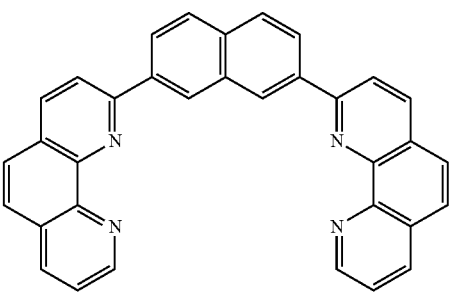
ET37
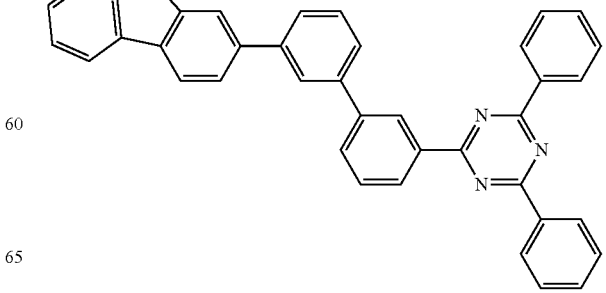

ET38
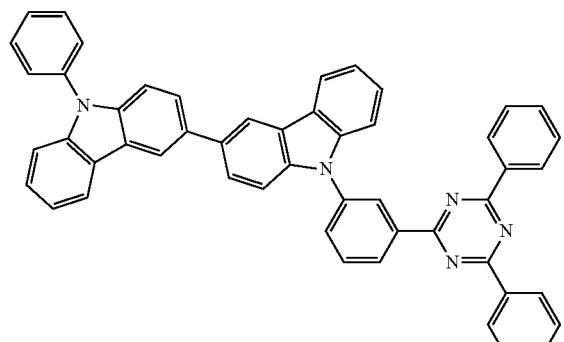
ET39
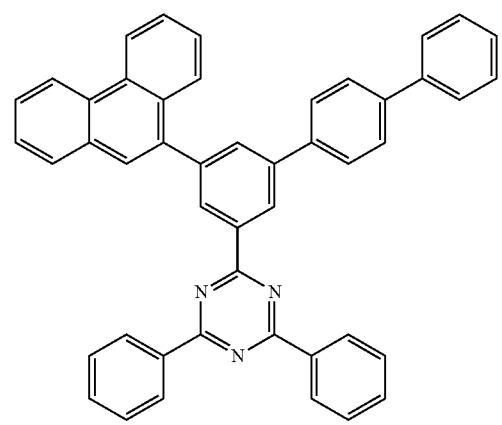
ET40
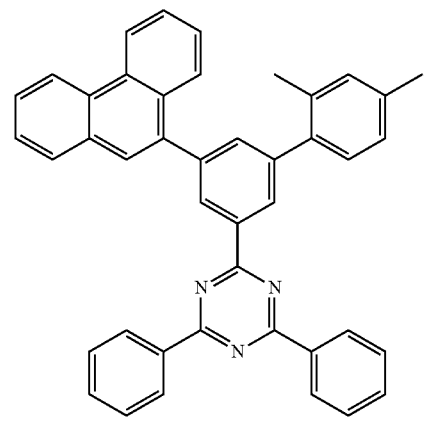
ET41
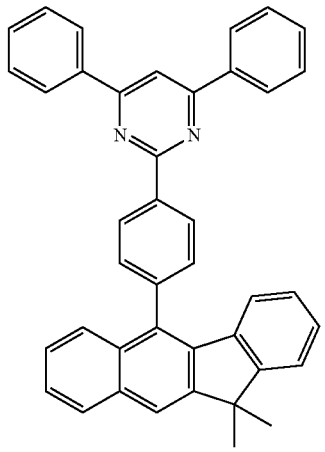
ET42
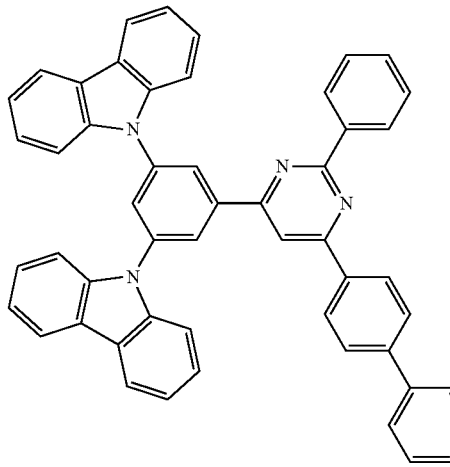
ET43
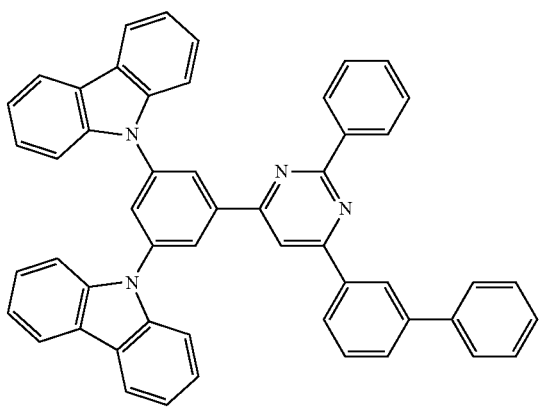

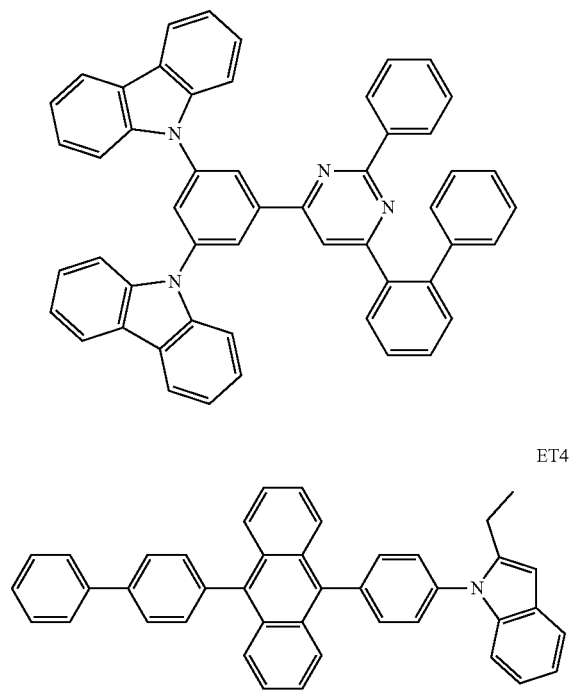
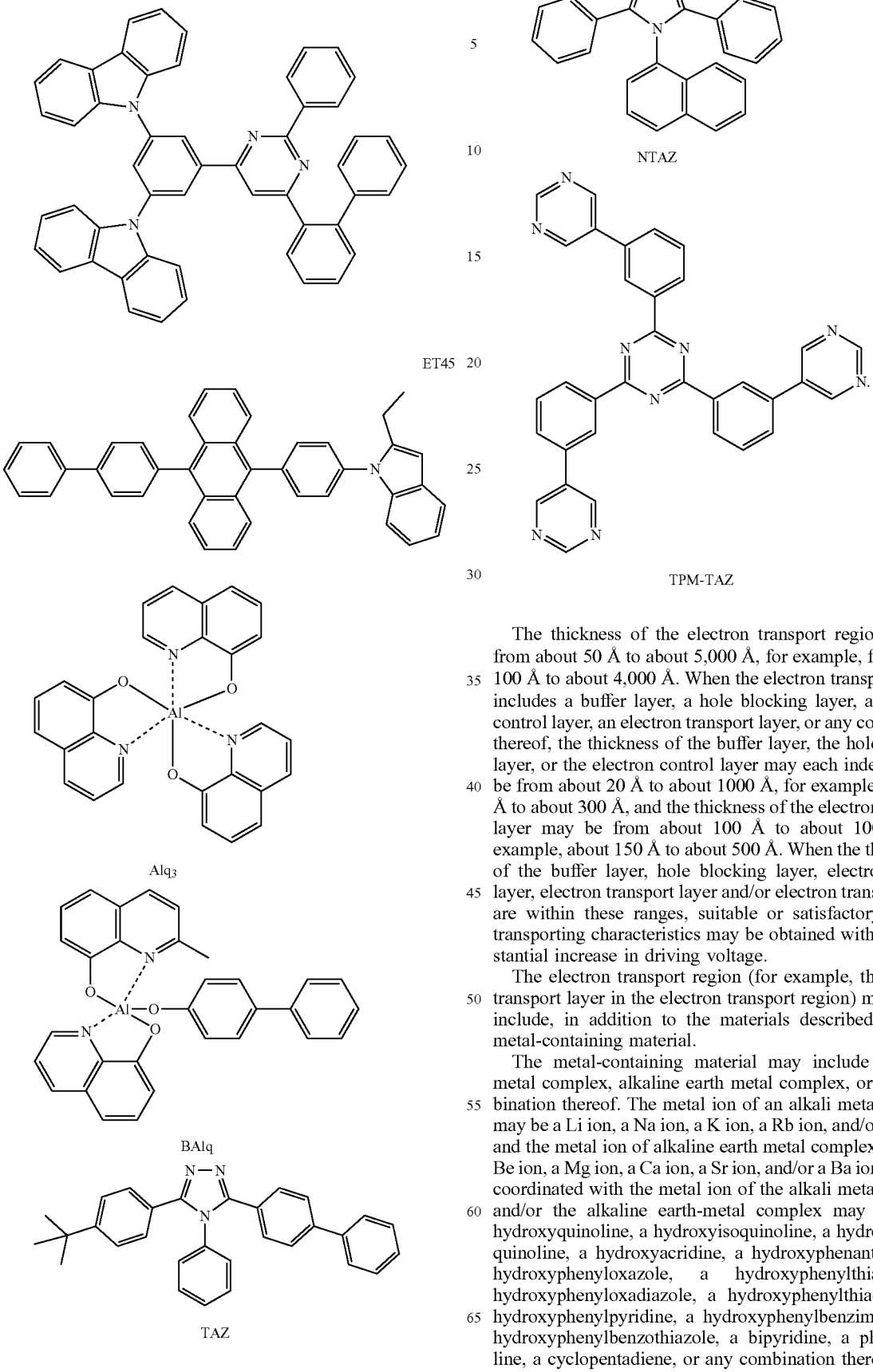

The thickness of the electron transport region may be from about 50 Å to about 5,000 Å, for example, from about 100 Å to about 4,000 Å. When the electron transport region includes a buffer layer, a hole blocking layer, an electron control layer, an electron transport layer, or any combination thereof, the thickness of the buffer layer, the hole blocking layer, or the electron control layer may each independently be from about 20 Å to about 1000 Å, for example, about 30 Å to about 300 Å, and the thickness of the electron transport layer may be from about 100 Å to about 1000 Å, for example, about 150 Å to about 500 Å. When the thicknesses of the buffer layer, hole blocking layer, electron control layer, electron transport layer and/or electron transport layer are within these ranges, suitable or satisfactory electron transporting characteristics may be obtained without a substantial increase in driving voltage.

The electron transport region (for example, the electron transport layer in the electron transport region) may further include, in addition to the materials described above, a metal-containing material.

The metal-containing material may include an alkali metal complex, alkaline earth metal complex, or any combination thereof. The metal ion of an alkali metal complex may be a Li ion, a Na ion, a K ion, a Rb ion, and/or a Cs ion, and the metal ion of alkaline earth metal complex may be a Be ion, a Mg ion, a Ca ion, a Sr ion, and/or a Ba ion. A ligand coordinated with the metal ion of the alkali metal complex and/or the alkaline earth-metal complex may include a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

For example, the metal-containing material may include a Li complex. The Li complex may include, for example, Compound ET-D1 (LiQ) or ET-D2:

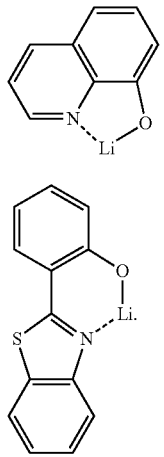

ET-D1

ET-D2

The electron transport region may include an electron injection layer that facilitates the injection of electrons from the second electrode 190. The electron injection layer may directly contact (e.g., physically contact) the second electrode 190.

The electron injection layer may have: i) a single-layered structure including (e.g., consisting of) a single layer including (e.g., consisting of) a single material, ii) a single-layered structure including (e.g., consisting of) a single layer including (e.g., consisting of) a plurality of different materials, or iii) a multi-layered structure including a plurality of layers including different materials.

The electron injection layer may include an alkali metal, alkaline earth metal, a rare earth metal, an alkali metal-containing compound, alkaline earth metal-containing compound, a rare earth metal-containing compound, an alkali metal complex, alkaline earth metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides, halides (for example, fluorides, chlorides, bromides, and/or iodides), and/or tellurides of the alkali metal, the alkaline earth metal, and the rare earth metal, or any combination thereof.

The alkali metal-containing compound may include alkali metal oxides, such as $Li_2O$, $Cs_2O$, and/or $K_2O$, alkali metal halides, such as LiF, NaF, CsF, KF, LiI, NaI, CsI, and/or KI, or any combination thereof. The alkaline earth metal-containing compound may include an alkaline earth metal compound, such as BaO, SrO, CaO, $Ba_xSr_{1-x}O$ (x is a real number satisfying the condition of 0<x<1), $Ba_xCa_{1-x}O$ (x is a real number satisfying the condition of 0<x<1), and/or the like. The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride are LaTe, CeTe, PrTe, NdTe, PmTe, SmTe, EuTe, GdTe, TbTe, DyTe, HoTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii), as a ligand bonded to the metal ion, for example, a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxyphenyloxadiazole, a hydroxyphenylthiadiazole, a hydroxyphenylpyridine, a hydroxyphenylbenzimidazole, a hydroxyphenylbenzothiazole, a bipyridine, a phenanthroline, a cyclopentadiene, or any combination thereof.

The electron injection layer may include (e.g., consist of) an alkali metal, an alkaline earth metal, a rare earth metal, an alkali metal-containing compound, an alkaline earth metal-containing compound, a rare earth metal-containing compound, an alkali metal complex, an alkaline earth metal complex, a rare earth metal complex, or any combination thereof, as described above. In an embodiment, the electron injection layer may further include an organic material (for example, a compound represented by Formula 601).

In an embodiment, the electron injection layer may include (e.g., consist of) i) an alkali metal-containing compound (for example, an alkali metal halide), ii) a) an alkali metal-containing compound (for example, an alkali metal halide); and b) an alkali metal, an alkaline earth metal, a rare earth metal, or any combination thereof. In an embodiment, the electron injection layer may be a KI:Yb co-deposited layer, an RbI:Yb co-deposited layer, and/or the like.

When the electron injection layer further includes an organic material, alkali metal, alkaline earth metal, rare earth metal, an alkali metal-containing compound, an alkaline earth metal-containing compound, a rare earth metal-containing compound, alkali metal complex, alkaline earth-metal complex, rare earth metal complex, or any combination thereof may be homogeneously or non-homogeneously dispersed in a matrix including the organic material.

A thickness of the electron injection layer may be in a range of about 1 Å to about 100 Å, and, for example, about 3 Å to about 90 Å. When the thickness of the electron injection layer is within the range described above, the electron injection layer may have suitable or satisfactory electron injection characteristics without a substantial increase in driving voltage.

Second Electrode 190

The second electrode 190 may be on the interlayer 150 having a structure as previously described. The second electrode 190 may be a cathode, which is an electron injection electrode, and as the material for the second electrode 190, a metal, an alloy, an electrically conductive compound, or any combination thereof, each having a low work function, may be used.

In an embodiment, the second electrode 190 may include at least one lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, or a combination thereof. The second electrode 190 may be a transmissive electrode, a semi-transmissive electrode, or a reflective electrode.

The second electrode 190 may have a single-layered structure or a multi-layered structure including two or more layers.

Capping Layer

A first capping layer may be outside the first electrode 110, and/or a second capping layer may be outside the second electrode 190. In more detail, the light-emitting device 100 may have a structure in which the first capping layer, the first electrode 110, the interlayer 150, and the second electrode 190 are sequentially stacked, a structure in which the first electrode 110, the interlayer 150, the second electrode 190, and the second capping layer are sequentially stacked, or a structure in which the first capping layer, the first electrode 110, the interlayer 150, the second electrode 190, and the second capping layer are sequentially stacked.

Light generated in an emission layer of the interlayer 150 of the light-emitting device 10 may be extracted toward the outside through the first electrode 110, which is a semi-transmissive electrode or a transmissive electrode, and the first capping layer or light generated in an emission layer of the interlayer 150 of the light-emitting device 10 may be extracted toward the outside through the second electrode 190, which is a semi-transmissive electrode or a transmissive electrode, and the second capping layer.

The first capping layer and the second capping layer may increase external emission efficiency according to the principle of constructive interference. Accordingly, the light extraction efficiency of the light-emitting device 10 is increased, so that the emission efficiency of the light-emitting device 10 may be improved.

Each of the first capping layer and second capping layer may include a material having a refractive index (at a wavelength of 589 nm) of 1.6 or more.

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include carbocyclic compounds, heterocyclic compounds, an amine group-containing compounds, porphyrin derivatives, phthalocyanine derivatives, a naphthalocyanine derivatives, alkali metal complexes, alkaline earth-based complexes, or any combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In an embodiment, at least one of the first capping layer and the second capping layer may each independently include a compound represented by Formula 201, a compound represented by Formula 202, or any combination thereof.

In one or more embodiments, at least one of the first capping layer and the second capping layer may each independently include a compound selected from Compounds HT28 to HT33, Compounds CP1 to CP6, β-NPB, or any combination thereof, but embodiments of the present disclosure are not limited thereto:

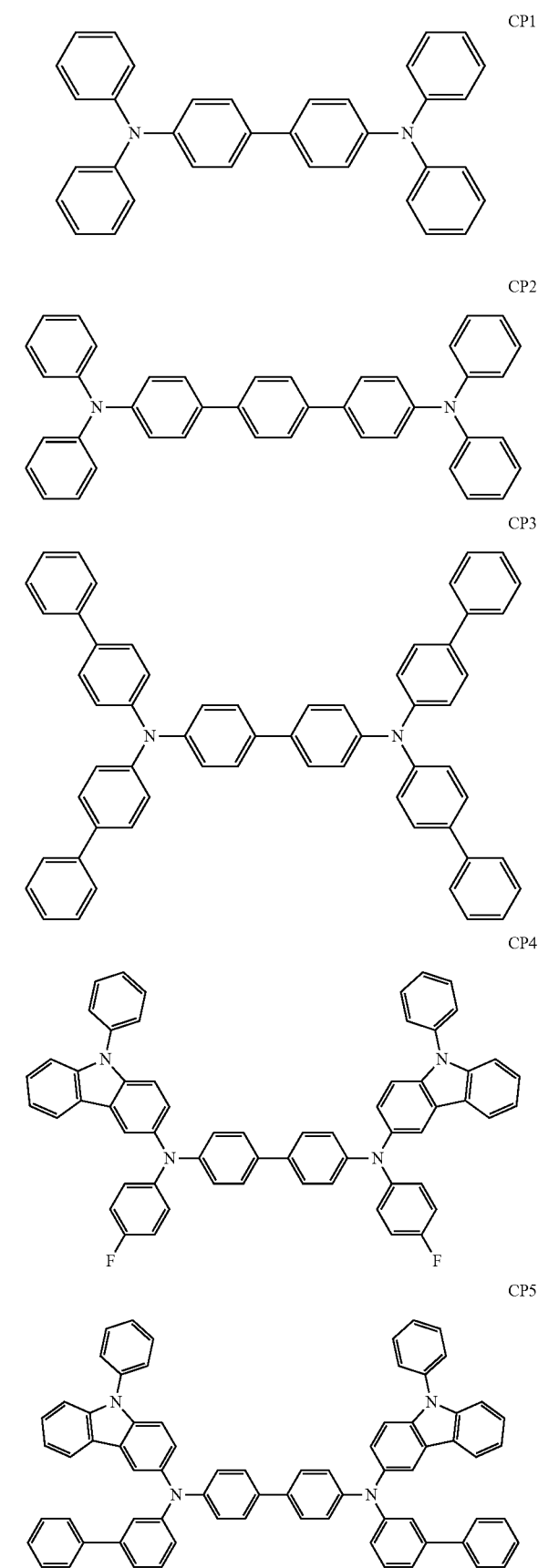

-continued

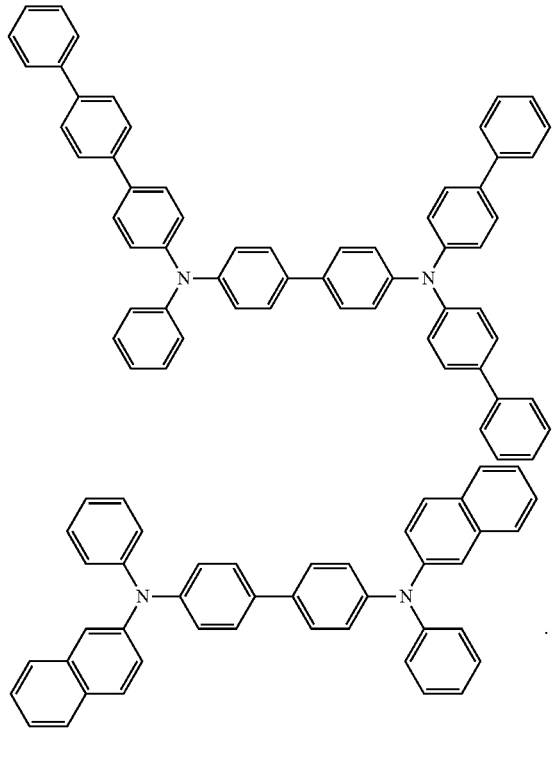

β-NPB

Electronic Apparatus

The light-emitting device 10 may be included in various suitable apparatuses. In an embodiment, the electronic apparatus including the light-emitting device 10 may be a light-emitting apparatus, an authentication apparatus, and/or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be in at least one traveling direction of light emitted from the light-emitting device 10. In an embodiment, the light emitted from the light-emitting device 10 may be blue light or white light. The light-emitting device 10 may be the same as described above. In an embodiment, the color conversion layer may include quantum dots. The quantum dot may be, for example, a quantum dot as described herein.

The electronic apparatus may include a first substrate. The first substrate may include a plurality of subpixel areas, the color filter may include a plurality of color filter areas respectively corresponding to the subpixel areas, and the color conversion layer may include a plurality of color conversion areas respectively corresponding to the subpixel areas.

A pixel-defining film may be located among the subpixel areas to define each of the subpixel areas.

The color filter may further include a plurality of color filter areas and light-blocking patterns located among the color filter areas, and the color conversion layer may include a plurality of color conversion areas and light-blocking patterns located among the color conversion areas.

The color filter areas (or the color conversion areas) may include a first area emitting first-color light, a second area emitting second color light, and/or a third area emitting third color light, and the first-color light, the second color light, and/or the third color light may have different maximum emission wavelengths from one another. In an embodiment, the first-color light may be red light, the second color light may be green light, and the third color light may be blue light. In an embodiment, the color filter areas (or the color conversion areas) may include quantum dots. In more detail, the first area may include a red quantum dot, the second area may include a green quantum dot, and the third area may not include a quantum dot. The quantum dot is the same as described in the present specification. The first area, the second area, and/or the third area may each include a scatterer (e.g., a light scatterer).

In an embodiment, the light-emitting device 10 may emit a first light, the first region may absorb the first light to emit a first first-color light, the second region may absorb the first light to emit a second first-color light, and the third region may absorb the first light to emit a third first-color light. In this regard, the first first-color light, the second first-color light, and the third-first light may have different maximum emission wavelengths from one another. In more detail, the first light may be blue light, the first first-color light may be red light, the second first-color light may be green light, and the third first-color light may be blue light.

The electronic apparatus may further include a thin-film transistor in addition to the light-emitting device 10 as described above. The thin-film transistor may include a source electrode, a drain electrode, and an active layer, and any one selected from the source electrode and the drain electrode may be electrically coupled to one selected from the first electrode 110 and the second electrode 190 of the light-emitting device 10.

The thin-film transistor may include a gate electrode, a gate insulating film, etc.

The active layer may include crystalline silicon, amorphous silicon, organic semiconductor, oxide semiconductor, and/or the like.

The electronic apparatus may further include a sealing portion for sealing the light-emitting device 10. The sealing portion may be between the color filter and/or color conversion layer and the light-emitting device 10. The sealing portion allows light from the light-emitting device 10 to be extracted to the outside, while concurrently (e.g., simultaneously) preventing or reducing penetration of ambient air and/or moisture into the light-emitting device 10. The sealing portion may be a sealing substrate including a transparent glass and/or a plastic substrate. The sealing portion may be a thin-film encapsulation layer including at least one layer of an organic layer and/or an inorganic layer. When the sealing portion is a thin film encapsulation layer, the electronic apparatus may be flexible.

Various suitable functional layers may be additionally on the sealing portion, in addition to the color filter and/or the color conversion layer, according to the use of the electronic apparatus. The functional layers may include a touch screen layer, a polarizing layer, and/or the like. The touch screen layer may be a pressure-sensitive touch screen layer, a capacitive touch screen layer, and/or an infra-red touch screen layer. The authentication apparatus may be, for example, a biometric authentication apparatus that authenticates an individual by using biometric information of a living body (for example, fingertips, pupils, etc.).

The authentication apparatus may further include, in addition to the organic light-emitting device 10, a biometric information collector.

The electronic apparatus may be applied to various suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and/or a vessel), projectors, and/or the like.

Figure 2:
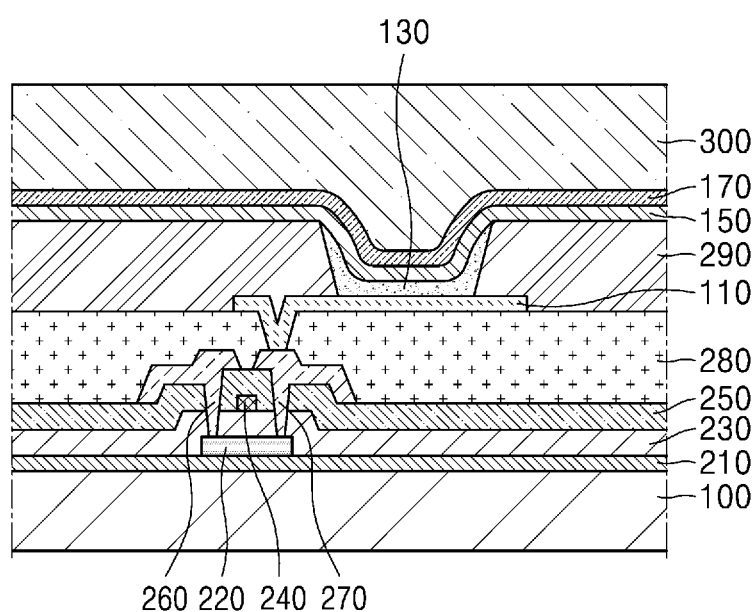
FIG. 2 is a cross-sectional view showing a light-emitting apparatus according to an embodiment of the present disclosure.
Figure 3:
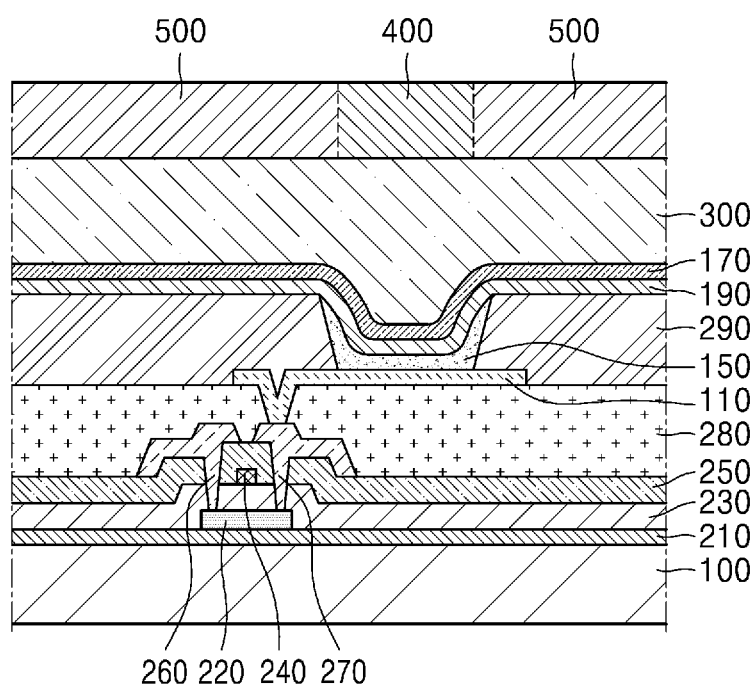
FIG. 3 shows a cross-sectional view showing a light-emitting apparatus according to an embodiment of the present disclosure.

Description of FIGS. 2 and 3

FIG. 2 is a cross-sectional view showing a light-emitting apparatus according to an embodiment of the present disclosure.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, and/or a metal substrate. A buffer layer 210 may be formed on the substrate 100. The buffer layer 210 may prevent or reduce penetration of impurities through the substrate 100 and may provide a flat surface on the substrate 100.

A TFT may be on the buffer layer 210. The TFT may include an active layer 220, a gate electrode 240, a source electrode 260, and a drain electrode 270.

The active layer 220 may include an inorganic semiconductor such as silicon and/or polysilicon, an organic semiconductor, and/or an oxide semiconductor, and may include a source region, a drain region and a channel region.

A gate insulating film 230 for insulating the active layer 220 from the gate electrode 240 may be on the active layer 220, and the gate electrode 240 may be on the gate insulating film 230.

An interlayer insulating film 250 is on the gate electrode 240. The interlayer insulating film 250 may be placed between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be on the interlayer insulating film 250. The interlayer insulating film 250 and the gate insulating film 230 may expose the source region and the drain region of the active layer 220, and the source electrode 260 and the drain electrode 270 may be in contact (e.g., physical contact) with the exposed portions of the source region and the drain region of the active layer 220.

The TFT is electrically coupled to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device may include a first electrode 110, an interlayer 150, and a second electrode 190.

The first electrode 110 may be on the passivation layer 280. The passivation layer 280 does not completely cover the drain electrode 270 and exposes a portion of the drain electrode 270, and the first electrode 110 is coupled to the exposed portion of the drain electrode 270.

A pixel defining layer 290 containing an insulating material may be on the first electrode 110. The pixel defining layer 290 exposes a portion of the first electrode 110, and an interlayer 150 may be in the exposed portion of the first electrode 110. The pixel defining layer 290 may be a polyimide and/or polyacrylic organic film. In one or more embodiments, at least some layers of the interlayer 150 may extend beyond the upper portion of the pixel defining layer 290 to be in the form of a common layer.

The second electrode 190 may be on the interlayer 150, and a capping layer 170 may be additionally on the second electrode 190. The capping layer 170 may cover the second electrode 190.

The encapsulation portion 300 may be on the capping layer 170. The encapsulation portion 300 may be on a light-emitting device to protect the light-emitting device from moisture and/or oxygen. The encapsulation portion 300 may include: an inorganic film including silicon nitride ($SiN_x$), silicon oxide ($SiO_x$), indium tin oxide, indium zinc oxide, or any combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate, polyacrylic acid, and/or the like), an epoxy-based resin (for example, aliphatic glycidyl ether (AGE), and/or the like), or a combination thereof; or a combination of the inorganic film and the organic film.

FIG. 3 shows a cross-sectional view showing a light-emitting apparatus according to an embodiment of the present disclosure.

The light-emitting apparatus of FIG. 3 is the same as the light-emitting apparatus of FIG. 2, except that a light-blocking pattern 500 and a functional region 400 are additionally on the encapsulation portion 300. The functional region 400 may be a combination of i) a color filter area, ii) a color conversion area, or iii) a combination of the color filter area and the color conversion area. In an embodiment, the light-emitting device included in the light-emitting apparatus of FIG. 3 may be a tandem light-emitting device.

Manufacture Method

Respective layers included in the hole transport region, the emission layer, and respective layers included in the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec, depending on a material to be included in a layer to be formed and the structure of a layer to be formed.

Definition of at Least Some of the Terms

The term "$C_3$-$C_{60}$ carbocyclic group," as used herein, refers to a cyclic group consisting of carbon only and having three to sixty carbon atoms, and the term "$C_1$-$C_{60}$ heterocyclic group," as used herein, refers to a cyclic group that has one to sixty carbon atoms and further has, in addition to carbon, a heteroatom. The $C_3$-$C_{60}$ carbocyclic group and the $C_1$-$C_{60}$ heterocyclic group may each be a monocyclic group consisting of one ring or a polycyclic group in which two or more rings are condensed with (e.g., combined together with) each other. For example, the number of ring-forming atoms of the $C_1$-$C_{60}$ heterocyclic group may be from 3 to 61.

The term "cyclic group," as used herein, may include the $C_3$-$C_{60}$ carbocyclic group, and the $C_1$-$C_{60}$ heterocyclic group.

The term "π electron-rich $C_3$-$C_{60}$ cyclic group," as used herein, refers to a cyclic group that has three to sixty carbon atoms and does not include *—N=*' as a ring-forming moiety, and the term "π electron-deficient nitrogen-containing $C_1$-$C_{60}$ cyclic group," as used herein, refers to a heterocyclic group that has one to sixty carbon atoms and includes *—N=*' as a ring-forming moiety.

For example,
the $C_3$-$C_{60}$ carbocyclic group may be i) group T1 or ii) a condensed cyclic group in which two or more groups T1 are condensed with (e.g., combined together with) each other (for example, a cyclopentadiene group, an adamantane group, a norbornane group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) group T2, ii) a condensed cyclic group in which two or more groups T2 are condensed with (e.g., combined together with) each other, or iii) a condensed cyclic group in which at least one group T2 and at least one group T1 are condensed with (e.g., combined together with) each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), the π electron-rich $C_3$-$C_{60}$ cyclic group may be i) group T1, ii) a condensed cyclic group in which two or more groups T1 are condensed with (e.g., combined together with) each other, iii) group T3, iv) a condensed cyclic group in which two or more groups T3 are condensed with (e.g., combined together with) each other, or v) a condensed cyclic group in which at least one group T3 and at least one group T1 are condensed with (e.g., combined together with) each other (for example, the $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothienodibenzothiophene group, etc.), the π electron-deficient nitrogen-containing $C_1$-$C_{60}$ cyclic group may be i) group T4, ii) a condensed cyclic group in which two or more group T4 are condensed with (e.g., combined together with) each other, iii) a condensed cyclic group in which at least one group T4 and at least one group T1 are condensed with (e.g., combined together with) each other, iv) a condensed cyclic group in which at least one group T4 and at least one group T3 are condensed with (e.g., combined together with) each other, or v) a condensed cyclic group in which at least one group T4, at least one group T1, and at least one group T3 are condensed with (e.g., combined together with) one another (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, an azadibenzofuran group, etc.), group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane (or a bicyclo[2.2.1]heptane) group, a norbornene group, a bicyclo[1.1.1]pentane group, a bicyclo[2.1.1]hexane group, a bicyclo[2.2.2]octane group, or a benzene group, group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, group T3 may be a furan group, a thiophene group, a 1H-pyrrole group, a silole group, or a borole group, and group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group," "the $C_3$-$C_{60}$ carbocyclic group," "the $C_1$-$C_{60}$ heterocyclic group," "the π electron-rich $C_3$-$C_{60}$ cyclic group," or "the π electron-deficient nitrogen-containing $C_1$-$C_{60}$ cyclic group," as used herein, refer to a group condensed to (e.g., combined together with) any cyclic group or a polyvalent group (for example, a divalent group, a trivalent group, a tetravalent group, etc.), depending on the structure of a formula in connection with which the terms are used. In an embodiment, "a benzene group" may be a benzene ring, a phenyl group, a phenylene group, or the like, which may be easily understand by one of ordinary skill in the art according to the structure of a formula including the "benzene group."

Examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the monovalent $C_1$-$C_{60}$ heterocyclic group are Examples of the, $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group," as used herein, refers to a linear or branched aliphatic hydrocarbon monovalent group that has one to sixty carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, neopentyl group, an isopentyl group, a sec-pentyl group, 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group," as used herein, refers to a divalent group having substantially the same structure as the $C_1$-$C_{60}$ alkyl group.

The term "$C_2$-$C_{60}$ alkenyl group," as used herein, refers to a monovalent hydrocarbon group having at least one carbon-carbon double bond at a main chain (e.g., in the middle) or at a terminal end (e.g., the terminus) of the $C_2$-$C_{60}$ alkyl group, and examples thereof are an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a monovalent hydrocarbon group having at least one carbon-carbon triple bond at a main chain (e.g., in the middle) or at a terminal end (e.g., the terminus) of the $C_2$-$C_{60}$ alkyl group, and examples thereof include an ethynyl group, and a propynyl group. The term "$C_1$-$C_{60}$ alkynylene group," as used herein, refers to a divalent group having substantially the same structure as the $C_1$-$C_{60}$ alkynyl group.

The term "$C_1$-$C_{60}$ alkoxy group," as used herein, refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group," as used herein, refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group," as used herein, refers to a divalent group having substantially the same structure as the $C_3$-$C_{10}$ cycloalkyl group.

The term "$C_1$-$C_{10}$ heterocycloalkyl group," as used herein, refers to a monovalent cyclic group that further includes, in addition to a carbon atom, at least one heteroatom as a ring-forming atom and has 1 to 10 carbon atoms, and examples thereof are a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent cyclic group that has three to ten carbon atoms and at least one carbon-carbon double bond in the ring thereof and no aromaticity (e.g., is not aromatic), and examples thereof are a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group," as used herein, refers to a divalent group having substantially the same structure as the $C_1$-$C_{10}$ heterocycloalkenyl group.

The term "$C_6$-$C_{60}$ aryl group," as used herein, refers to a monovalent group having a carbocyclic aromatic system having six to sixty carbon atoms, and the term "$C_6$-$C_{60}$ arylene group," as used herein, refers to a divalent group having a carbocyclic aromatic system having six to sixty carbon atoms. Examples of the $C_6$-$C_{60}$ aryl group are a fluorenyl group, a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the rings may be condensed with (e.g., combined together with) each other.

The term "$C_1$-$C_{60}$ heteroaryl group," as used herein, refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group," as used herein, refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group are a carbazolyl group, a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the rings may be condensed with (e.g., combined together with) each other.

The term "monovalent non-aromatic condensed polycyclic group," as used herein, refers to a monovalent group having two or more rings condensed to (e.g., combined together with) each other, only carbon atoms (for example, 8 to 60 carbon atoms) as ring-forming atoms, and no aromaticity in its molecular structure when considered as a whole (e.g., is not aromatic when considered as a whole). Examples of the monovalent non-aromatic condensed polycyclic group are an indenyl group, a spiro-bifluorenyl group, a benzofluorenyl group, an indenophenanthrenyl group, and an indenon anthracenyl group. The term "divalent non-aromatic condensed polycyclic group," as used herein, refers to a divalent group having substantially the same structure as a monovalent non-aromatic condensed polycyclic group.

The term "monovalent non-aromatic condensed heteropolycyclic group," as used herein, refers to a monovalent group having two or more rings condensed to (e.g., combined together with) each other, at least one heteroatom other than carbon atoms (for example, 1 to 60 carbon atoms), as a ring-forming atom, and no aromaticity in its molecular structure when considered as a whole (e.g., is not aromatic when considered as a whole). Examples of the monovalent non-aromatic condensed heteropolycyclic group are a 9,10-dihydroacridinyl group and a 9H-xanthenyl group. The term "divalent non-aromatic heterocondensed polycyclic group," as used herein, refers to a divalent group having substantially the same structure as a monovalent non-aromatic heterocondensed polycyclic group.

The term "$C_6$-$C_{60}$ aryloxy group," as used herein, indicates —$OA_{102}$ (wherein $A_{102}$ is the $C_6$-$C_{60}$ aryl group), and the term "$C_6$-$C_{60}$ arylthio group," as used herein, indicates —$SA_{103}$ (wherein $A_{103}$ is the $C_6$-$C_{60}$ aryl group).

The term "$R_{10a}$," as used herein, refers to:
deuterium (-D), —F, —Cl, —Br, —I, a hydroxyl group, a cyano group, or a nitro group,
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof,
a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$),
$Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; $C_1$-$C_{60}$ alkyl group; $C_2$-$C_{60}$ alkenyl group; $C_2$-$C_{60}$ alkynyl group; $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "hetero atom," as used herein, refers to any atom other than a carbon atom. Examples of the heteroatom are O, S, N, P, Si, B, Ge, Se, and any combination thereof.

The term "Ph," as used herein, refers to a phenyl group, the term "Me," as used herein, refers to a methyl group, the term "Et," as used herein, refers to an ethyl group, the term "ter-Bu" or "But," as used herein, refers to a tert-butyl group, and the term "OMe," as used herein, refers to a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group." In other words, the "terphenyl group" is a substituted phenyl group having, as a substituent, a $C_6$-$C_{60}$ aryl group substituted with a $C_6$-$C_{60}$ aryl group.

* and *', as used herein, unless defined otherwise, each refer to a binding site to a neighboring atom in a corresponding formula.

Hereinafter, a light-emitting device according to embodiments will be described in more detail with reference to Examples.

EXAMPLES

Comparative Example 1-1

As a substrate and an anode, a 15 Ω/cm² (1,200 Å) ITO/Ag/ITO glass substrate (a product of Corning Inc.) was cut to a size of 50 mm×50 mm×0.7 mm, sonicated with isopropyl alcohol and pure water each for 5 minutes, and then cleaned by exposure to ultraviolet rays and ozone for 30 minutes. The resultant glass substrate was loaded onto a vacuum deposition apparatus.

HAT-CN was deposited on the anode to form a hole injection layer having a thickness of 50 Å to form a hole injection layer, and NPB (600 Å) and TCTA (50 Å) were sequentially deposited on the hole injection layer to form a hole transport layer.

H8 and FD37 were co-deposited on the hole transport layer to a weight ratio of 97:3 to form a first emission layer having a thickness of 100 Å, T2T was deposited at a thickness of 50 Å on the first emission layer to form a hole blocking layer, and TPM-TAZ and Compounds 1-25 were co-deposited to a weight ratio of 8:2 on the hole blocking layer to form an electron transport layer having a thickness of 300 Å, thereby forming a first light-emitting unit.

On the first light-emitting unit, BCP and Li (the amount of Li was 10 wt %) were co-deposited to form a first n-type charge generation layer having a thickness of 300 Å, and HATCN was deposited to form a first p-type charge generation layer having a thickness of 50 Å, thereby forming a first charge generation layer.

On the first charge generation layer, NPB (600 Å) and TCTA (50 Å) were sequentially deposited to form a hole transport layer.

H8 and FD37 were co-deposited on the hole transport layer to a weight ratio of 97:3 to form a second emission layer having a thickness of 100 Å, T2T was deposited at a thickness of 50 Å on the second emission layer to form a hole blocking layer, and TPM-TAZ and Compounds 1-25 were co-deposited to a weight ratio of 8:2 on the hole blocking layer to form an electron transport layer having a thickness of 300 Å, thereby forming a second light-emitting unit.

On the second light-emitting unit, BCP and Li (the amount of Li was 10 wt %) were co-deposited to form a second n-type charge generation layer having a thickness of 300 Å, and HATCN was deposited thereon to form a second p-type charge generation layer having a thickness of 50 Å, thereby forming a second charge generation layer.

On the second charge generation layer, NPB (600 Å) and TCTA (50 Å) were sequentially deposited to form a hole transport layer, and H8 and FD37 were co-deposited thereon to a weight ratio of 97:3 to form a third emission layer having a thickness of 100 Å.

On the third emission layer, TPM-TAZ and Liq were co-deposited to a weight ratio of 5:5 to form an electron transport layer having a thickness of 300 Å, and Yb (10 Å) was deposited thereon to form an electron injection layer, thereby forming an electron transport region.

On the electron transport region, Ag and Mg (the amount of Mg was 10 wt %) were co-deposited to form a cathode having a thickness of 100 Å, and HT28(700 Å) was deposited on the cathode to form a capping layer, thereby completing the manufacture of a light-emitting device.

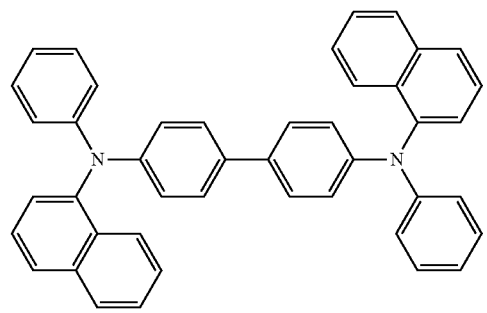

NPB

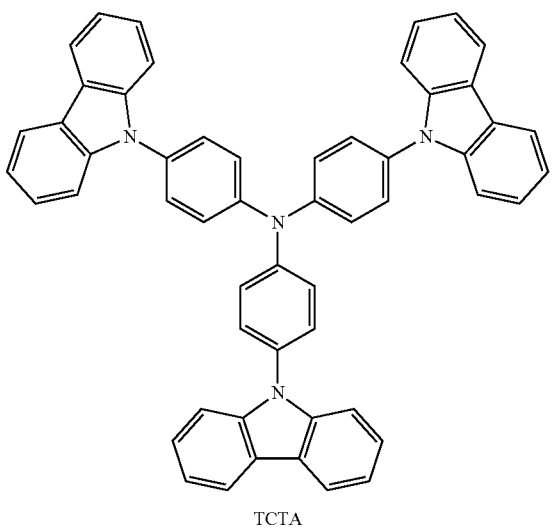

TCTA

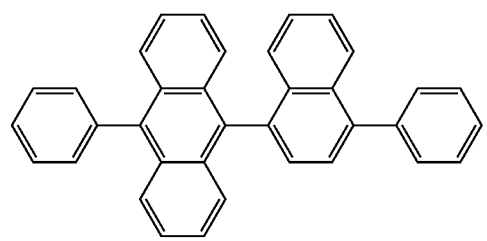

H8

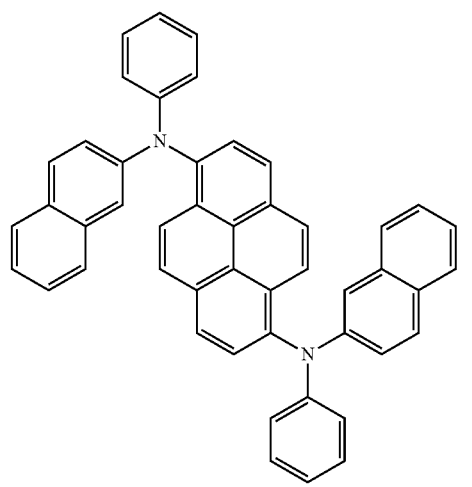

FD37

-continued

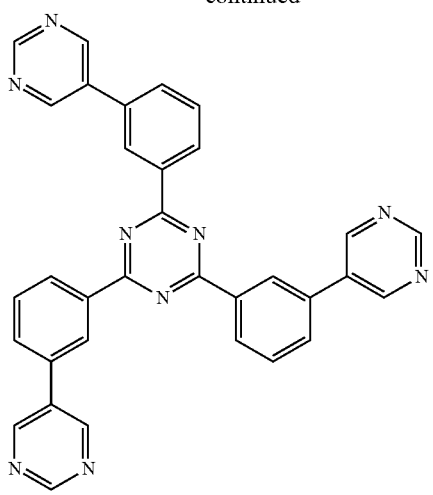

TPM-TAZ

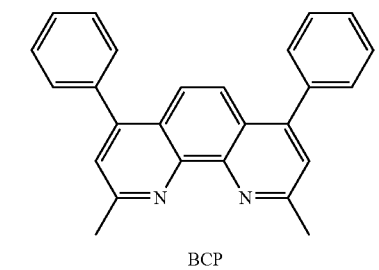

BCP

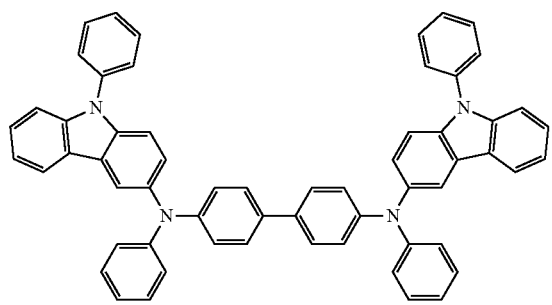

HT28

-continued

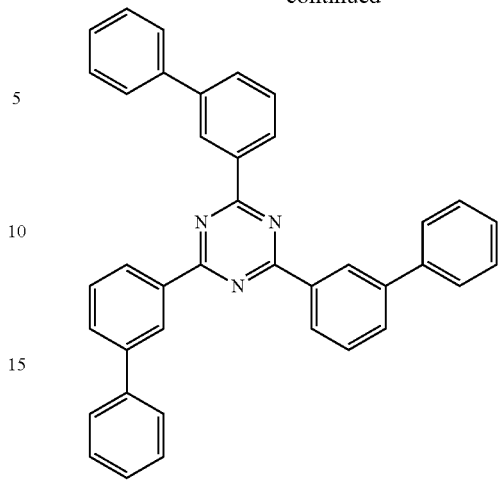

T2T

Comparative Example 1-2

Light-emitting devices were manufactured in substantially the same manner as in Comparative Example 1-1, except that, a first n-type charge generation layer was not formed, and when forming a first light-emitting unit, Compound 1-25 and Li (the amount of Li was 10 wt %) were co-deposited to form an electron transport layer having a thickness of 300 Å.

Example 1-1

Light-emitting devices were manufactured in substantially the same manner as in Comparative Example 1-1, except that, a first n-type charge generation layer was not formed, and when forming a first light-emitting unit, TPM-TAZ, Compound 1-25 (weight ratio of 8:2) and Li (the amount of Li was 10 wt %) were co-deposited to form an electron transport layer having a thickness of 300 Å.

Example 1-2

Light-emitting devices were manufactured in substantially the same manner as in Comparative Example 1-1, except that, a second n-type charge generation layer was not formed, and when forming a second light-emitting unit, TPM-TAZ, Compound 1-25 (weight ratio of 8:2) and Li (the amount of Li was 10 wt %) were co-deposited to form an electron transport layer having a thickness of 300 Å.

Example 1-3

Light-emitting devices were manufactured in substantially the same manner as in Comparative Example 1-1, except that, a first n-type charge generation layer was not formed, and when forming the first light-emitting unit, TPM-TAZ, Compound 1-25 (weight ratio of 8:2) and Li (the amount of Li was 10 wt %) were co-deposited to form an electron transport layer having a thickness of 300 Å, a second charge generation layer was not formed, and when forming the second light-emitting unit, TPM-TAZ, Compound 1-25 (weight ratio of 8:2) and Li (the amount of Li was 10 wt %) were co-deposited to form an electron transport layer having a thickness of 300 Å.

For the light-emitting devices manufactured in Comparative Examples 1-1 and 1-2, and Examples 1-1 to 1-3, the driving voltage (V) at an initial luminance of 1,500 nit, the conversion efficiency (Cd/A/y) obtained by dividing luminescence efficiency by the CIE y coordinate and the time to decrease to 97% of the initial luminance (T97 lifetime) were measured, and shown in Table 1 below as a percentage value based on the light-emitting device of Comparative Example 1-1.

Luminance was measured using a luminance meter PR650, by supplying power using a current-voltmeter (Keithley SMU 236).

Efficiency was measured using a luminance meter PR650, by supplying power using a current-voltmeter (Keithley SMU 236).

TABLE 1

|  | Driving voltage (%) | Transform efficiency (%) | T97 lifespan (%) | Luminance (nit) |
| --- | --- | --- | --- | --- |
| Comparative Example 1-1 | 100% | 100% | 100% | 1500 |
| Comparative Example 1-2 | 98% | 102% | 100% | 1500 |
| Example 1-1 | 98% | 103% | 100% | 1500 |
| Example 1-2 | 99% | 105% | 101% | 1500 |
| Example 1-3 | 97% | 107% | 100% | 1500 |

Table 1 shows that the light-emitting devices of Examples 1-1 to 1-3 generally have a lower driving voltage, and equivalent or improved efficiency and lifespan than the light-emitting devices of Comparative Examples 1-1 and 1-2. It may be understood that, compared to light-emitting devices of Comparative Example 1-1, an n-type charge generation layer and an electron transport layer of a light-emitting device of Examples 1-1 to 1-3 are integrated into one layer so that electrons are smoothly injected into the emission layer, and thus driving voltage, efficiency, and lifespan characteristics are improved. In addition, by using two types or kinds of electron transport hosts, the efficiency of the light-emitting device of Examples 1-1 to 1-3 has improved compared to that of Comparative Example 1-2, which used a single electron transport host. While the present disclosure is not limited to any particular mechanism or theory, this may be explained by the reason that the electron transport capability has improved by introducing the second electron transport material, but embodiments of the present disclosure are not limited thereto.

Comparative Example 2-1

As a substrate and an anode, a 15 Ω/cm² (1,200 Å) ITO/Ag/ITO glass substrate (a product of Corning Inc.) was cut to a size of 50 mm×50 mm×0.7 mm, sonicated with isopropyl alcohol and pure water each for 5 minutes, and then cleaned by exposure to ultraviolet rays and ozone for 30 minutes. The resultant glass substrate was loaded onto a vacuum deposition apparatus.

HAT-CN was deposited on the anode to form a hole injection layer having a thickness of 50 Å to form a hole injection layer, and NPB (600 Å) and TCTA (50 Å) were sequentially deposited on the hole injection layer to form a hole transport layer.

H8 and FD37 were co-deposited on the hole transport layer to a weight ratio of 97:3 to form a first emission layer having a thickness of 100 Å, T2T was deposited at a thickness of 50 Å on the first emission layer to form a hole blocking layer, and TPM-TAZ and Compounds 1-25 were co-deposited to a weight ratio of 8:2 on the hole blocking layer to form an electron transport layer having a thickness of 300 Å, thereby forming a first light-emitting unit.

On the first light-emitting unit, BCP and Li (the amount of Li was 10 wt %) were co-deposited to form a n-type charge generation layer having a thickness of 300 Å, and HATCN was deposited thereon to form a first p-type charge generation layer having a thickness of 50 Å, thereby forming a first charge generation layer.

On the first charge generation layer, NPB (600 Å) and TCTA (50 Å) were sequentially deposited to form a hole transport layer.

H8 and FD37 were co-deposited on the hole transport layer to a weight ratio of 97:3 to form a second emission layer having a thickness of 100 Å, T2T was deposited at a thickness of 50 Å on the second emission layer to form a hole blocking layer, and TPM-TAZ and Compounds 1-25 were co-deposited to a weight ratio of 8:2 on the hole blocking layer to form an electron transport layer having a thickness of 300 Å, thereby forming a second light-emitting unit.

On the second light-emitting unit, BCP and Li (the amount of Li was 10 wt %) were co-deposited to form a n-type charge generation layer having a thickness of 300 Å, and HATCN was deposited thereon to form a p-type charge generation layer having a thickness of 50 Å, thereby forming a second charge generation layer.

On the second charge generation layer, NPB (600 Å) and TCTA (50 Å) were sequentially deposited to form a hole transport layer, H8 and FD37 were co-deposited thereon to a weight ratio of 97:3 to form a third emission layer having a thickness of 100 Å, and T2T was deposited on the third emission layer to form a hole blocking layer having a thickness of 50 Å. TPM-TAZ and Compounds 1-25 were co-deposited on the hole blocking layer in a weight ratio of 8:2 to form an electron transport layer having a thickness of 300 Å, thereby forming a third light-emitting unit.

On the third light-emitting unit, BCP and Li (the amount of Li was 10 wt %) were co-deposited to form a second n-type charge generation layer having a thickness of 300 Å, and HATCN was deposited thereon to form a third p-type charge generation layer having a thickness of 50 Å, thereby forming a third charge generation layer.

On the third charge generation layer, NPB (600 Å) and TCTA (50 Å) were sequentially deposited to form a hole transport layer, and TPBi and Ir(ppy)$_3$ were co-deposited thereon to a weight ratio of 97:3 to form a third emission layer having a thickness of 100 Å, thereby forming a fourth emission layer.

On the fourth emission layer, TPM-TAZ and Liq were co-deposited to a weight ratio of 5:5 to form an electron transport layer having a thickness of 300 Å, and Yb (10 Å) was deposited thereon to form an electron injection layer, thereby forming an electron transport region.

On the electron transport region, Ag and Mg (the amount of Mg was 10 wt %) were co-deposited to form a cathode having a thickness of 100 Å, and CP1 (700 Å) was deposited on the cathode to form a capping layer, thereby completing the manufacture of a light-emitting device.

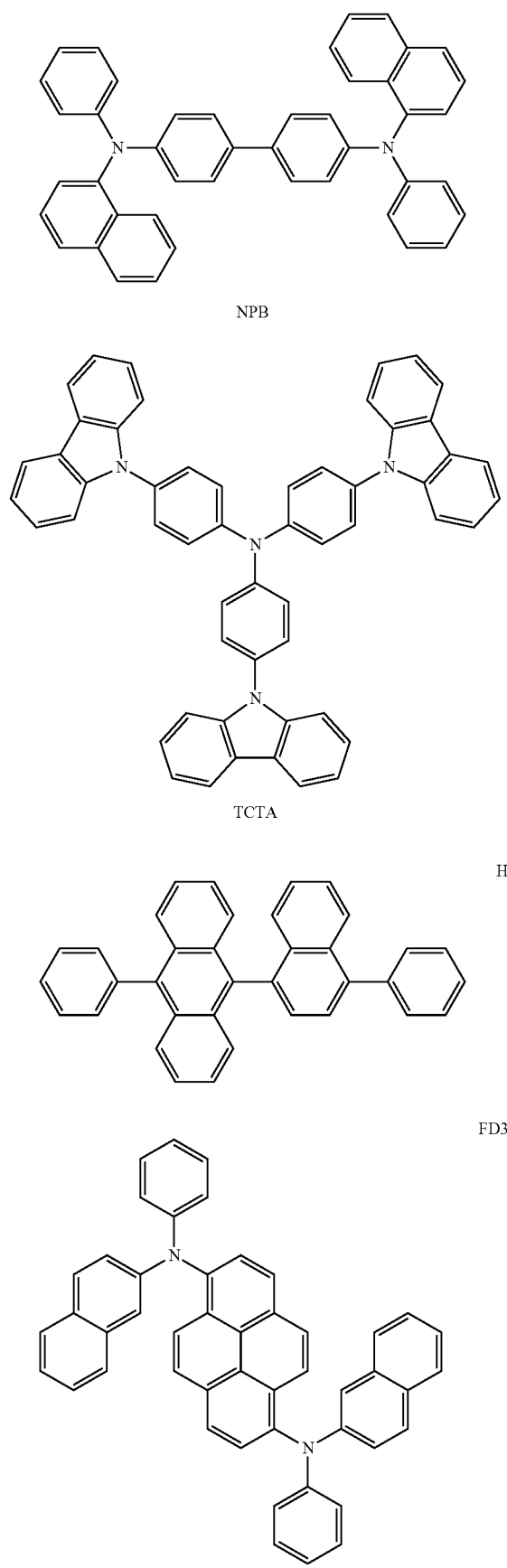
NPB
TCTA
FD37
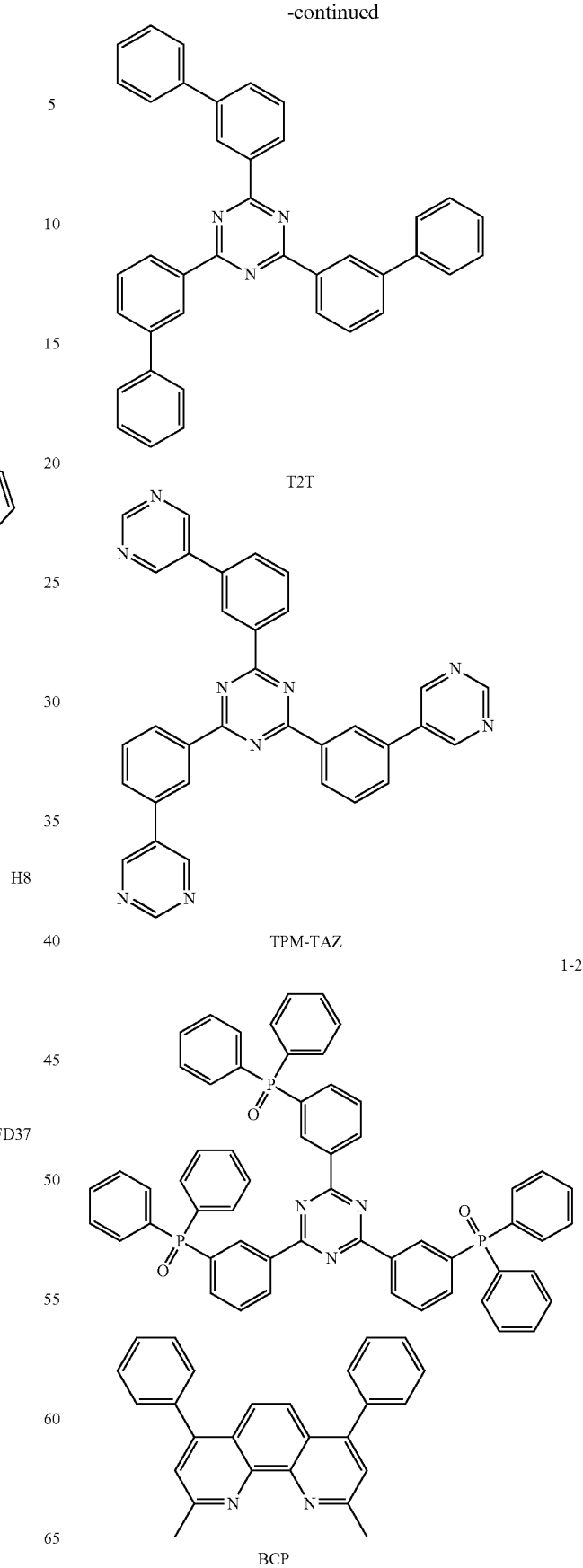
T2T
TPM-TAZ
1-25
BCP

-continued

HT28

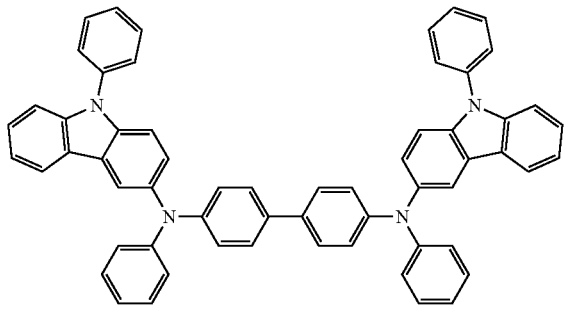

Comparative Example 2-2

Light-emitting devices were manufactured in substantially the same manner as in Comparative Example 1-1, except that, when forming the first light-emitting unit, an electron transport layer was not formed, and Compound 1-25 and Li (the amount of Li was 10 wt %) were co-deposited to form a first n-type charge generation layer having a thickness of 300 Å.

Example 2-1

Light-emitting devices were manufactured in substantially the same manner as in Comparative Example 2-1, except that, a first n-type charge generation layer was not formed, and when forming the first light-emitting unit, TPM-TAZ, Compound 1-25 (weight ratio of 8:2) and Li (the amount of Li was 10 wt %) were co-deposited to form an electron transport layer having a thickness of 300 Å.

Example 2-2

Light-emitting devices were manufactured in substantially the same manner as in Comparative Example 2-1, except that, a second n-type charge generation layer was not formed, and when forming the second light-emitting unit, TPM-TAZ, Compound 1-25 (weight ratio of 8:2) and Li (the amount of Li was 10 wt %) were co-deposited to form an electron transport layer having a thickness of 300 Å.

Example 2-3

Light-emitting devices were manufactured in substantially the same manner as in Comparative Example 2-1, except that, a third n-type charge generation layer was not formed, and when forming the third light-emitting unit, TPM-TAZ, Compound 1-25 (weight ratio of 8:2) and Li (the amount of Li was 10 wt %) were co-deposited to form an electron transport layer having a thickness of 300 Å.

Example 2-4

Light-emitting devices were manufactured in substantially the same manner as in Comparative Example 2-1, except that, a first n-type charge generation layer was not formed, and when forming the first light-emitting unit, TPM-TAZ, Compound 1-25 (weight ratio of 8:2) and Li (the amount of Li was 10 wt %) were co-deposited to form an electron transport layer having a thickness of 300 Å, a second n-type charge generation layer was not formed, and when forming the second light-emitting unit, TPM-TAZ, Compound 1-25 (weight ratio of 8:2) and Li (the amount of Li was 10 wt %) were co-deposited to form an electron transport layer having a thickness of 300 Å.

Example 2-5

Light-emitting devices were manufactured in substantially the same manner as in Comparative Example 2-1, except that, a first n-type charge generation layer was not formed, and when forming the first light-emitting unit, TPM-TAZ: Compound 1-25 (weight ratio of 8:2) and Li (the amount of Li was 10 wt %) were co-deposited to form an electron transport layer having a thickness of 300 Å, a third n-type charge generation layer was not formed, and when forming the third light-emitting unit, TPM-TAZ, Compound 1-25 (weight ratio of 8:2) and Li (the amount of Li was 10 wt %) were co-deposited to form an electron transport layer having a thickness of 300 Å.

Example 2-6

Light-emitting devices were manufactured in substantially the same manner as in Comparative Example 2-1, except that, a second n-type charge generation layer was not formed, and when forming the second light-emitting unit, TPM-TAZ, Compound 1-25 (weight ratio of 8:2) and Li (the amount of Li was 10 wt %) were co-deposited to form an electron transport layer having a thickness of 300 Å, a third n-type charge generation layer was not formed, and when forming the second light-emitting unit, TPM-TAZ, Compound 1-25 (weight ratio of 8:2) and Li (the amount of Li was 10 wt %) were co-deposited to form an electron transport layer having a thickness of 300 Å.

Example 2-7

Light-emitting devices were manufactured in substantially the same manner as in Comparative Example 2-1, except that, a first n-type charge generation layer was not formed, and when forming the first light-emitting unit, TPM-TAZ, Compound 1-25 (weight ratio of 8:2) and Li (the amount of Li was 10 wt %) were co-deposited to form an electron transport layer having a thickness of 300 Å, a second n-type charge generation layer was not formed, and when forming the second light-emitting unit, TPM-TAZ, Compound 1-25 (weight ratio of 8:2) and Li (the amount of Li was 10 wt %) were co-deposited to form an electron transport layer having a thickness of 300 Å, a third n-type charge generation layer was not formed, and when forming the second light-emitting unit, TPM-TAZ, Compound 1-25 (weight ratio of 8:2) and Li (the amount of Li was 10 wt %) were co-deposited on to form an electron transport layer having a thickness of 300 Å.

For the light-emitting devices manufactured in Comparative Examples 2-1 and 2-2, and Examples 2-1 to 2-7, the driving voltage (V) at an initial luminance of 1,500 nit, the conversion efficiency (Cd/A/y), and the time to decrease to 97% of the initial luminance (T97 lifetime) were measured, and shown in Table 2 below as a percentage value based on the light-emitting device of Comparative Example 2-1.

Luminance was measured using a luminance meter PR650, by supplying power using a current-voltmeter (Keithley SMU 236).

Efficiency was measured using a luminance meter PR650, by supplying power using a current-voltmeter (Keithley SMU 236).

TABLE 2

| | Driving voltage (%) | Transform efficiency (%) | T97 lifespan (%) | Luminance (nit) |
|---|---|---|---|---|
| Comparative Example 2-1 | 100% | 100% | 100% | 1500 |
| Comparative Example 2-2 | 98% | 102% | 101% | 1500 |
| Example 2-1 | 98% | 103% | 100% | 1500 |
| Example 2-2 | 98% | 104% | 100% | 1500 |
| Example 2-3 | 99% | 105% | 101% | 1500 |
| Example 2-4 | 97% | 106% | 100% | 1500 |
| Example 2-5 | 98% | 107% | 99% | 1500 |
| Example 2-6 | 97% | 107% | 100% | 1500 |
| Example 2-7 | 96% | 110% | 101% | 1500 |

Table 2 shows that the light-emitting devices of Examples 2-1 to 2-7 have a lower driving voltage, and equivalent or improved efficiency and lifespan than the light-emitting devices of Comparative Example 2-1. It may be understood that, compared to light-emitting devices of Comparative Example 2-1, an n-type charge generation layer and an electron transport layer of a light-emitting device of Examples 2-1 to 2-7 are integrated into one layer so that electrons are smoothly injected into the emission layer, and thus driving voltage, efficiency, and lifespan characteristics are improved. In addition, by using two types or kinds of electron transport hosts, the efficiency of the light-emitting device of Examples 2-1 to 2-7 has improved compared to that of Comparative Example 2-2, which used a single electron transport host.

The light-emitting device may have low driving voltage, high efficiency, long lifespan, and/or high color purity.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents.

What is claimed is:

1. A light-emitting device comprising:
a first electrode;
a second electrode facing the first electrode;
m light-emitting units stacked between the first electrode and the second electrode and each including an emission layer; and
m−1 charge generation layers respectively between two neighboring light-emitting units among the m light-emitting units,
wherein m is an integer of 2 or more,
at least one of the m−1 light-emitting units other than a light-emitting unit neighboring the second electrode includes an n-doped electron transport layer between the emission layer and the second electrode,
a charge generation layer on the n-doped electron transport layer includes a p-type charge generation layer in direct contact with the n-doped electron transport layer,
the n-doped electron transport layer includes a first electron transport material, a second electron transport material, and a metal,
the first electron transport material and the second electron transport material are different from each other, and
the first electron transport material is a compound including a phenanthroline group, a phosphine oxide group, a phosphine sulfide group, or any combination thereof, and
wherein at least one of the m light-emitting units comprises two emission layers, and the two emission layers directly contact each other.

2. The light-emitting device of claim 1, wherein m is 3 or more.

3. The light-emitting device of claim 1, wherein the first electron transport material is a compound represented by any one of Formulae 1 and 2, or any combination thereof:

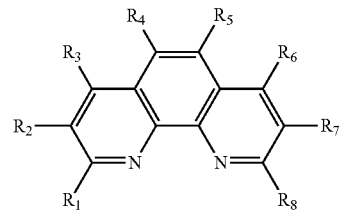

Formula 1

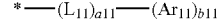

Formula 1A

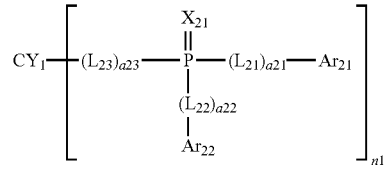

Formula 2 wherein, in Formulae 1, 1A, and 2,
$CY_1$ is a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
$X_{21}$ is O or S,
$L_{11}$, $L_{21}$ to $L_{23}$, $Ar_{11}$, $Ar_{21}$, and $Ar_{22}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$,
a11 and a21 to a23 are each independently an integer from 0 to 5,
b11 is an integer from 1 to 5,
n1 is an integer from 1 to 3,
$R_1$ to $R_8$ are each independently a group represented by Formula 1A, hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)

($Q_2$), wherein at least one of $R_1$ to $R_8$ is a group represented by Formula 1A, $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof, and

* indicates a binding site to a neighboring atom.

4. The light-emitting device of claim 1, wherein the first electron transport material is a compound represented by any one of Formulae 1-1 to 1-3 and 2-1 to 2-3, or any combination thereof:

Formula 1-1

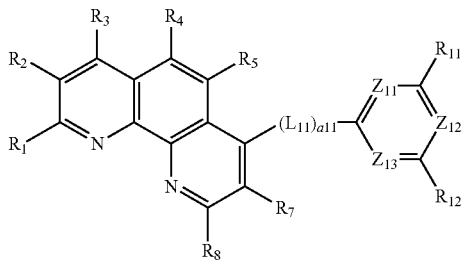

Formula 1-2

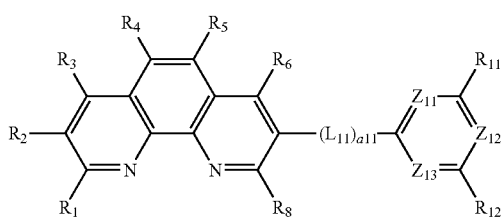

Formula 1-3

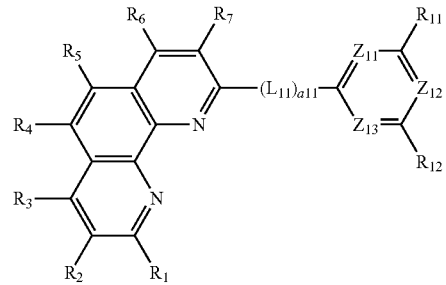

Formula 2-1

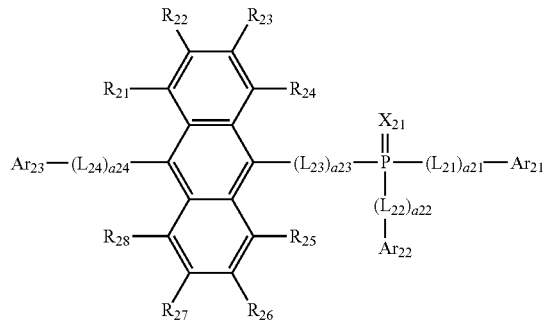

Formula 2-2

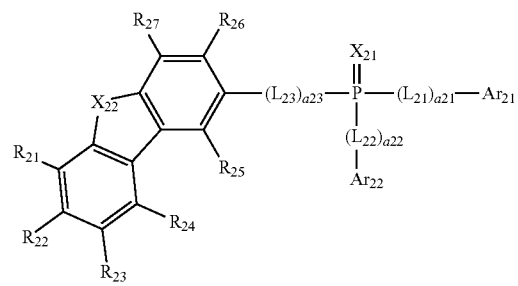

Formula 2-3

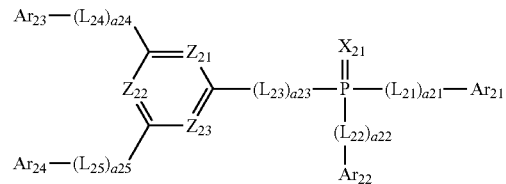

wherein, in Formulae 1-1 to 1-3 and 2-1 to 2-3, $Z_{11}$ is N or C($R_{13}$), $Z_{12}$ is N or C($R_{14}$), $Z_{13}$ is N or C($R_{15}$), $Z_{21}$ is N or C($R_{21}$), $Z_{22}$ is N or C($R_{22}$), $Z_{23}$ is N or C($R_{23}$), $X_{21}$ is O or S, $X_{22}$ is O, S, N($R_{28}$), C($R_{28}$)($R_{29}$), or Si($R_{28}$)($R_{29}$), $L_{11}$, $L_{21}$ to $L_{25}$, and $Ar_{21}$ to $Ar_{24}$ are each independently a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, a11 and a21 to a23 are each independently an integer from 0 to 5, $R_1$ to $R_8$, $R_{11}$ to $R_{15}$, and $R_{21}$ to $R_{29}$ are each independently hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —Si($Q_1$)($Q_2$)($Q_3$), —N($Q_1$)($Q_2$), —B($Q_1$)($Q_2$), —C(=O)($Q_1$), —S(=O)$_2$($Q_1$), or —P(=O)($Q_1$)($Q_2$), $R_{10a}$ is:

deuterium, —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof, a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof, or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

5. The light-emitting device of claim 1, wherein the second electron transport material includes at least one π electron-deficient nitrogen-containing $C_1$-$C_{60}$ cyclic group.

6. The light-emitting device of claim 1, wherein, in the n-doped electron transport layer, a weight ratio of the first electron transport material to the second electron transport material is 1:9 to 9:1.

7. The light-emitting device of claim 1, wherein the metal is Li, Mg, Yb, or any combination thereof.

8. The light-emitting device of claim 1, wherein an amount of the metal in the n-doped electron transport layer is 1 part by weight to 20 parts by weight based on a total amount of 100 parts by weight of the first electron transport material and the second electron transport material.

9. The light-emitting device of claim 1, wherein in the m−1 light-emitting units other than the light-emitting unit neighboring the second electrode, a $k^{th}$ light-emitting unit includes the n-doped electron transport layer, wherein k is an integer from 1 to m−1, the $k^{th}$ light-emitting unit comprises a $k^{th}$ emission layer, and the $k^{th}$ light-emitting unit further comprises a hole blocking layer between the $k^{th}$ emission layer and the n-doped electron transport layer.

10. The light-emitting device of claim 1, wherein, in the m−1 light-emitting units other than the light-emitting unit neighboring the second electrode, a $k^{th}$ light-emitting unit includes the n-doped electron transport layer, wherein k is an integer from 1 to m−1 the $k^{th}$ light-emitting unit comprises a $k^{th}$ emission layer, and the $k^{th}$ emission layer directly contacts the n-doped electron transport layer.

11. The light-emitting device of claim 1, wherein the p-type charge generation layer further comprises a p-dopant.

12. The light-emitting device of claim 1, wherein each of the m light-emitting units further comprises a hole transport region between the first electrode and the emission layer and an electron transport region between the emission layer and the second electrode, the hole transport region comprises a hole injection layer, a hole transport layer, an emission auxiliary layer, an electron blocking layer, or any combination thereof, and the electron transport region comprises a buffer layer, a hole blocking layer, an electron control layer, an electron transport layer, an electron injection layer, or any combination thereof.

13. The light-emitting device of claim 1, wherein one of the two emission layers includes a first host and a fluorescent dopant, and the other includes a second host and a phosphorescent dopant.

14. A light-emitting device comprising:

a first electrode;

a second electrode facing the first electrode;

m light-emitting units stacked between the first electrode and the second electrode and each including an emission layer; and m−1 charge generation layers respectively between two neighboring light-emitting units among the m light-emitting units, wherein, at least one of the m−1 light-emitting units other than a light-emitting unit neighboring the second electrode includes an n-doped electron transport layer between the emission layer and the second electrode, a charge generation layer on the n-doped electron transport layer includes a p-type charge generation layer in direct contact with the n-doped electron transport layer, the n-doped electron transport layer includes a first electron transport material, a second electron transport material, and a metal, the first electron transport material and the second electron transport material are different from each other, and the first electron transport material is a compound including a phenanthroline group, a phosphine oxide group, a phosphine sulfide group, or any combination thereof, and wherein m is an integer of 3 or more, and the maximum emission wavelengths of light emitted from at least three of the m light-emitting units are identical to each other.

15. A light-emitting device comprising:
a first electrode;
a second electrode facing the first electrode;
m light-emitting units stacked between the first electrode and the second electrode and each including an emission layer; and
m−1 charge generation layers respectively between two neighboring light-emitting units among the m light-emitting units,
wherein,
at least one of the m−1 light-emitting units other than a light-emitting unit neighboring the second electrode includes an n-doped electron transport layer between the emission layer and the second electrode,
a charge generation layer on the n-doped electron transport layer includes a p-type charge generation layer in direct contact with the n-doped electron transport layer,
the n-doped electron transport layer includes a first electron transport material, a second electron transport material, and a metal,
the first electron transport material and the second electron transport material are different from each other, and
the first electron transport material is a compound including a phenanthroline group, a phosphine oxide group, a phosphine sulfide group, or any combination thereof, and
wherein m is 4, and
three light-emitting units among the m light-emitting units emit blue light and the remaining one light-emitting unit emits green light.

16. The light-emitting device of claim 1, wherein the maximum emission wavelength of light emitted from at least one light-emitting unit of the m light-emitting units is different from the maximum emission wavelength of light emitted from at least one light-emitting unit of the remaining light-emitting units, and
light emitted from the m light-emitting units is mixed to emit white light.

17. An electronic apparatus comprising the light-emitting device of claim 1.

18. The electronic apparatus of claim 17, further comprising a functional layer including a touch screen layer, a polarizing layer, a color filter, a color conversion layer, or any combination thereof.

19. The electronic apparatus of claim 17, wherein the electronic apparatus further comprises a color conversion layer in at least one travelling direction of light emitted from the light-emitting device.

* * * * *